(12) United States Patent
Kaneko et al.

(10) Patent No.: US 8,828,629 B2
(45) Date of Patent: Sep. 9, 2014

(54) BLACK CURABLE COMPOSITION, LIGHT-SHIELDING COLOR FILTER FOR A SOLID-STATE IMAGING DEVICE AND METHOD OF PRODUCING THE SAME, SOLID-STATE IMAGING DEVICE, WAFER LEVEL LENS, AND CAMERA MODULE

(75) Inventors: Yushi Kaneko, Haibara-gun (JP); Makoto Kubota, Haibara-gun (JP); Kazuto Shimada, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 25 days.

(21) Appl. No.: 13/583,858

(22) PCT Filed: Mar. 24, 2011

(86) PCT No.: PCT/JP2011/058158
§ 371 (c)(1),
(2), (4) Date: Sep. 10, 2012

(87) PCT Pub. No.: WO2011/118850
PCT Pub. Date: Sep. 29, 2011

(65) Prior Publication Data
US 2013/0028587 A1     Jan. 31, 2013

(30) Foreign Application Priority Data

Mar. 25, 2010 (JP) .................. 2010-070907
Mar. 25, 2010 (JP) .................. 2010-070908

(51) Int. Cl.
G02B 5/20      (2006.01)
G03F 7/004     (2006.01)
H01L 27/14     (2006.01)

(52) U.S. Cl.
USPC ............ 430/7; 430/287.1; 430/321; 257/432

(58) Field of Classification Search
None
See application file for complete search history.

(56) References Cited

U.S. PATENT DOCUMENTS

| | | | |
|---|---|---|---|
| 6,426,829 B1 | 7/2002 | Feldman et al. | |
| 2009/0236509 A1 | 9/2009 | Maruyama et al. | |
| 2010/0118182 A1 | 5/2010 | Fujii et al. | |
| 2010/0208354 A1 | 8/2010 | Okazaki et al. | |
| 2010/0209845 A1* | 8/2010 | Kubota et al. | 430/270.1 |
| 2011/0003241 A1 | 1/2011 | Kaneko et al. | |
| 2011/0124824 A1* | 5/2011 | Nagata et al. | 525/451 |

FOREIGN PATENT DOCUMENTS

| | | | |
|---|---|---|---|
| EP | 2 120 451 A1 | 11/2009 | |
| EP | 2 221 665 A2 | 8/2010 | |
| JP | 9-54431 A | 2/1997 | |
| JP | 10-46042 A | 2/1998 | |
| JP | 10-246955 A | 9/1998 | |
| JP | 2004-37986 A | 2/2004 | |
| JP | 2004-287367 A | 10/2004 | |
| JP | 2005-317745 A | 11/2005 | |
| JP | 2006-36750 A | 2/2006 | |
| JP | 2007-115921 A | 5/2007 | |
| JP | 3926380 B1 | 6/2007 | |
| JP | 2008-256746 A | 10/2008 | |
| JP | 2009084302 A | 4/2009 | |
| JP | 2009-203462 A | 9/2009 | |
| JP | 2009244692 A | 10/2009 | |
| JP | 2009-301061 A | 12/2009 | |
| JP | 2010-6932 A | 1/2010 | |
| JP | 2010026383 A | 2/2010 | |
| JP | 2011-203506 A | 10/2011 | |
| WO | 2008/102648 A1 | 8/2008 | |
| WO | 2008093516 A1 | 8/2008 | |
| WO | WO 2010/038836 A1 * | 4/2010 | |
| WO | 2011/004908 A1 | 1/2011 | |

OTHER PUBLICATIONS

Computer-generated transaltion of JP 2010-006932 (Jan. 2010).*
Notice of Reasons for Rejection, dated Apr. 2, 2013, issued in corresponding JP Application No. 2010-070908, 5 pages in English and Japanese.
Decision of Refusal, dated Jul. 16, 2013, issued in corresponding JP Application No. 2010-070908, 3 pages in English and Japanese.
International Search Report for PCT/JP2011/058158 dated Jun. 21, 2011, 6 pages.
Japanese Office Action dated Dec. 11, 2012, issued in Japanese Patent Application No. 2010-070908, 6 pages in Japanese and English.
Office Action dated Feb. 25, 2014 in Japanese Application No. 2010-070907.
Office Action issued on Jun. 3, 2014 from the Japanese Patent Office in Japanese Patent Application No. 2010-070907.
Extended European Search Report dated Mar. 7, 2014 in European Application No. 11759650.2.

* cited by examiner

Primary Examiner — John A. McPherson
(74) Attorney, Agent, or Firm — Sughrue Mion, PLLC

(57) ABSTRACT

A black curable composition for forming a light-shielding color filter of solid-state imaging device is provided, which is capable of forming a pattern at low exposure dose even when containing a high concentration of an inorganic pigment, and preventing pattern defects. Also, a black curable composition for a wafer level lens is provided, which is capable of forming a cured film having excellent light shieldability and excellent in co-formability of both a large pattern and a fine pattern. The composition includes: an inorganic pigment; a copolymer containing a monomer having at least one of an amino group and a nitrogen-containing heterocyclic group, a monomer having at least one group of a carboxyl group, a phosphate group and a sulfonate group, and a macromonomer having a weight average molecular weight from 1,000 to 50,000; a polymerization initiator; a polymerizable compound; and an alkali-soluble resin having an unsaturated double bond.

19 Claims, 7 Drawing Sheets

BLACK CURABLE COMPOSITION, LIGHT-SHIELDING COLOR FILTER FOR A SOLID-STATE IMAGING DEVICE AND METHOD OF PRODUCING THE SAME, SOLID-STATE IMAGING DEVICE, WAFER LEVEL LENS, AND CAMERA MODULE

CROSS REFERENCE TO RELATED APPLICATIONS

This application is a National Stage of International Application No. PCT/JP2011/058158 filed Mar. 24, 2011, claiming priority based on Japanese Patent Application Nos. 2010-070907 filed Mar. 25, 2010 and 2010-070908 filed Mar. 25, 2010, the contents of all of which are incorporated herein by reference in their entirety.

TECHNICAL FIELD

The present invention relates to a black curable composition, a light-shielding color filter for a solid-state imaging device, a method of producing the same, and a solid-state imaging device. Furthermore, the present invention relates to a black curable composition for a wafer level lens, which is useful for the formation of a light-shielding film of a wafer level lens, and a wafer level lens and a camera module, which are obtained using the same.

BACKGROUND ART

Color filters for use in liquid crystal display devices are provided with a light-shielding color filter called a black matrix, for the purpose of shielding transmission of light between colored pixels, improving contrast, or the like. In addition, solid-state imaging devices are also provided with a light-shielding film for the purpose of preventing generation of noise, improving image quality, or the like.

A black curable composition containing a black color material such as carbon black or titanium black is known as a composition for forming a black matrix for liquid crystal display devices, or a light-shielding color filter for solid-state imaging devices (see, for example, Japanese Patent Application Laid-Open (JP-A) No. 10-246955, JP-A No. 9-54431, JP-A No. 10-46042, JP-A No. 2006-36750 and JP-A No. 2007-115921).

A black matrix for a liquid crystal display device is required to have light shieldability in, mainly, a visible-light region, whereas a light-shielding color filter for solid-state imaging devices is required to have light shieldability in an infrared region as well as in the visible-light region.

Furthermore, a next-generation light-shielding color filter for solid-state imaging devices is desired to have both improved light shieldability and reduced thickness. In order to satisfy both demands, it is necessary to increase the content of a black coloring material in a black curable composition.

However, if the content of a black coloring material in a conventional black curable composition for forming a light-shielding color filter for a solid-state imaging device is increased, light necessary for decomposition of a polymerization initiator is shielded and the content of curing components are relatively decreased, resulting in insufficient curing of, in particular, the periphery of a pattern (i.e., the boundary between the unexposed portion and the exposed portion). For these reasons, it was found that, although the pattern may be formed, a portion of a pattern is defective. In order to improve pattern defects, if the exposure light dose is increased to improve curing property, it was found that curing proceeds even in an unexposed portion and correspondingly a pattern size is increased, and consequently a desired pattern size cannot be formed, and residues are generated in the unexposed portion.

JP-A No. 2010-6932 and JP-A No. 2004-37986 disclose a photosensitive composition containing a resin with a specific structure having an acid group and an amino group for the purpose of improving dispersibility, reducing residues in the unexposed portion and the like. Further, an improvement in the pattern formability is required for a curable composition used for the formation of a light-shielding region in a solid-state imaging device.

In recent years, a small and thin imaging unit has been mounted on a portable terminal of electronic equipment such as a mobile phone or PDA (Personal Digital Assistant). Such an imaging unit is typically equipped with a solid-state imaging device such as a Charge Coupled Device (CCD) image sensor or Complementary Metal-Oxide Semiconductor (CMOS) image sensor, and a lens for making an image of the subject on the solid-state imaging device.

With the miniaturization and thickness reduction of portable terminals and propagation of portable terminals, further miniaturization and thickness reduction are also required for imaging units mounted thereon, and productivity is required. To cope with such demands, there is known a method for mass production of an imaging unit in which a lens substrate having plural lenses formed thereon and a sensor substrate having plural solid-state imaging devices formed thereon are integrally combined, and then the lens substrate and the sensor substrate are cut in such a manner that each of the cut substrates includes a lens and a solid-state imaging device. Further, as another method of producing an imaging unit, there is known a method in which only the lenses are produced on a glass wafer or the like, cut into an appropriate size for combination with individual sensors, and then combined with imaging devices which have been individualized in advance, a method in which plural lenses are formed in a mold using only a resin, and the lenses are combined on a sensor substrate, followed by cutting, a method in which lenses are cut into a size for combination with individual sensors, and then combined with imaging devices which have been individualized in advance, or the like.

Conventionally, as a wafer level lens array made up of a lens substrate and a lens group (a group of lenses) formed on the lens substrate, there is known one in which a curable resin material is added dropwise on a surface of a parallel plate substrate formed of a light-transmissive material such as glass, the resin material is formed into a given shape in a mold and then cured to form plural lenses (for example, see Japanese Patent No. 3926380 and International Publication No. WO 2008/102648). A region other than a lens section of the wafer level lens, or a portion of the lens may be provided with a light-shielding region formed of a black film, a metal film, or the like, in order to control an amount of light. Further, a fine pattern having a size of 50 μm or less may be formed on the same substrate, depending on applications for use. The light-shielding region is generally formed by coating a curable light-shielding composition using a photolithographic method or depositing a metal.

As a method of forming a light-shielding region using a photolithographic method, there is known a method of forming a light-shielding region constituted by a light-shielding film in which a light-shielding composition is coated onto a lens or a substrate such as a glass substrate, the portion that serves as a light-shielding region is subjected to exposure and curing, and then the light-shielding composition of the unexposed portion is removed using an alkaline developer. However, the formation of a light-shielding film using a conventional curable composition has a problem associated with low adhesion of a fine pattern on the same substrate. On the other hand, when a light-shielding film is formed in a high-exposure dose region necessary for the formation of a fine pattern, there is a problem in that curing proceeds also in a developed portion which is an unexposed portion, and residues remain. In other words, it is difficult to form both a light-shielding film (large pattern) and a fine pattern on the same substrate.

JP-A No. 2010-6932 and JP-A No. 2004-37986 disclose a photosensitive composition containing a resin with a specific structure having an acid group and an amino group for the purpose of improving dispersibility, reducing residues in the unexposed portion and the like. Further, an improvement in the pattern formability is required for a curable composition used for the formation of a light-shielding region in a wafer level lens having a large pattern and a fine pattern on the same substrate.

SUMMARY OF INVENTION

Technical Problem

The present invention has been made in view of the above circumstances, and a first aspect of the invention is intended to provide a black curable composition that is capable of forming a pattern with a low exposure dose even when it contains a high concentration of an inorganic pigment and is capable of forming a light-shielding color filter for a solid-state imaging device in which pattern defects are suppressed.

Further, another object of the first aspect of the present invention is to provide a light-shielding color filter for a solid-state imaging device, which has excellent light shieldability over a broad wavelength region including an infrared region, a method of producing the same, and a solid-state imaging device.

A second aspect of the present invention has been made in view of the above circumstances, and it is an object thereof to provide the following.

Specifically, an object of the second aspect of the present invention is to provide a black curable composition for a wafer level lens, which is capable of forming a cured film having excellent light shieldability and is excellent in co-formability of both a large pattern and a fine pattern.

Further, another object of the second aspect of the present invention is to provide a wafer level lens in which a light dose is appropriately controlled by providing a light-shielding film formed of the black curable composition for a wafer level lens according to the present invention, and which can be conveniently produced, and a camera module.

Solution to Problem

As a result of intensive studies, the inventors of the present invention found that the objects are addressed by using a black curable composition containing at least a resin having a specific structure. The present invention has been completed based on these findings.

Hereinbelow, embodiments of the first aspect of the invention are specifically described.

<1> A black curable composition for a solid-state imaging device, including:

(A) an inorganic pigment;

(B) a copolymer containing (b-1) a monomer having at least one group selected from an amino group and a nitrogen-containing heterocyclic group, (b-2) a monomer having at least one group selected from the group consisting of a carboxyl group, a phosphate group and a sulfonate group and (b-3) a macromonomer having a weight average molecular weight from 1,000 to 50,000;

(C) a polymerization initiator;

(D) a polymerizable compound; and (E) an alkali-soluble resin having an unsaturated double bond.

<2> The black curable composition according to <1>, wherein the (A) inorganic pigment includes titanium black.

<3> The black curable composition according to <1> or <2>, wherein a mass ratio of the (B) copolymer to the (A) inorganic pigment is from 0.15 to 0.35.

<4> The black curable composition according to any one of <1> to <3>, wherein a mass ratio of the (E) alkali-soluble resin to the (D) polymerizable compound is from 0.3 to 2.5.

<5> The black curable composition according to any one of <1> to <4>, wherein the (b-2) monomer includes at least acrylic acid or methacrylic acid.

<6> The black curable composition according to any one of <1> to <5>, wherein the (C) polymerization initiator is an oxime ester compound or a hexaarylbiimidazole compound.

<7> The black curable composition according to any one of <2> to <6>, wherein the titanium black has an average primary particle diameter of from 30 nm to 65 nm.

<8> The black curable composition according to any one of <1> to <7>, further including an (F) organic pigment.

<9> A method of producing a light-shielding color filter for a solid-state imaging device, the method including:

applying the black curable composition for a solid-state imaging device according to any one of <1> to <8> onto a support;

subjecting a black curable composition layer formed by the applying to pattern light exposure; and developing the black curable composition layer after the exposure to form a light-shielding pattern, in this order.

<10> A light-shielding color filter for a solid-state imaging device, which is formed using the black curable composition for a solid-state imaging device according to any one of <1> to <8>.

<11> A solid-state imaging device, including the light-shielding color filter for a solid-state imaging device according to <10>.

Hereinbelow, embodiments of the second aspect of the invention are specifically described.

<12> A black curable composition for a wafer level lens, including:

(A) an inorganic pigment;

(B) a copolymer containing (b-1) a monomer having at least one group selected from an amino group and a nitrogen-containing heterocyclic group, (b-2) a monomer having at least one group selected from the group consisting of a carboxyl group, a phosphate group and a sulfonate group and (b-3) a macromonomer having a weight average molecular weight from 1,000 to 50,000;

(C) a polymerization initiator;

(D) a polymerizable compound; and (E) an alkali-soluble resin having an unsaturated double bond.

<13> The black curable composition according to <12>, wherein the (A) inorganic pigment includes titanium black.

<14> The black curable composition according to <12> or <13>, wherein a mass ratio of the (B) copolymer to the (A) inorganic pigment is from 0.15 to 0.35.

<15> The black curable composition according to any one of <12> to <14>, wherein a mass ratio of the (E) alkali-soluble resin to the (D) polymerizable compound is from 0.3 to 2.5.

<16> The black curable composition according to any one of <12> to <15>, wherein the (b-2) monomer is at least acrylic acid or methacrylic acid.

<17> The black curable composition according to any one of <12> to <16>, wherein the (C) polymerization initiator includes an oxime ester compound or a hexaarylbiimidazole compound.

<18> The black curable composition according to any one of <13> to <17>, wherein the titanium black has an average primary particle diameter of from 30 nm to 65 nm.

<19> The black curable composition according to any one of <12> to <18>, further including an (F) organic pigment.

<20> A wafer level lens, including a light-shielding film formed using the black curable composition according to any one of <12> to <19>, wherein the light-shielding film is formed around a lens arranged on a substrate of the wafer level lens.

<21> A camera module, including the wafer level lens according to <20>.

Advantageous Effects of Invention

According to the first aspect of the present invention, a black curable composition is provided which is capable of forming a pattern with a low exposure dose even when the composition contains a high concentration of an inorganic pigment, and is capable of forming a light-shielding color filter for a solid-state imaging device in which pattern defects are suppressed.

According to the first aspect of the invention, there are provided a light-shielding color filter for a solid-state imaging device that has excellent light shieldability over a broad wavelength region including an infrared region, a method of producing the same, and a solid-state imaging device.

According to the second aspect of the present invention, a black curable composition for a wafer level lens is provided, which is capable of forming a cured film having excellent light shieldability and is excellent in co-formability of both a large pattern and a fine pattern.

According to the second aspect of the invention, there are provided a wafer level lens in which a light dose is appropriately controlled by providing a light-shielding film formed of the black curable composition for a wafer level lens according to the second aspect, and which can be conveniently produced, and a camera module.

DESCRIPTION OF EMBODIMENTS

Figure 1:
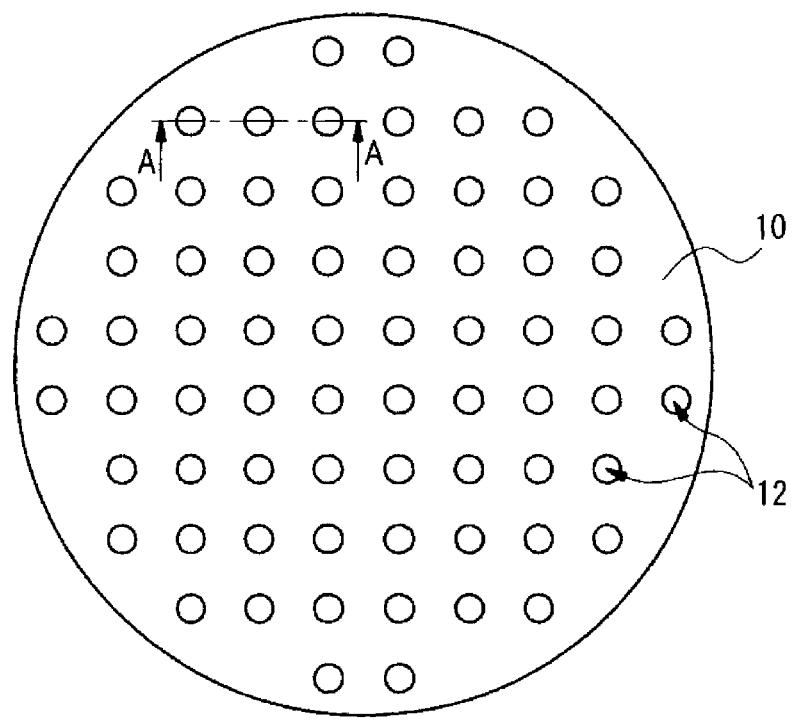
FIG. 1 is a plan view showing an example of a wafer level lens array of the invention.

Hereinafter, embodiments for carrying out the first aspect of the invention will be described in detail. Further, a black curable composition for a wafer level lens, and a wafer level lens having a light-shielding film obtained using the black curable composition, which are according to the second aspect of the invention, will also be described in detail.

Regarding the notation of groups (or atomic groups) in the present specification, notation with no mention of substitution or unsubstitution is intended to include both a group having no substituent and a group having a substituent. For example, the term "alkyl group" includes an alkyl group having no substituent (unsubstituted alkyl group) as well as an alkyl group having a substituent (substituted alkyl group).

Here, the term "wafer level lens" as used in the present specification refers to a lens provided in a solid-state imaging device, wherein the lens is made up of individual lenses on a substrate and light-shielding films provided in the peripheries of the lenses. In addition, a group consisting of the wafer level lenses is referred to as a "wafer level lens array".

Black Composition According to First Aspect
Black Curable Composition for Solid-State Imaging Device A black curable composition for a solid-state imaging device according to a first aspect of the invention (hereinafter, may be referred to suitably as "black curable composition according to the first aspect of the invention") includes at least: (A) an inorganic pigment; (B) a copolymer (hereinafter, may be referred to suitably as "specific resin") containing (b-1) a monomer having at least one group selected from an amino group and a nitrogen-containing heterocyclic group, (b-2) a monomer having at least one group selected from the group consisting of a carboxyl group, a phosphate group and a sulfonate group and (b-3) a macromonomer having a weight average molecular weight from 1,000 to 50,000; (C) a polymerization initiator; (D) a polymerizable compound; and (E) an alkali-soluble resin having an unsaturated double bond.

Since the black curable composition according to the first aspect the invention has the above configuration, pattern defects which are the problem associated with the formation of a pattern of a light-shielding region in a solid-state imaging device are suppressed.

Although the mechanism has not still been fully understood, an assumption has been made as follows.

When the developability and curing property of a black curable composition are low, irradiation at a low exposure dose causes incomplete curing of a pattern region at the boundary between an unexposed portion and an exposed portion, and a portion of a pattern may be defective. On the other hand, since, in a high exposure dose region, curing also proceeds up to the developed region (i.e., the unexposed portion) adjacent to the exposed portion, thus a pattern dimension becomes relatively larger, a light-shielding pattern having a desired pattern size is not formed and residues are generated in the unexposed portion. In other words, in order to suppress pattern defects, form a pattern having a desired size, and suppress generation of residues in the unexposed portion, it is necessary to increase discrimination of solubility by increasing both the developability and curing property of a black curable composition.

Generally, a dispersion resin has a hydrophobic steric repulsive group to prevent pigment-pigment aggregation and does not have curing property. Therefore, the dispersion resin is a component that deteriorates the developability and curing property of a black curable composition. In contrast, the specific resin of the present invention has at least one acid group selected from a carboxyl group, a phosphate group and a sulfonate group and at least one basic group selected from an amino group and/or a nitrogen-containing heterocyclic group, and functions not only as a dispersion resin but also as an alkali-soluble resin during alkali development. With regard to the specific resin according to the first aspect of the invention, when a pattern of the exposed portion is formed in a development process, some acid groups and basic groups form a salt pair structure, which promotes permeability of a developer, thus improving developability. At the same time, since a network of acid groups and basic groups is formed between the specific resin molecules, hardness of the exposed pattern is improved. It is considered that, by this action, pattern defects are suppressed and developability of the unexposed portion is improved. Furthermore, by adding an alkali-soluble resin having an unsaturated double bond, the developability and curing property of a black curable composition are further increased, and both suppression of pattern defect and improvement in developability of the unexposed portion are simultaneously achieved, which are goals to be achieved during the production of a light-shielding film for a solid-state imaging device.

The black curable composition for a solid-state imaging device according to the first aspect of the invention is used in the formation of a light-shielding cured film (hereinafter, may be referred to suitably as "light-shielding film") in a solid-state imaging device.

The term "light shieldability" as used in the present specification means a capacity to suppress the transmission of light having a wavelength of 400 nm to 800 nm.

Black Curable Composition According to Second Aspect
Black Curable Composition for Wafer Level Lens A black curable composition for a wafer level lens according to a second aspect of the present invention (hereinafter, may be referred to suitably as "black curable composition according to the second aspect of the invention") includes at least: (A) an inorganic pigment; (B) a copolymer (hereinafter, may be referred to suitably as "specific resin") containing (b-1) a monomer having an amino group and/or a nitrogen-containing heterocyclic group, (b-2) a monomer having at least one group selected from the group consisting of a carboxyl group, a phosphate group and a sulfonate group and (b-3) a macromonomer having a weight average molecular weight from 1,000 to 50,000; (C) a polymerization initiator; (D) a polymerizable compound; and (E) an alkali-soluble resin having an unsaturated double bond.

Since the black curable composition according to the second aspect has the above configuration, large pattern and fine pattern co-formability, which is a goal associated with the formation of a light-shielding region of a wafer level lens by a photolithographic method, is improved. The term "large pattern" as used in the second aspect of the invention refers to a protrusion pattern whose shorter side has a size of about 500 µm to 5,000 µm, and the term "fine pattern" refers to a protrusion pattern whose shorter side has a size of about 5 µm to 50 µm.

Although the mechanism has not still been fully understood, an assumption has been made as follows.

When the developability and curing property of a black curable composition are low, a low exposure dose region capable of forming a large pattern undergoes incomplete curing of a fine pattern, leading to deterioration of adhesion to a substrate. On the other hand, in a high exposure dose region capable of securing adhesion of a fine pattern to a substrate, curing also proceeds up to the developed portion (other than the formation region of a light-shielding film) which is an unexposed portion and therefore residues are generated. In other words, in order to simultaneously form a large pattern and a fine pattern, it is necessary to increase discrimination of solubility by increasing both the developability and curing property of a black curable composition.

Generally, a dispersion resin has a hydrophobic steric repulsive group to prevent pigment-pigment aggregation and does not have curing property. Therefore, the dispersion resin is a component that deteriorates the developability and curing property of a black curable composition. On the other hand, the specific resin of the present invention is a dispersion resin with a specific structure having at least one acid group selected from a carboxyl group, a phosphate group and a sulfonate group and a basic group which is an amino group and/or a nitrogen-containing heterocyclic group. With regard to the specific resin of the present invention, when forming a pattern, some acid groups and basic groups form a salt pair, which promotes permeability of a developer, thus improving developability. Further, hardness of the exposed film is improved due to the formation of an acid-base network between specific resin molecules. It is considered that pattern formability of both a large pattern and a fine pattern are simultaneously improved by this action. Furthermore, by adding an alkali-soluble resin having an unsaturated double bond, the developability and curing property of a black curable composition are further increased, and consequently concurrent pattern formation of a light-shielding film (large pattern) and a fine pattern is achieved, which is a goal to be achieved during the production of a wafer level lens.

The black curable composition for a wafer level lens according to the second aspect of the invention is used in the formation of a light-shielding cured film (hereinafter, may be referred to suitably as "light-shielding film") in a wafer level lens.

The term "light shieldability" as used in the present specification means a capacity to suppress the transmission of light having a wavelength of 400 nm to 800 nm.

Hereinafter, respective components contained in the black curable composition for a solid-state imaging device according to the first aspect of the invention, and the black curable composition for a wafer level lens according to the second aspect of the present invention are described sequentially.

(A) Inorganic Pigment

The black curable composition according to the first or second aspect of the present invention contains an inorganic pigment capable of functioning as a light shielding agent, from the viewpoint of storage stability and safety.

As the inorganic pigment, preference is given to an inorganic pigment having absorption in a wavelength range of from an ultraviolet light region to an infrared region, from the viewpoint of exhibiting light shieldability against light of a broad wavelength range of from an ultraviolet light region to an infrared region. Examples of the inorganic pigment include a pigment formed of a single metal substance, and a pigment formed from a metal compound selected from a metal oxide, a metal complex salt, and the like.

Specific examples of the inorganic pigment include zinc flower, lead white, lithopone, titanium oxide, chromium oxide, iron oxide, precipitated barium sulfate and barite powder, red lead, iron oxide red, chromium yellow, zinc yellow (such as zinc yellow 1, zinc yellow 2), ultramarine blue, Prussian blue (potassium iron ferrocyanide), zircon gray, praseodymium yellow, chromium titanium yellow, chromium green, peacock, Victoria green, ferric hexacyanoferrate (unrelated to Prussian blue), vanadium zirconium blue, chromium tin pink, manganese pink, and salmon pink. In addition, examples of black inorganic pigment include metal oxides and metal nitrides, which contain one or two or more metal elements selected from the group consisting of Co, Cr, Cu, Mn, Ru, Fe, Ni, Sn, Ti and Ag.

In the present invention, carbon black is regarded as an organic pigment.

In particular, for the purpose of exhibiting light shieldability against light of a broad wavelength range from an ultraviolet region to an infrared region, it is possible to use a mixture of plural inorganic pigments as well as each individual pigment.

From the viewpoint of light shieldability and curing property, the inorganic pigment is more preferably a metal pigment including silver and/or tin, or titanium black. From the viewpoint of light shieldability against light of a broad wavelength range from an ultraviolet region to an infrared region, the inorganic pigment is most preferably titanium black.

Titanium black useful in the present invention is a black particle having a titanium atom. Titanium black is preferably lower titanium oxide or titanium oxynitride or the like.

Titanium black may optionally be surface-modified for the purpose of improving dispersibility, suppressing aggregation property, or the like. As for surface modification of titanium black, for example, the surface of titanium black may be coated with silicon oxide, titanium oxide, germanium oxide, aluminum oxide, magnesium oxide or zirconium oxide. Alternatively, titanium black may be treated using a water-repellent substance as described in JP-A No. 2007-302836.

Examples of commercially available products of titanium black include TITANIUM BLACK 10S, 12S, 13R, 13M, 13M-C, 13R and 13R-N (all trade names, manufactured by Mitsubishi Materials Corporation), and TILACK D (trade name, manufactured by Ako Kasei Co., Ltd.).

Examples of a method of producing titanium black include, but are not limited to, a method of heating and reducing a mixture of titanium dioxide and metal titanium under a reducing atmosphere (e.g., the method as described in JP-A No. 49-5432); a method of reducing ultrafine titanium dioxide obtained by high-temperature hydrolysis of titanium tetrachloride under a reducing atmosphere containing hydrogen (e.g., the method as described in JP-A No. 57-205322); a method of reducing titanium dioxide or titanium hydroxide at a high temperature in the presence of ammonia (e.g., methods as described in JP-A No. 60-65069 and JP-A No. 61-201610); and a method depositing a vanadium compound on titanium dioxide or titanium hydroxide, followed by reduction at a high temperature in the presence of ammonia (e.g., a method as described in JP-A No. 61-201610).

Although the specific surface area of titanium black is not particularly limited, the value as measured by a BET method is typically about 5 $m^2$/g to 150 $m^2$/g, and preferably about 20 $m^2$/g to 100 $m^2$/g.

In addition, a combination of one or two or more black pigments, such as a composite oxide of Cu, Fe, Mn, V, Ni or the like, cobalt oxide, iron oxide, carbon black or aniline black, may be used together with titanium black, for the purpose of controlling dispersibility, colorability or the like. In this case, titanium black preferably accounts for 50% by mass or more of the inorganic pigment.

The inorganic pigment used in the first or second aspect of the present invention has an average primary particle diameter of preferably 5 nm to 0.01 mm. From the viewpoint of dispersibility, light shieldability, and precipitability over time, the average primary particle diameter is more preferably in the range of 10 nm to 1 μm.

The particle diameter (average primary particle diameter) of titanium black preferably used as an inorganic pigment is not particularly limited. The average primary particle diameter is preferably in the range of from 3 nm to 2,000 nm, and more preferably from 10 nm to 100 nm, from the viewpoint of dispersibility and colorability. In particular, in the use for a solid-state imaging device according to the first aspect of the invention or the use for a wafer level lens according to the second aspect of the invention, titanium black having an average primary particle diameter of from 30 nm to 65 nm, whereby pattern defects are suppressed, and/or pattern formability is improved. This is believed to be due to the fact that a load of external force applied to the fine pattern during development and rinsing is decreased when a pattern is formed from fine titanium black because the smoothness of a pattern is improved and irregularities are decreased.

In the black curable composition of the present invention, the inorganic pigments may be used alone or in a combination of two or more thereof. In addition, as described hereinbelow, an organic pigment or dye may be optionally used in combination with the inorganic pigment, for the purpose of controlling light shieldability or the like.

The content of the inorganic pigment in the black curable composition is preferably in the range of 5% by mass to 70% by mass, and more preferably 10% by mass to 60% by mass, based on the solid content of the black curable composition.

When the inorganic pigment is to be incorporated into the black curable composition, a pigment dispersion, which is prepared by dispersing an inorganic pigment in advance using a specific resin, is preferably used in the preparation of a black curable composition, from the viewpoint of uniformity of the resulting black curable composition.

(B) Copolymer Containing (b-1) Monomer Having at Least One Group Selected from Amino Group and Nitrogen-Containing Heterocyclic Group, (b-2) Monomer Having at Least One Group Selected from the Group Consisting of Carboxyl Group, Phosphate Group and Sulfonate Group and (b-3) Macromonomer Having Weight Average Molecular Weight from 1,000 to 50,000: Specific Resin The black curable composition according to the first or second aspect of the invention contains (B) a copolymer (hereinafter, may be referred to as "specific resin") containing (b-1) a monomer having at least one group selected from an amino group and a nitrogen-containing heterocyclic group, (b-2) a monomer having at least one group selected from the group consisting of a carboxyl group, a phosphate group and a sulfonate group and (b-3) a macromonomer having a weight average molecular weight from 1,000 to 50,000.

The specific resin functions as a dispersant for (A) the inorganic pigment.

In the first or second aspect of the invention, since a pigment dispersion is prepared by dispersing inorganic pigments in advance using the specific resin, the inorganic pigments are finely dispersed in the pigment dispersion, and the dispersion stability is excellent. Accordingly, pattern formability of the black curable composition is improved or pattern formability of both a large pattern and a fine pattern can be improved.

The specific resin is prepared by copolymerizing, as raw materials, (b-1) a monomer having at least one group selected from an amino group and a nitrogen-containing heterocyclic group, (b-2) a monomer having at least one group selected from the group consisting of a carboxyl group, a phosphate group and a sulfonate group, and (b-3) a macromonomer having a weight average molecular weight from 1,000 to 50,000, and optionally, monomer(s) having a different structure.

Hereinafter, the raw materials used to obtain the specific resin, that is, (b-1) a monomer having at least one group selected from an amino group and a nitrogen-containing heterocyclic group, (b-2) a monomer having at least one group selected from the group consisting of a carboxyl group, a phosphate group and a sulfonate group, and (b-3) a macromonomer having a weight average molecular weight from 1,000 to 50,000, and optional monomer(s) having a different structure, will be described.

(b-1) Monomer Having at Least One Group Selected from Amino Group and Nitrogen-Containing Heterocyclic Group The (b-1) monomer having at least one group selected from an amino group and a nitrogen-containing heterocyclic group (hereinafter, may be referred to as "monomer (b-1)") used in the first or second aspect is a monomer having an amino group and/or a nitrogen-containing heterocyclic group and having a molecular weight from 50 to 1,000.

Examples of the amino group which may be held by the monomer (b-1) include primary, secondary and tertiary amino groups. From the viewpoint of dispersion stability, a secondary or tertiary amino group is preferable, and a tertiary amino group is more preferable. The amino group is preferably an amino group containing a linear or branched alkyl group having 1 to 10 carbon atoms, a cycloalkyl group having 3 to 10 carbon atoms, or an aryl group having 6 to 15 carbon atoms, and most preferably an amino group containing a linear or branched alkyl group having 1 to 5 carbon atoms. Specific examples of the amino group include —NHMe, —NHEt, —NHPr, —NHiPr, —NHBu, —NH(tert-Bu), —NMe$_2$, —NEt$_2$, —NPr$_2$, —NPh$_2$, and a morpholino group. As used herein, "Me" represents a methyl group, "Et" represents an ethyl group, "Pr" represents a propyl group, "Bu" represents a butyl group, and "Ph" represents a phenyl group.

A nitrogen-containing heterocyclic group which may be held by the monomer (b-1) is a cyclic substituent having at least one nitrogen atom in a cyclic structure thereof, wherein the cyclic structure may be a saturated ring or unsaturated ring, may be a monocyclic ring or condensed ring, and may by an unsubstituted ring or may have a substituent. The nitrogen-containing heterocyclic group derived from the monomer (b-1) may be present in a side chain or main chain of the specific resin, and is more preferably present in a side chain of the specific resin from the viewpoints of dispersibility and dispersion stability.

Specific examples of the cyclic structure of the nitrogen-containing heterocyclic group include pyrrolidine, pyrroline, tetrahydropyridine, piperazine, homopiperazine, piperidine, triazine, morpholine, hexamethylenetetramine, diazabicycloundecene, decahydroquinoline, diazabicyclooctane, pyrrolidinone, δ-valerolactam, succinimide, glutarimide, imidazolidone, tetrahydropyrimidone, urazole, dihydrouracil, barbituric acid, indole, carbazole, julolidine, phenoxazine, phenothiazine, oxindole, phenanthridinone, isatin, phthalimide, diiminoisoindoline, iminoisoindolinone, diiminobenzisoindoline, naphthalimide, quinazolinedione, pyrrole, porphyrin, porphyrin-metal complexes, phthalocyanine, phthalocyanine-metal complexes, naphthalocyanine, naphthalocyanine-metal complexes, pyrazole, imidazole, triazole, tetrazole, isoxazole, oxazole, isothiazole, thiazole, thiadiazole, thiatriazole, iminostilbene, azaindole, indazole, benzimidazole, benzotriazole, azabenzimidazole, anthranil, benzisoxazole, benzoxazole, benzothiazole, benzofurazan, benzothiadiazole, triazole-pyrimidine, triazole-pyridine, purine, xanthine, pyridine, pyridazine, pyrimidine, pyrimidone, uracil, pyrazine, quinoline, acridine, cinnoline, benzocinnoline, quinoxaline, quinazoline, quinoxaline, phenazine, phenanthroline, perimidine, and acridone, and these may be unsubstituted or substituted.

More preferable examples of the cyclic structure of the nitrogen-containing heterocyclic group include indole, carbazole, phenoxazine, phenothiazine, oxindole, phenanthridinone, isatin, phthalimide, diiminoisoindoline, iminoisoindolinone, diiminobenzisoindoline, naphthalimide, quinazolinedione, pyrrole, pyrazole, imidazole, triazole, tetrazole, isoxazole, oxazole, isothiazole, thiazole, thiadiazole, thiatriazole, iminostilbene, azaindole, indazole, benzimidazole, benzotriazole, azabenzimidazole, anthranil, benzisoxazole, benzoxazole, benzothiazole, benzofurazan, benzothiadiazole, triazole-pyrimidine, triazole-pyridine, purine, xanthine, pyridine, pyridazine, pyrimidine, pyrimidone, uracil, pyrazine, quinoline, acridine, cinnoline, benzocinnoline, quinoxaline, quinazoline, quinoxaline, phenazine, phenanthroline and acridone.

Examples of the substituent which the nitrogen-containing heterocyclic group in the monomer (b-1) may have include a halogen atom, an alkyl group, a cycloalkyl group, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an alkylamino group and an anilino group), an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl-sulfinyl group or an aryl-sulfinyl group, an alkyl-sulfonyl group or an aryl-sulfonyl group, an acyl group, an aryloxycarbonyl group, an alkoxycarbonyl group, a carbamoyl group, an aryl azo group or a heterocyclic azo group, an imido group, a phosphino group, a phosphinyl group, a phosphinyloxy group, a phosphinylamino group, and a silyl group.

Hereinafter, the substituents which the nitrogen-containing heterocyclic group may have will be described in more detail.

Examples of the substituent include:

a halogen atom such as a fluorine atom, a chlorine atom, a bromine atom or an iodine atom;

a linear or branched, substituted or unsubstituted alkyl group, and preferably an alkyl group having 1 to 30 carbon atoms, such as a methyl group, an ethyl group, a n-propyl group, an isopropyl group, a t-butyl group, a n-octyl group, a 2-chloroethyl group, a 2-cyanoethyl group or a 2-ethylhexyl group;

a cycloalkyl group, and preferably, a substituted or unsubstituted cycloalkyl group having 3 to 30 carbon atoms, such as a cyclohexyl group or a cyclopentyl group, or a cycloalkyl group having a polycyclic structure, such as a bicycloalkyl group (preferably a substituted or unsubstituted bicycloalkyl group having 5 to 30 carbon atoms, for example, bicyclo[1,2,2]heptan-2-yl or bicyclo[2,2,2]octan-3-yl) and a tricycloalkyl group, and more preferably, a monocyclic cycloalkyl group and a bicycloalkyl group, and particularly preferably a monocyclic cycloalkyl group;

a linear or branched, substituted or unsubstituted alkenyl group, and preferably an alkenyl having 2 to 30 carbon atoms, such as a vinyl group, an allyl group, a prenyl group, a geranyl group or an oleyl group;

a cycloalkenyl group, and preferably, a substituted or unsubstituted cycloalkenyl group having 3 to 30 carbon atoms, such as a 2-cyclopenten-1-yl group or a 2-cyclohexen-1-yl group, or a polycycloalkenyl group such as a bicycloalkenyl group (preferably, a substituted or unsubstituted bicycloalkenyl group having 5 to 30 carbon atoms, for example, a bicyclo[2,2,1]hept-2-en-1-yl group, or a bicyclo[2,2,2]oct-2- en-4-yl group) or a tricycloalkenyl group, and particularly preferably a monocyclic cycloalkenyl group);

an alkynyl group, and preferably a substituted or unsubstituted alkynyl group having 2 to 30 carbon atoms, such as an ethynyl group, a propargyl group or a trimethylsilylethynyl group);

an aryl group (preferably a substituted or unsubstituted aryl group having 6 to 30 carbon atoms, for example, a phenyl group, a p-tolyl group, a naphthyl group, a m-chlorophenyl group or an o-hexadecanoylaminophenyl group);

a heterocyclic group (preferably, a 5- to 7-membered substituted or unsubstituted, saturated or unsaturated, aromatic or non-aromatic, monocyclic or condensed heterocyclic group, more preferably a heterocyclic group having at least one heteroatom of a nitrogen atom, an oxygen atom or a sulfur atom, with the ring-constituting atom being selected from a carbon atom, a nitrogen atom and a sulfur atom, and still more preferably a 5- or 6-membered aromatic heterocyclic group having 3 to 30 carbon atoms, examples of which including a 2-furyl group, a 2-thienyl group, a 2-pyridyl group, a 4-pyridyl group, a 2-pyrimidinyl group or a 2-benzothiazolyl group);

a cyano group;

a hydroxyl group;

a nitro group;

a carboxyl group;

an alkoxy group (preferably, a substituted or unsubstituted alkoxy group having 1 to 30 carbon atoms, for example, a methoxy group, an ethoxy group, an isopropoxy group, a t-butoxy group, a n-octyloxy group or a 2-methoxyethoxy group);

an aryloxy group (preferably, a substituted or unsubstituted aryloxy group having 6 to 30 carbon atoms, for example, a phenoxy group, a 2-methylphenoxy group, a 2,4-di-t-amylphenoxy group, a 4-t-butylphenoxy group, a 3-nitrophenoxy group or a 2-tetradecanoylaminophenoxy group);

a silyloxy group (preferably, a silyloxy group having 3 to 20 carbon atoms, for example, a trimethylsilyloxy group or a t-butyldimethylsilyloxy group);

a heterocyclic oxy group (preferably, a substituted or unsubstituted heterocyclic oxy group having 2 to 30 carbon atoms, in which the heterocyclic moiety thereof is preferably the heterocyclic moiety described above for the heterocyclic group, examples of the heterocyclic oxy group including a 1-phenyl-tetrazol-5-oxy group and a 2-tetrahydropyranyloxy group);

an acyloxy group (preferably, a formyloxy group, a substituted or unsubstituted alkylcarbonyloxy group having 2 to 30 carbon atoms, or a substituted or unsubstituted arylcarbonyloxy group having 6 to 30 carbon atoms, and examples thereof include a formyloxy group, an acetyloxy group, a pivaloyloxy group, a stearoyloxy group, a benzoyloxy group and a p-methoxyphenylcarbonyloxy group);

a carbamoyloxy group (preferably, a substituted or unsubstituted carbamoyloxy group having 1 to 30 carbon atoms, such as a N,N-dimethylcarbamoyloxy group, a N,N-diethylcarbamoyloxy group, a morpholinocarbonyloxy group, a N,N-di-n-octylaminocarbonyloxy group or a N-n-octylcarbamoyloxy group);

an alkoxycarbonyloxy group (preferably, a substituted or unsubstituted alkoxycarbonyloxy group having 2 to 30 carbon atoms, such as a methoxycarbonyloxy group, an ethoxycarbonyloxy group, a t-butoxycarbonyloxy group or a n-octylcarbonyloxy group);

an aryloxycarbonyloxy group (preferably, a substituted or unsubstituted aryloxycarbonyloxy group having 7 to 30 carbon atoms, such as a phenoxycarbonyloxy group, a p-methoxyphenoxycarbonyloxy group or a p-n-hexadecyloxyphenoxycarbonyloxy group);

an amino group (preferably, an amino group, a substituted or unsubstituted alkylamino group having 1 to 30 carbon atoms, a substituted or unsubstituted arylamino group having 6 to 30 carbon atoms, or a heterocyclic amino group having 0 to 30 carbon atoms, such as an amino group, a methylamino group, a dimethylamino group, an anilino group, a N-methylanilino group, a diphenylamino group or a N-1,3,5-triazin-2-yl-amino group);

an acylamino group (preferably, a formylamino group, a substituted or unsubstituted alkylcarbonylamino group having 1 to 30 carbon atoms, or a substituted or unsubstituted arylcarbonylamino group having 6 to 30 carbon atoms, such as a formylamino group, an acetylamino group, a pivaloylamino group, a lauroylamino group, a benzoylamino group or a 3,4,5-tri-n-octyloxyphenylcarbonylamino group);

an aminocarbonylamino group (preferably, a substituted or unsubstituted aminocarbonylamino group having 1 to 30 carbon atoms, such as a carbamoylamino group, a N,N-dimethylaminocarbonylamino group, a N,N-diethylaminocarbonylamino group or a morpholinocarbonylamino group);

an alkoxycarbonylamino group (preferably, a substituted or unsubstituted alkoxycarbonylamino group having 2 to 30 carbon atoms, such as a methoxycarbonylamino group, an ethoxycarbonylamino group, a t-butoxycarbonylamino group, a n-octadecyloxycarbonylamino group or a N-methylmethoxycarbonylamino group);

an aryloxycarbonylamino group (preferably, a substituted or unsubstituted aryloxycarbonylamino group having 7 to 30 carbon atoms, such as a phenoxycarbonylamino group, a p-chlorophenoxycarbonylamino group or a m-n-octyloxyphenoxycarbonylamino group);

a sulfamoylamino group (preferably, a substituted or unsubstituted sulfamoylamino group having 0 to 30 carbon atoms, such as a sulfamoylamino group, a N,N-dimethylaminosulfonylamino group or a N-n-octylaminosulfonylamino group);

an alkyl-sulfonylamino group or aryl-sulfonylamino group (preferably, a substituted or unsubstituted alkylsulfonylamino group having 1 to 30 carbon atoms, or a substituted or unsubstituted arylsulfonylamino group having 6 to 30 carbon atoms, such as a methylsulfonylamino group, a butylsulfonylamino group, a phenylsulfonylamino group, a 2,3,5-trichlorophenylsulfonylamino group or a p-methylphenylsulfonylamino group);

a mercapto group;

an alkylthio group (preferably, a substituted or unsubstituted alkylthio group having 1 to 30 carbon atoms, such as a methylthio group, an ethylthio group or a n-hexadecylthio group);

an arylthio group (preferably, a substituted or unsubstituted arylthio group having 6 to 30 carbon atoms, such as a phenylthio group, a p-chlorophenylthio group or a m-methoxyphenylthio group);

a heterocyclic thio group (preferably, a substituted or unsubstituted heterocyclic thio group having 2 to 30 carbon atoms, in which the heterocyclic moiety is preferably the heterocyclic moiety described above for the heterocyclic group, and examples of the heterocyclic thio group include a 2-benzothiazolylthio group and a 1-phenyltetrazol-5-ylthio group);

a sulfamoyl group (preferably, a substituted or unsubstituted sulfamoyl group having 0 to 30 carbon atoms, such as a N-ethylsulfamoyl group, a N-(3-dodecyloxypropyl)sulfamoyl group, a N,N-dimethylsulfamoyl group, a N-acetylsulfamoyl group, a N-benzoylsulfamoyl group or a N—(N'-phenylcarbamoyl)sulfamoyl group;

a sulfo group;

an alkyl-sulfinyl group or aryl-sulfinyl group (preferably, a substituted or unsubstituted alkylsulfinyl group having 1 to 30 carbon atoms, or a substituted or unsubstituted arylsulfinyl group having 6 to 30 carbon atoms, such as a methylsulfinyl sulfinyl group, an ethylsulfinyl sulfinyl group, a phenylsulfinyl sulfinyl group or a p-methylphenylsulfinyl sulfinyl group);

an alkyl-sulfonyl group or aryl-sulfonyl group (preferably, a substituted or unsubstituted alkylsulfonyl group having 1 to 30 carbon atoms, or a substituted or unsubstituted arylsulfonyl group having 6 to 30 carbon atoms, such as a methylsulfonyl group, an ethylsulfonyl group, a phenylsulfonyl group or a p-methylphenylsulfonyl group);

an acyl group (preferably, a formyl group, a substituted or unsubstituted alkylcarbonyl group having 2 to 30 carbon atoms, or a substituted or unsubstituted arylcarbonyl group having 7 to 30 carbon atoms, such as an acetyl group, a pivaloyl group, a 2-chloroacetyl group, a stearoyl group, a benzoyl group or a p-n-octyloxyphenylcarbonyl group);

an aryloxycarbonyl group (preferably, a substituted or unsubstituted aryloxycarbonyl group having 7 to 30 carbon atoms, such as a phenoxycarbonyl group, an o-chlorophenoxycarbonyl group, a m-nitrophenoxycarbonyl group or a p-t-butylphenoxycarbonyl group);

an alkoxycarbonyl group (preferably, a substituted or unsubstituted alkoxycarbonyl group having 2 to 30 carbon atoms, such as a methoxycarbonyl group, an ethoxycarbonyl group, a t-butoxycarbonyl group or a n-octadecyloxycarbonyl group);

a carbamoyl group (preferably, a substituted or unsubstituted carbamoyl group having 1 to 30 carbon atoms, such as a carbamoyl group, a N-methylcarbamoyl group, a N,N-dimethylcarbamoyl group, a N,N-di-n-octylcarbamoyl group or a N-(methylsulfonyl)carbamoyl group);

an aryl azo group or heterocyclic azo group (preferably, a substituted or unsubstituted aryl azo group having 6 to 30 carbon atoms, or a substituted or unsubstituted heterocyclic azo group having 3 to 30 carbon atoms, in which the heterocyclic moiety is preferably the heterocyclic moiety described above for the heterocyclic group, and examples thereof include a phenylazo group, a p-chlorophenylazo group and a 5-ethylthio-1,3,4-thiadiazol-2-ylazo group);

an imido group (preferably, a substituted or unsubstituted imido group having 2 to 30 carbon atoms, such as a N-succinimide group or a N-phthalimide group);

a phosphino group (preferably, a substituted or unsubstituted phosphino group having 2 to 30 carbon atoms, such as a dimethylphosphino group, a diphenylphosphino group or a methylphenoxyphosphino group);

a phosphinyl group (preferably, a substituted or unsubstituted phosphinyl group having 2 to 30 carbon atoms, such as a phosphinyl group, a dioctyloxyphosphinyl group or a diethoxyphosphinyl group);

a phosphinyloxy group (preferably, a substituted or unsubstituted phosphinyloxy group having 2 to 30 carbon atoms, such as a diphenoxyphosphinyloxy group or a dioctyloxyphosphinyloxy group);

a phosphinylamino group (preferably, a substituted or unsubstituted phosphinylamino group having 2 to 30 carbon atoms, such as a dimethoxyphosphinylamino group or a dimethylaminophosphinylamino group); and a silyl group (preferably, a substituted or unsubstituted silyl group having 3 to 30 carbon atoms, such as a trimethylsilyl group, a t-butyldimethylsilyl group or a phenyldimethylsilyl group).

In those having a hydrogen atom among these functional groups, the hydrogen atom thereof may be substituted by any one of the substituents as described above. Examples of such a functional group include an alkylcarbonylaminosulfonyl group, an arylcarbonylaminosulfonyl group, an alkylsulfonylaminocarbonyl group and an arylsulfonylaminocarbonyl group, and specific examples thereof include a methylsulfonylaminocarbonyl group, a p-methylphenylsulfonylaminocarbonyl group, an acetylaminosulfonyl group and a benzoylaminosulfonyl group.

From the viewpoints of dispersion stability, developability and light-fastness, the monomer (b-1) is preferably a monomer having an amino group, a pyridinyl group, an imidazoyl group, a phthalimido group, a naphthalimido group, a benzimidazole group, or an acridone group, and more preferably a monomer having an amino group or a naphthalimido group.

A known monomer having an amino group and/or a nitrogen-containing heterocyclic group and having a molecular weight from 50 to 1,000 may be used as the monomer (b-1). From the viewpoint of polymerization capability, the monomer (b-1) is preferably an acrylic monomer or a styrene monomer, and most preferably an acrylic ester monomer represented by the following Formula (K), or a styrene monomer represented by the following Formula (L). By having such a monomer-derived structural unit, the specific resin has an amino group or nitrogen-containing heterocyclic group in a side chain thereof, which enables strong interaction with an inorganic pigment. As a result, dispersion stability of the black curable composition is improved.

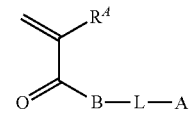

(K)

In Formula (K), $R^A$ represents a hydrogen atom, a methyl group, a trifluoromethyl group, a hydroxymethyl group, a fluorine atom, or a chlorine atom; B represents an oxygen atom or —N($R^B$)—, wherein $R^B$ represents a hydrogen atom, an alkyl group, a cycloalkyl group, or an aryl group; L represents a divalent linking group; and A represents an amino group or a nitrogen-containing heterocyclic group.

$R^A$ in Formula (K) is preferably a hydrogen atom or a methyl group.

The divalent linking group represented by L is preferably an alkylene group having 2 to 20 carbon atoms, an alkylene aminocarbonyl group having 2 to 20 carbon atoms, a cycloalkylene group having 5 to 10 carbon atoms, or an arylene group having 6 to 10 carbon atoms, and most preferably an alkylene group having 2 to 10 carbon atoms or an alkylene aminocarbonyl group having 2 to 10 carbon atoms.

Examples of the alkyl group represented by $R^B$ include alkyl groups having 1 to 10 carbon atoms, and an alkyl group having 1 to 5 carbon atoms is particularly preferable. The amino group or nitrogen-containing heterocyclic group represented by A has the same definition as those described for the amino group or heterocyclic group of the monomer (b-1), and preferable ranges thereof are also the same.

(L)

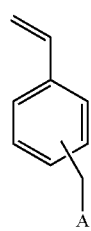

In Formula (L), A represents an amino group or a nitrogen-containing heterocyclic group. The amino group or heterocyclic group represented by A has the same definition as those described for the amino group or heterocyclic group of the monomer (b-1), and preferable ranges thereof are also the same.

Only one kind of the monomers (b-1) may be used alone, or a combination of two or more kinds thereof may be used.

Specific examples of the monomer (b-1) are shown hereinbelow, but the present invention is not limited thereto. Further, in specific examples (M-1) to (M-23), and (M-31) to (M-50), $R^A$ represents a hydrogen atom, a methyl group, a trifluoromethyl group, a hydroxymethyl group, a fluorine atom, or a chlorine atom.

(M-1)
(M-2)
(M-3)
(M-4)
(M-5)
(M-6)

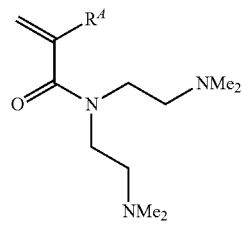

(M-7)

(M-8)

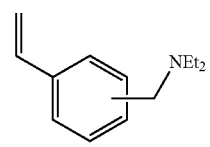

(M-9)
(M-10)

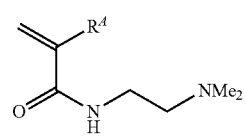

(M-11)
(M-12)

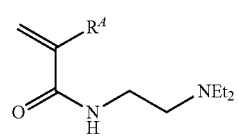

(M-13)

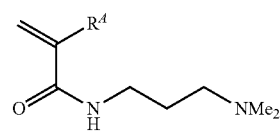

(M-14)

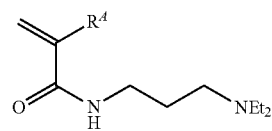

(M-15)

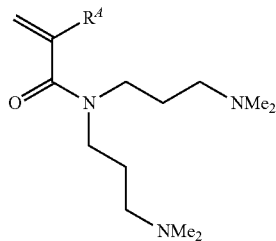

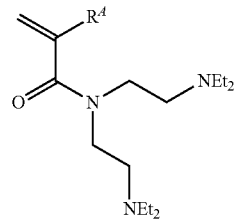

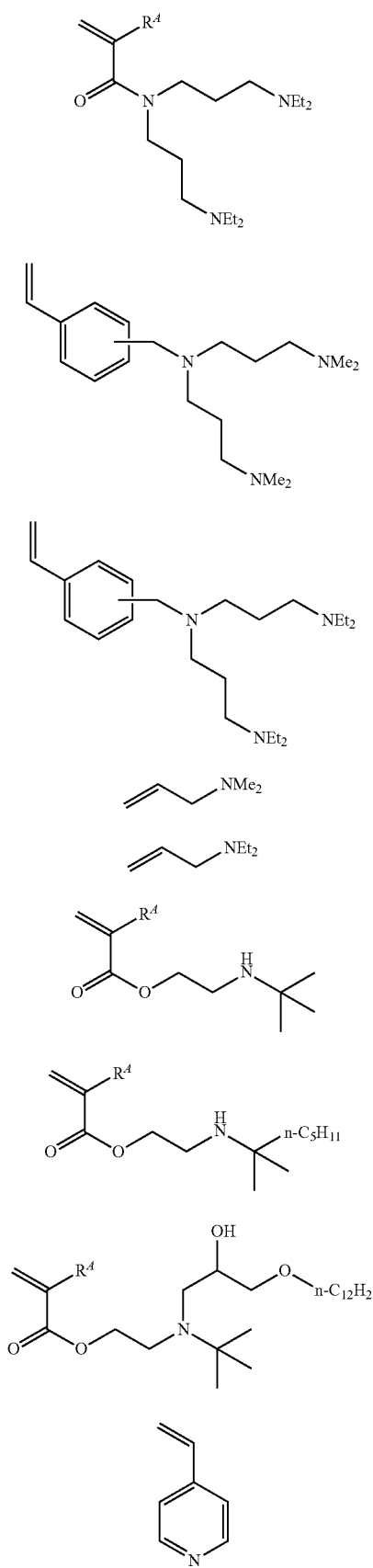
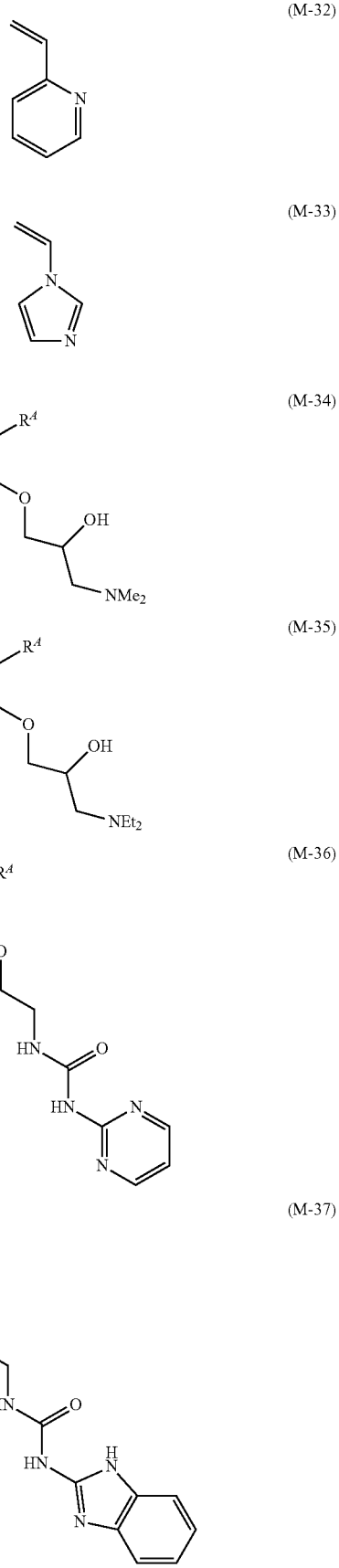

(M-38)
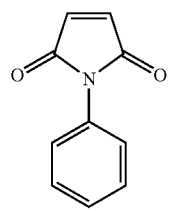
(M-39)
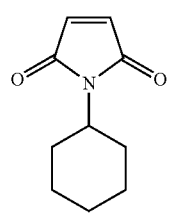
(M-40)
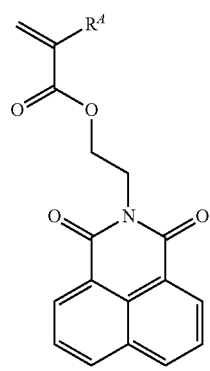
(M-41)
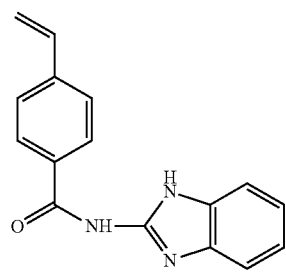
(M-42)
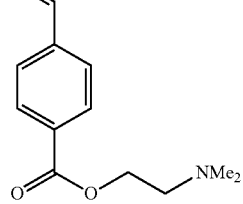
(M-43)
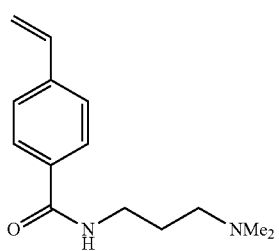
(M-44)
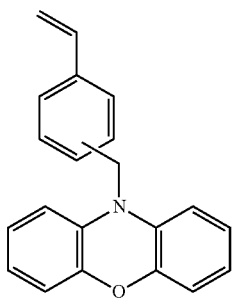
(M-45)
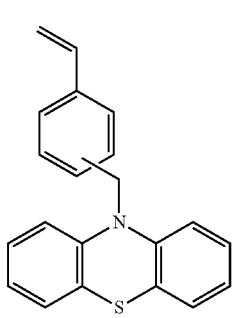
(M-46)
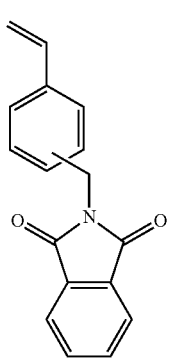
(M-47)
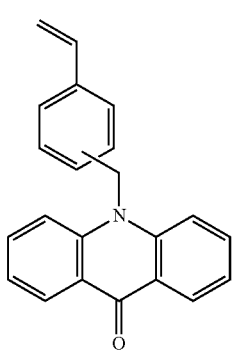

-continued

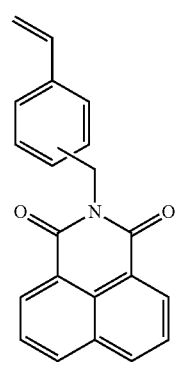
(M-48)

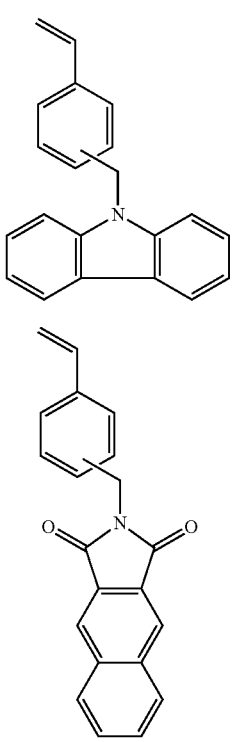
(M-49)

(M-50)

Among specific examples (M-1) to (M-23) and (M-31) to (M-50), preferred are specific examples (M-1) to (M-6), (M-9) to (M-16), (M-21) to (M-23), (M-37), (M-40), (M-47), (M-48), and (M-49) wherein $R^A$ represents a hydrogen atom or a methyl group, and particularly preferred are specific examples (M-1), (M-2), (M-11), (M-12), (M-37), (M-47) and (M-48) wherein $R^A$ represents a hydrogen atom or a methyl group, from the viewpoints of dispersion stability of a pigment dispersion, developability exhibited by a black curable composition produced using the pigment dispersion, and suppression of pattern defect, or pattern formability of large pattern and fine pattern.

(b-2) Monomer Having at Least One Group Selected from the Group Consisting of Carboxyl Group, Phosphate Group and Sulfonate Group: Monomer (b-2)

In the first and second aspect of the invention, the (b-2) monomer (hereinafter, may be referred to as "monomer (b-2)") having at least one group selected from the group consisting of a carboxyl group, a phosphate group and a sulfonate group is a monomer having at least one group selected from a carboxyl group, a phosphate group and a sulfonate group and having a molecular weight from 50 to 500. From the viewpoint of polymerization capability, the monomer (b-2) is preferably an acrylic monomer or a styrene monomer, and a (meth)acrylic ester monomer or a (meth)acrylic amide monomer is most preferably used.

Among a carboxyl group, a phosphate group and a sulfonate group which may be held by the monomer (b-2), it is preferable that the monomer (b-2) has a carboxyl group or a phosphate group, and most preferably a carboxyl group.

The monomer (b-2) may have two or more kinds of a carboxyl group, a phosphate group and a sulfonate group, and it is preferable that monomer (b-2) has a combination of a carboxyl group and a phosphate group, or a combination of a carboxyl group and a sulfonate group.

The monomers (b-2) may be used alone, or in a combination of two or more kinds thereof.

Specific examples of the monomer (b-2) are shown hereinbelow, but the present invention is not limited thereto. Further, in specific examples (M-51) to (M-68), $R^A$ represents a hydrogen atom, a methyl group, a trifluoromethyl group, a hydroxymethyl group, a fluorine atom or a chlorine atom.

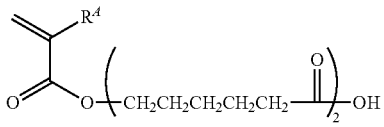
(M-51)

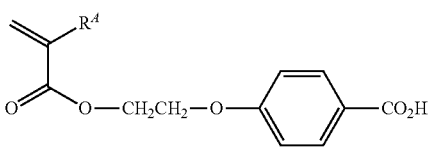
(M-52)

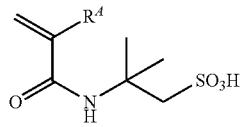
(M-53)

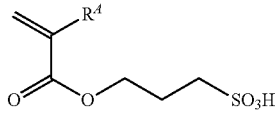
(M-54)

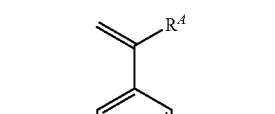
(M-55)

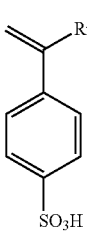

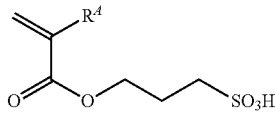
(M-56)

(M-57)

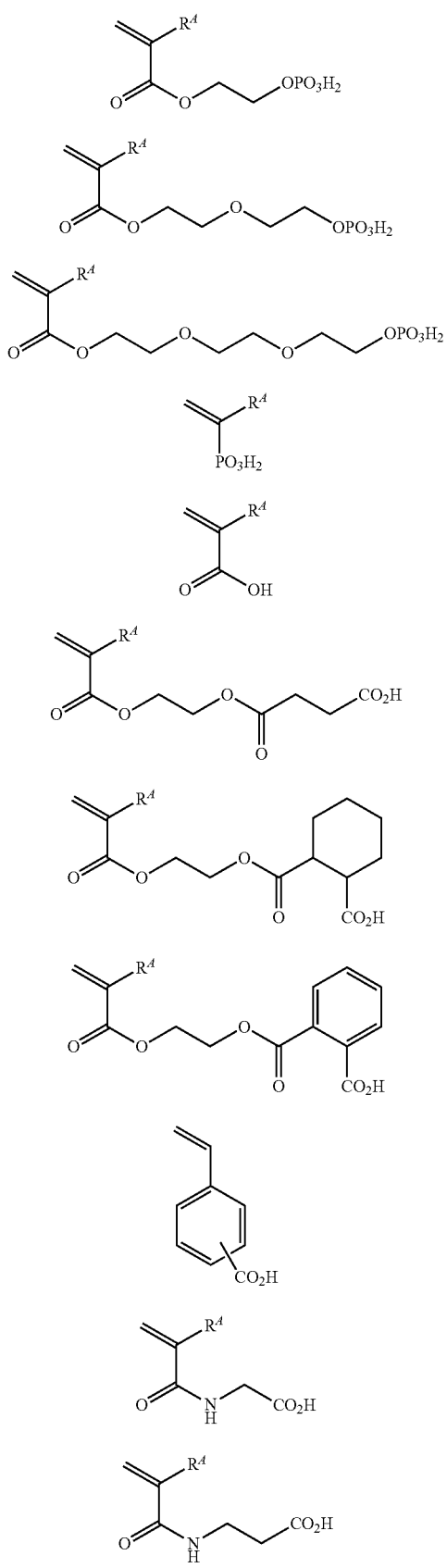

Among specific examples (M-51) to (M-68), specific example (M-62) wherein $R^A$ represents a hydrogen atom or a methyl group, that is, acrylic acid or methacrylic acid is most preferable. When the repeating unit of (M-62) is used, a carboxyl group is provided at a location near the main chain of a polymer, whereby penetration of a developer to the interface between the substrate and the black curable composition layer is suppressed, and adhesion to a substrate is improved.

(b-3) Macromonomer Having Weight Average Molecular Weight from 1,000 to 50,000: Macromonomer (b-3)

The (b-3) macromonomer (hereinafter, may be referred to as "macromonomer (b-3)") having a weight average molecular weight from 1,000 to 50,000 used in the first or second aspect of the invention is an oligomer or polymer having a weight average molecular weight from 1,000 to 50,000 and a polymerizable group at a terminal thereof.

The weight average molecular weight of the macromonomer (b-3) is in the range from 1,000 to 50,000, preferably from 1,000 to 20,000, more preferably from 2,000 to 10,000, and most preferably from 2,000 to 5,000. When the weight average molecular weight of the macromonomer (b-3) is within these ranges, dispersibility and dispersion stability of a pigment dispersion, and developability exhibited by a black curable composition produced using the pigment dispersion are improved.

The weight average molecular weight as used in the present specification is in terms of polystyrene, as measured by gel permeation chromatography (GPC).

As the macromonomer (b-3), a known macromonomer may be used.

Examples of the macromonomer (b-3) include MACROMONOMER AA-6 (methacryloyl group-terminated polymethyl methacrylate), AS-6 (methacryloyl group-terminated polystyrene), AN-6S (methacryloyl group-terminated styrene/acrylonitrile copolymer), AB-6S (methacryloyl group-terminated polybutyl acrylate) (all trade names, manufactured by Toagosei Co., Ltd.); PLACCEL FM5 (5:1 mol addition product of ε-caprolactone and 2-hydroxyethyl methacrylate), and FA10L (10:1 mol addition product of ε-caprolactone and 2-hydroxyethyl acrylate) (all trade names, manufactured by Daicel Chemical Industries, Ltd.); and the polyester macromonomers as disclosed in JP-A No. 2-272009. Among these, particularly preferred is a polyester macromonomer having excellent flexibility and excellent solventphilicity in terms of dispersibility and dispersion stability of a pigment dispersion, and developability and light-fastness exhibited by a black curable composition produced using the pigment dispersion. Most preferred is a polyester macromonomer represented by the following Formula (M).

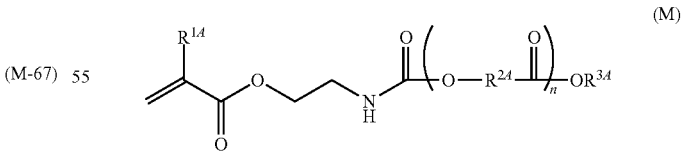
(M)

In Formula (M), $R^{1A}$ represents a hydrogen atom or a methyl group; $R^{2A}$ represents an alkylene group; $R^{3A}$ represents an alkyl group; and n represents an integer of 5 to 100; and plural $R^{2A}$'s present in a molecule may be the same as or different from each other.

In particular, $R^{2A}$ is preferably a linear or branched alkylene group having 5 to 20 carbon atoms, and most preferably $-(CH_2)_5-$; $R^{3A}$ is preferably a linear or branched alkyl group having 5 to 20 carbon atoms; and n is preferably an integer of 5 to 30, and most preferably an integer of 10 to 20.

The macromonomers (b-3) may be used alone, or a combination of two or more kinds thereof may be used.

The specific resin preferably contains a repeating unit derived from the monomer (b-1) in a content of from 10% by mass to 50% by mass, more preferably from 15% by mass to 45% by mass, and most preferably from 20% by mass to 40% by mass, based on the total mass of the specific resin. When the content of the repeating unit derived from monomer (b-1) is within these ranges, dispersibility and dispersion stability of a pigment dispersion, and developability exhibited by a black curable composition produced using the pigment dispersion are further improved.

The repeating unit derived from the monomer (b-1) which is included in the specific resin preferably contains an amino group in terms of dispersibility and dispersion stability of a pigment dispersion.

The monomer (b-1)-derived repeating unit of the specific resin more preferably contains both an amino group and a nitrogen-containing heterocyclic group in terms of further improving dispersibility and dispersion stability, and it is more preferable that the specific resin contains the nitrogen-containing heterocyclic group in a side chain structure of the specific resin.

The content ratio of an amino group and a nitrogen-containing heterocyclic group (i.e., amino group:nitrogen-containing heterocyclic group, in mass ratio) in a monomer (b-1)-derived repeating unit of the specific resin is preferably in the range of from 100:0 to 5:95, more preferably from 100:0 to 10:90, and most preferably from 100:0 to 15:85.

The acid value of the specific resin is preferably in the range of from 10 mgKOH/g to 200 mgKOH/g, more preferably from 20 mgKOH/g to 150 mgKOH/g, and most preferably from 40 mgKOH/g to 100 mgKOH/g. When the acid value of the specific resin is within these ranges, dispersibility and dispersion stability of a pigment dispersion, and developability exhibited by a black curable composition produced using the pigment dispersion are improved. An acid value of the specific resin may be measured by titration using a base.

The monomer (b-2)-derived repeating unit is preferably contained in the specific resin in such a content that an acid value of the specific resin falls within the above ranges.

The specific resin preferably contains the macromonomer (b-3)-derived repeating unit in a content of from 15% by mass to 90% by mass, more preferably from 25% by mass to 80% by mass, and most preferably from 35% by mass to 60% by mass, based on the total mass of the specific resin. When the content of the macromonomer (b-3)-derived repeating unit is within the above ranges, dispersibility and dispersion stability of a pigment dispersion, and developability exhibited by a black curable composition produced using the pigment dispersion are further improved.

Specific examples of the specific resin include, but are not limited to, resins (J-1) to (J-18) and the like given in conjunction with Synthesis Examples, in the Example section which will be illustrated hereinafter.

The specific resin preferably has a weight average molecular weight in terms of polystyrene conversion value according to a GPC method, of from 5,000 to 70,000, more preferably from 7,000 to 25,000, and most preferably from 10,000 to 20,000. When the weight average molecular weight of the specific resin is within the above ranges, dispersibility and dispersion stability of a pigment dispersion, and developability exhibited by a black curable composition produced using the pigment dispersion are further improved.

A content ratio of the monomer (b-1)-derived repeating unit, the monomer (b-2)-derived repeating unit and the macromonomer (b-3)-derived repeating unit in the specific resin (i.e., (b-1):(b-2):(b-3) in mass ratio) is preferably in the range of from (10 to 50):(2 to 30):(30 to 80), more preferably (15 to 45):(5 to 20):(40 to 70), and still more preferably (20 to 40):(8 to 20):(40 to 60).

The specific resin is preferably formed from a (meth) acrylic repeating unit and a styrene repeating unit. Since the specific resin is formed from such repeating units, thermal motility of the specific resin is relatively lowered, and consequently a light-shielding film becomes solid. For this reason, permeability of a developer to the interface between the substrate and the light-shielding film is suppressed, and adhesion to the substrate is improved.

The specific resin may be a resin that inherently exhibits curing property.

In order to impart curing property to the specific resin, a polymerizable group may be introduced into the specific resin. The introduction of a polymerizable group may be carried out, for example, by a known method such as a method of reacting a carboxyl group of the specific resin with a (meth)acrylate (for example, glycidyl methacrylate) containing an epoxy group, or a method of reacting a hydroxyl group of the specific resin with a (meth)acrylate containing an isocyanate group or a cyclic acid anhydride containing a polymerizable group.

When the specific resin has a polymerizable group, the content of the repeating unit having the polymerizable group is preferably in the range of 5% by mass to 50% by mass, and more preferably 10% by mass to 40% by mass, based on the total mass of the specific resin.

In order to improve solubility in a solvent or coating property, the specific resin may contain a repeating unit having a structural unit other than the above-mentioned one. Examples of such a repeating unit include repeating units derived from alkyl (meth)acrylates, cycloalkyl (meth)acrylates, aralkyl (meth)acrylates, (meth)acrylic acid amides, 2-hydroxy ethyl (meth)acrylates, and styrenes.

The specific resin is preferably prepared by radical polymerization of monomer (b-1), monomer (b-2), macromonomer (b-3), and optionally, monomers having a different structure, as raw materials. When preparing the specific resin by radical polymerization, polymerization conditions such as temperature, pressure, the type and amount of radical initiator, and the type of solvent may be the same as those of conventional polymerization methods.

In the first aspect of the invention, the content of (B) the specific resin in the black curable composition is preferably from 15% by mass to 35% by mass, and most preferably from 20% by mass to 30% by mass, with respect to (A) the inorganic pigment. In other words, in the black curable composition according to the first aspect of the invention, the mass ratio of (B) the specific resin to (A) the inorganic pigment is preferably from 0.15 to 0.35, and most preferably from 0.20 to 0.30. When the content of (B) the specific resin is within the above ranges, defects in a pattern obtained by curing the black curable composition according to first aspect is suppressed, and coating property of a black curable composition is improved.

In the first aspect, the specific resins may be used alone, or in a combination of two or more kinds thereof.

The black curable composition according to the first aspect of the invention may preferably contain the following dispersant in addition to (B) the specific resin. The incorporation of a dispersion resin and/or a dispersant can improve dispersibility of a pigment.

The dispersant that may be used in the first aspect may be appropriately selected, for example, from known pigment dispersants or surfactants.

Specifically, various kinds of compounds may be used as the dispersant. Specific examples of the dispersant include: a cationic surfactant such as a organosiloxane polymer KP341 (trade name, manufactured by Shin-Etsu Chemical Co., Ltd.), a (meth)acrylate (co)polymer POLYFLOW No. 75, No. 90, No. 95 (all trade names, manufactured by Kyoeisha Chemical Co., Ltd.), or W001 (trade name, manufactured by Yusho Co., Ltd.); a nonionic surfactant such as polyoxyethylene lauryl ether, polyoxyethylene stearyl ether, polyoxyethylene oleyl ether, polyoxyethylene octylphenyl ether, polyoxyethylene nonyl phenyl ether, polyethylene glycol dilaurate, polyethylene glycol distearate, or sorbitan fatty acid ester; an anionic surfactant such as W004, W005 or W017 (all trade names, manufactured by Yusho Co., Ltd.); a polymer dispersant such as EFKA-46, EFKA-47, EFKA-47EA, EFKA POLYMER 100, EFKA POLYMER 400, EFKA POLYMER 401, EFKA POLYMER 450 (all trade names, manufactured by Ciba Specialty Chemicals K.K. Japan), DISPERSE AID 6, DISPERSE AID 8, DISPERSE AID 15, or DISPERSE AID 9100 (all trade names, manufactured by San Nopco Ltd.); various SOLSPERSE dispersants such as SOLSPERSE 3000, 5000, 9000, 12000, 13240, 13940, 17000, 24000, 26000, or 280000 (all trade names, manufactured by Lubrizol Japan Limited); and ADEKA PLURONIC L31, F38, L42, L44, L61, L64, F68, L72, P95, F77, P84, F87, P94, L101, P103, F108, L121, P-123 (all trade names, manufactured by ADEKA Corporation), IONET S-20 (trade name, Sanyo Chemical Industries, Ltd.), and DISPERBYK 101, 103, 106, 108, 109, 111, 112, 116, 130, 140, 142, 162, 163, 164, 166, 167, 170, 171, 174, 176, 180, 182, 2000, 2001, 2050, and 2150 (all trade name, manufactured by BYK Japan K.K.). Other examples of the dispersant include oligomers or polymers having a polar group at a molecular terminal or in a side chain thereof, such as acrylic copolymers.

The total content of (B) the specific resin and the above-described other dispersants in the black curable composition according to first aspect is preferably in the range of from 1% by mass to 100% by mass, and more preferably from 3% by mass to 70% by mass, based on the total mass of the pigments.

In the second aspect of the invention, the mass ratio of (B) the specific resin to (A) the inorganic pigment is preferably in the range of from 0.15 to 0.35, and most preferably from 0.20 to 0.30. In other words, in the second aspect of the invention, a content of (B) the specific resin in the black curable composition is preferably from 15% by mass to 35% by mass, and most preferably from 20% by mass to 30% by mass, with respect to (A) the inorganic pigment. When the mass ratio is in the above ranges, adhesion of both a large pattern and a fine pattern to a substrate and coating property of a black curable composition are improved.

In the second aspect, the specific resins may be used alone, or in a combination of two or more kinds thereof.

(C) Polymerization Initiator

The black curable composition according to the first or second aspect of the invention further contains (C) a polymerization initiator.

The polymerization initiator included in the black curable composition according to the first or second aspect of the invention is a compound that is degraded by light or heat and initiates and/or promotes the polymerization of a polymerizable compound, which will be described hereinbelow, and preferably has an absorption in a wavelength region of from 300 nm to 500 nm.

Specific examples of the polymerization initiator include an organic halogenated compound, an oxydiazole compound, a carbonyl compound, a ketal compound, a benzoin compound, an organic peroxide compound, an azo compound, a coumarin compound, an azide compound, a metallocene compound, an organic boron compound, a disulfonic acid compound, an oxime ester compound, an onium salt compound, an acyl phosphine(oxide) compound, and a hexaarylbiimidazole compound.

As the polymerization initiator, an oxime ester compound or a hexaarylbiimidazole compound is particularly preferable from the viewpoints of residue reduction and adhesion between the light-shielding film and the surface on which the light-shielding film is formed (substrate or the like).

As a preferable oxime ester compound, any one of known compounds known as a photopolymerization initiator of a photosensitive composition for use or the like in electronic components may be used. The oxime ester compound to be used may be selected from the compounds as described in, for example, JP-A No. 57-116047, JP-A No. 61-24558, JP-A No. 62-201859, JP-A No. 62-286961, JP-A No. 7-278214, JP-A No. 2000-80068, JP-A No. 2001-233842, PCT Japanese Translation Patent Publication (JP-T) No. 2004-534797, JP-T No. 2002-538241, JP-A No. 2004-359639, JP-A No. 2005-97141, JP-A No. 2005-220097, WO 2005-080337 A1, JP-T No. 2002-519732, JP-A No. 2001-235858, JP-A No. 2005-227525, JP-A No. 2006-78749, or the like.

Generally, an oxime ester compound is has a low sensitivity due to low absorption in a near ultraviolet region such as at 365 nm or at 405 nm, but it is known that sensitivity thereof is heightened by increasing photosensitivity in a near ultraviolet region using a sensitizer. Furthermore, it is known that the amount of effective radicals generated is increased by the combined use of an oxime ester compound with a co-sensitizer such as an amine or a thiol, but higher sensitivity is required in terms of practical use.

In the present invention, even in a case of an oxime ester compound having a low absorption in a near ultraviolet region such as at 365 nm or at 405 nm, sensitivity thereof is significantly increased to a level of practical use by the combined use of such as oxime ester with a sensitizer.

The oxime ester compound is preferably a compound that exhibits low absorption in the range of 380 nm to 480 nm and has high decomposition efficiency, or a compound in which absorption in the range of 380 nm to 480 nm is high but absorption in the region is decreased by photodecomposition (absorption of a by-product at a short wavelength).

According to the first or second aspect of the invention, among the oxime ester compounds, 2-(O-benzoyloxime)-1-[4-(phenylthio)phenyl]-1,2-octanedione and 1-(O-acetyloxime)-1-[9-ethyl-6-(2-methylbenzoyl)-9H-carbazol-3-yl]ethanone are preferable.

Further, a compound represented by the following Formula (1) (hereinafter, also referred to as "specific oxime compound") is also preferable as the oxime photopolymerization initiator. The specific oxime compound may be an oxime compound in which the N—O bond of the oxime is in the (E) form or an oxime compound in which the N—O bond of the oxime is in the (Z) form, or a mixture of the (E) form compound and the (Z) form compound.

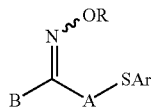 (1)

In Formula (1), R and B each independently represent a monovalent substituent; A represents a divalent organic group; and Ar represents an aryl group.

The monovalent substituent represented by R is preferably a monovalent non-metallic atomic group.

Examples of the monovalent non-metallic atomic group include an alkyl group, an aryl group, an alkenyl group, an alkynyl group, an alkylsulfinyl group, an arylsulfinyl group, an alkylsulfonyl group, an arylsulfonyl group, an acyl group, an alkoxycarbonyl group, an aryloxycarbonyl group, a phosphinoyl group, a heterocyclic group, an alkylthiocarbonyl group, an arylthiocarbonyl group, a dialkylaminocarbonyl group, and a dialkylaminothiocarbonyl group. These groups may each have one or more substituents, which may be further substituted by another substituent.

Examples of the substituents include: a halogen atom such as a fluorine atom, a chlorine atom, a bromine atom or an iodine atom; an alkoxy group such as a methoxy group, an ethoxy group or a tert-butoxy group; an aryloxy group such as a phenoxy group or a p-tolyloxy group; an alkoxycarbonyl group or aryloxycarbonyl group such as a methoxycarbonyl group, a butoxycarbonyl group or a phenoxycarbonyl group; an acyloxy group such as an acetoxy group, a propionyloxy group or a benzoyloxy group; an acyl group such as an acetyl group, a benzoyl group, an isobutyryl group, an acryloyl group, a methacryloyl group or a methoxalyl group; an alkylsulfanyl group such as a methylsulfanyl group or a tert-butylsulfanyl group; an arylsulfanyl group such as a phenylsulfanyl group or a p-tolylsulfanyl group; an alkylamino group such as a methylamino group or a cyclohexylamino group; a dialkylamino group such as a dimethylamino group, a diethylamino group, a morpholino group or a piperidino group; an arylamino group such as a phenylamino group or a p-tolylamino group; an alkyl group such as a methyl group, an ethyl group, a tert-butyl group or a dodecyl group; and an aryl group such as a phenyl group, a p-tolyl group, a xylyl group, a cumenyl group, a naphthyl group, an anthryl group or a phenanthryl group, as well as a hydroxyl group, a carboxyl group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphono group, a trimethylammonium group, a dimethylsulfonium group, and a triphenylphenacylphosphonium group.

The alkyl group which may have a substituent is preferably an alkyl group having 1 to 30 carbon atoms, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having 6 to 30 carbon atoms, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quarterphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quarternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarteranthracenyl group, an anthraquinonyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The alkenyl group which may have a substituent is preferably an alkenyl group having 2 to 10 carbon atoms, and specific examples thereof include a vinyl group, an allyl group, and a styryl group.

The alkynyl group which may have a substituent is preferably an alkynyl group having 2 to 10 carbon atoms, and specific examples thereof include an ethynyl group, a propynyl group, and a propargyl group.

The alkylsulfinyl group which may have a substituent is preferably an alkylsulfinyl group having 1 to 20 carbon atoms, and specific examples thereof include a methylsulfinyl group, an ethylsulfinyl group, a propylsulfinyl group, an isopropylsulfinyl group, a butylsulfinyl group, a hexylsulfinyl group, a cyclohexylsulfinyl group, an octylsulfinyl group, a 2-ethylhexylsulfinyl group, a decanoylsulfinyl group, a dodecanoylsulfinyl group, an octadecanoylsulfinyl group, a cyanomethylsulfinyl group, and a methoxymethylsulfinyl group.

The arylsulfinyl group which may have a substituent is preferably an arylsulfinyl group having 6 to 30 carbon atoms, and specific examples thereof include a phenylsulfinyl group, a 1-naphthylsulfinyl group, a 2-naphthylsulfinyl group, a 2-chlorophenylsulfinyl group, a 2-methylphenylsulfinyl group, a 2-methoxyphenylsulfinyl group, a 2-butoxyphenylsulfinyl group, a 3-chlorophenylsulfinyl group, a 3-trifluoromethylphenylsulfinyl group, a 3-cyanophenylsulfinyl group, a 3-nitrophenylsulfinyl group, a 4-fluorophenylsulfinyl group, a 4-cyanophenylsulfinyl group, a 4-methoxyphenylsulfinyl group, a 4-methylsulfanylphenylsulfinyl group, a 4-phenylsulfanylphenylsulfinyl group, and a 4-dimethylaminophenylsulfinyl group.

The alkylsulfonyl group which may have a substituent is preferably an alkylsulfonyl group having 1 to 20 carbon atoms, and specific examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, and a perfluoroalkylsulfonyl group.

The arylsulfonyl group which may have a substituent is preferably an arylsulfonyl group having 6 to 30 carbon atoms, and specific examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

The acyl group which may have a substituent is preferably an acyl group having 2 to 20 carbon atoms, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having 2 to 20 carbon atoms, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The phosphinoyl group which may have a substituent is preferably a phosphinoyl group having 2 to 50 carbon atoms, and specific examples thereof include a dimethylphosphinoyl group, a diethylphosphinoyl group, a dipropylphosphinoyl group, a diphenylphosphinoyl group, a dimethoxyphosphinoyl group, a diethoxyphosphinoyl group, a dibenzoylphosphinoyl group, and a bis(2,4,6-trimethylphenyl)phosphinoyl group.

The heterocyclic group which may have a substituent is preferably an aromatic or aliphatic heterocyclic group containing a nitrogen atom, an oxygen atom, a sulfur atom or a phosphorus atom.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthonyl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

Specific examples of the dialkylaminocarbonyl group include a dimethylaminocarbonyl group, a diethylaminocarbonyl group, a dipropylaminocarbonyl group, and a dibutylaminocarbonyl group.

Examples of the dialkylaminothiocarbonyl group which may have a substituent include a dimethylaminothiocarbonyl group, a dipropylaminothiocarbonyl group and a dibutylaminothiocarbonyl group.

Among these, in order to achieve high sensitivity, R preferably represents an acyl group, and more preferably an acetyl group, a propanoyl group, a benzoyl group, or a toluoyl group.

The monovalent substituent represented by B in Formula (1) may be an aryl group, a heterocyclic group, an arylcarbonyl group, or a heterocyclic carbonyl group, which may further have one or more substituents. Examples of the substituents may be the same as described above. Further, the substituents each may be substituted by another substituent.

Among these, the monovalent substituent represented by B is particularly preferably a compound having any one of the structures shown below.

In the structures shown below, Y, X and n respectively have the same definitions as Y, X and n in Formula (2) described below, and preferable examples thereof are also the same.

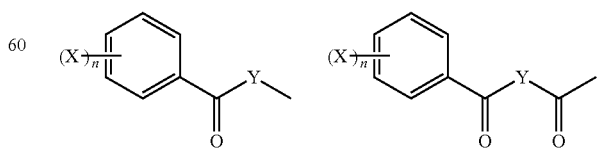

Examples of the divalent organic group represented by A in Formula (1) include an alkylene having 1 to 12 carbon atoms, a cyclohexylene group and an alkynylene group, which may each have one or more substituents. Examples of the substituents may be the same as those described above. Further, the substituents may be further substituted by another substituent.

Among these, from the viewpoints of enhancing sensitivity and suppressing coloration due to heating over time, "A" in Formula (1) preferably represents an unsubstituted alkylene group, an alkylene group substituted with an alkyl group (for example, a methyl group, an ethyl group, a tert-butyl group or a dodecyl group), an alkylene group substituted with an alkenyl group (for example, a vinyl group or an allyl group), or an alkylene group substituted with an aryl group (for example, a phenyl group, a p-tolyl group, a xylyl group, a cumenyl group, a naphthyl group, an anthryl group, a phenanthryl group or a styryl group).

The aryl group represented by Ar in Formula (1) is preferably an aryl group having 6 to 30 carbon atoms, which may have a substituent. Examples of the substituent may be the same as those described above.

Specific examples of the aryl group include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quarterphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quarternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarteranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

Among these, a substituted or unsubstituted phenyl group is preferable from the viewpoints of enhancing sensitivity and suppressing coloration due to heating over time.

In Formula (1), the structure of "SAr" formed by Ar and the adjacent S is preferably a structure shown below, from the viewpoint of sensitivity. In the following, "Me" represents a methyl group, and "Et" represents an ethyl group.

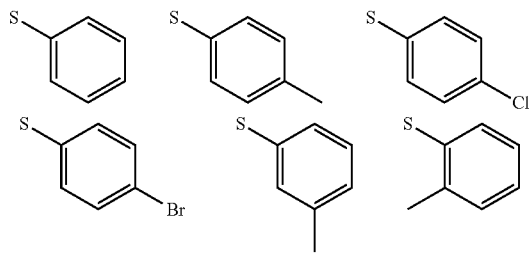

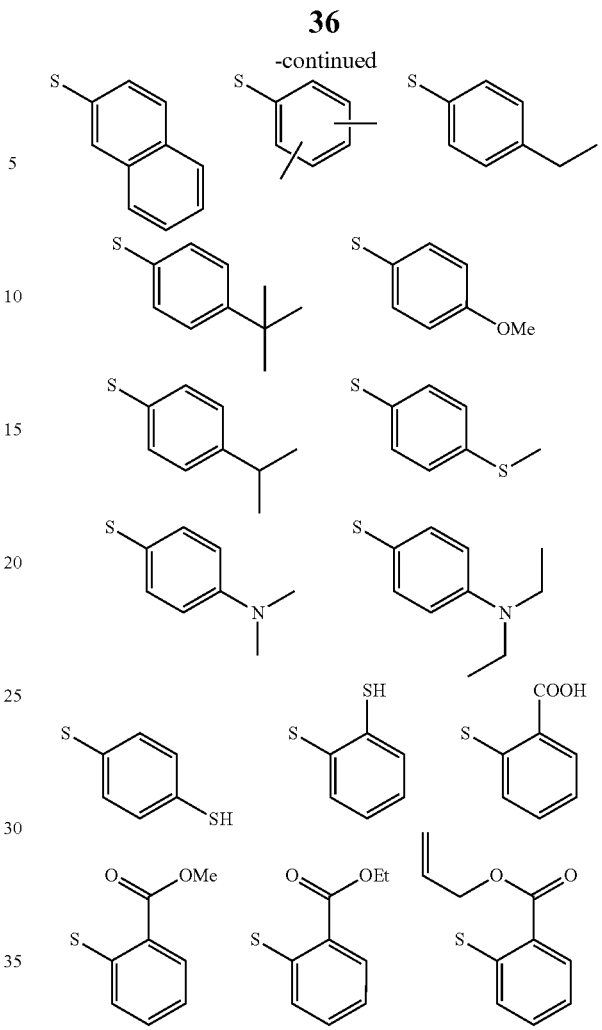

The specific oxime compound in the present invention is preferably a compound represented by the following Formula (2).

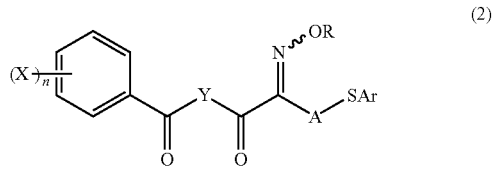

In Formula (2), R and X each independently represent a monovalent substituent; A and Y each independently represent a divalent organic group; Ar represents an aryl group; and n represents an integer of 0 to 5; and when plural X's are present in a molecule, the plural X's may the same as or different from each other.

R, A, and Ar in Formula (2) have the same definitions as R, A, and Ar in Formula (1), respectively, and preferable examples thereof are also the same.

Examples of the monovalent substituent represented by X include an alkyl group, an aryl group, an alkenyl group, an alkynyl group, an alkoxy group, an aryloxy group, an acyloxy group, an alkylsulfanyl group, an arylsulfanyl group, an alkylsulfinyl group, an arylsulfinyl group, an alkylsulfonyl group, an arylsulfonyl group, an acyl group, an alkoxycarbonyl group, a carbamoyl group, a sulfamoyl group, an amino group, a phosphinoyl group, a heterocyclic group, and a halogen atom, which may each have one or more substituents. Examples of the substituents may be the same as those described above, and the substituents may each be substituted by another substituent.

The alkyl group, aryl group, alkenyl group, alkynyl group, alkylsulfinyl group, arylsulfinyl group, alkylsulfonyl group, arylsulfonyl group, acyl group, alkoxycarbonyl group, aryloxycarbonyl group, phosphinoyl group, and heterocyclic group which are represented by X have the same definitions as the alkyl group, aryl group, alkenyl group, alkynyl group, alkylsulfinyl group, arylsulfinyl group, alkylsulfonyl group, arylsulfonyl group, acyl group, alkoxycarbonyl group, aryloxycarbonyl group, phosphinoyl group, and heterocyclic group represented by R in Formula (1), respectively, and preferable scopes thereof (including examples) are also the same.

The alkoxy group is preferably an alkoxy group having 1 to 30 carbon atoms, and specific examples thereof include a methoxy group, an ethoxy group, a propyloxy group, an isopropyloxy group, a butoxy group, an isobutoxy group, a sec-butoxy group, a tert-butoxy group, a pentyloxy group, an isopentyloxy group, a hexyloxy group, a heptyloxy group, an octyloxy group, a 2-ethylhexyloxy group, a decyloxy group, a dodecyloxy group, an octadecyloxy group, an ethoxycarbonylmethyl group, a 2-ethylhexyloxycarbonylmethyloxy group, an aminocarbonylmethyloxy group, an N,N-dibutylaminocarbonylmethyloxy group, an N-methylaminocarbonylmethyloxy group, an N-ethylaminocarbonylmethyloxy group, an N-octylaminocarbonylmethyloxy group, an N-methyl-N-benzylaminocarbonylmethyloxy group, a benzyloxy group, and a cyanomethyloxy group.

The aryloxy group is preferably an aryloxy group having 6 to 30 carbon atoms, and specific examples thereof include a phenyloxy group, a 1-naphthyloxy group, a 2-naphthyloxy group, a 2-chlorophenyloxy group, a 2-methylphenyloxy group, a 2-methoxyphenyloxy group, a 2-butoxyphenyloxy group, a 3-chlorophenyloxy group, a 3-trifluoromethylphenyloxy group, a 3-cyanophenyloxy group, a 3-nitrophenyloxy group, a 4-fluorophenyloxy group, a 4-cyanophenyloxy group, a 4-methoxyphenyloxy group, a 4-dimethylaminophenyloxy group, a 4-methylsulfanylphenyloxy group, and a 4-phenylsulfanylphenyloxy group.

The acyloxy group is preferably an acyloxy group having 2 to 20 carbon atoms, and specific examples thereof include an acetyloxy group, a propanoyloxy group, a butanoyloxy group, a pentanoyloxy group, a trifluoromethylcarbonyloxy group, a benzoyloxy group, a 1-naphthylcarbonyloxy group, and a 2-naphthylcarbonyloxy group.

The alkylsulfanyl group is preferably an alkylsulfanyl group having 1 to 20 carbon atoms, and specific examples thereof include a methylsulfanyl group, an ethylsulfanyl group, a propylsulfanyl group, an isopropylsulfanyl group, a butylsulfanyl group, a hexylsulfanyl group, a cyclohexylsulfanyl group, an octylsulfanyl group, a 2-ethylhexylsulfanyl group, a decanoylsulfanyl group, a dodecanoylsulfanyl group, an octadecanoylsulfanyl group, a cyanomethylsulfanyl group, and a methoxymethylsulfanyl group.

The arylsulfanyl group is preferably an arylsulfanyl group having 6 to 30 carbon atoms, and specific examples thereof include a phenylsulfanyl group, a 1-naphthylsulfanyl group, a 2-naphthylsulfanyl group, a 2-chlorophenylsulfanyl group, a 2-methylphenylsulfanyl group, a 2-methoxyphenylsulfanyl group, a 2-butoxyphenylsulfanyl group, a 3-chlorophenylsulfanyl group, a 3-trifluoromethylphenylsulfanyl group, a 3-cyanophenylsulfanyl group, a 3-nitrophenylsulfanyl group, a 4-fluorophenylsulfanyl group, a 4-cyanophenylsulfanyl group, a 4-methoxyphenylsulfanyl group, a 4-methylsulfanylphenylsulfanyl group, a 4-phenylsulfanylphenylsulfanyl group, and a 4-dimethylaminophenylsulfanyl group.

The carbamoyl group is preferably a carbamoyl group having a total of 1 to 30 carbon atoms, and specific examples thereof include an N-methylcarbamoyl group, an N-ethylcarbamoyl group, an N-propylcarbamoyl group, an N-butylcarbamoyl group, an N-hexylcarbamoyl group, an N-cyclohexylcarbamoyl group, an N-octylcarbamoyl group, an N-decylcarbamoyl group, an N-octadecylcarbamoyl group, an N-phenylcarbamoyl group, an N-2-methylphenylcarbamoyl group, an N-2-chlorophenylcarbamoyl group, an N-2-isopropoxyphenylcarbamoyl group, an N-2-(2-ethylhexyl)phenylcarbamoyl group, an N-3-chlorophenylcarbamoyl group, an N-3-nitrophenylcarbamoyl group, an N-3-cyanophenylcarbamoyl group, an N-4-methoxyphenylcarbamoyl group, an N-4-cyanophenylcarbamoyl group, an N-4-methylsulfanylphenylcarbamoyl group, an N-4-phenylsulfanylphenylcarbamoyl group, an N-methyl-N-phenylcarbamoyl group, an N,N-dimethylcarbamoyl group, an N,N-dibutylcarbamoyl group, and an N,N-diphenylcarbamoyl group.

The sulfamoyl group is preferably a sulfamoyl group having a total of 0 to 30 carbon atoms, and specific examples thereof include a sulfamoyl group, an N-alkylsulfamoyl group, an N-arylsulfamoyl group, an N,N-dialkylsulfamoyl group, an N,N-diarylsulfamoyl group, and an N-alkyl-N-arylsulfamoyl group. More specific preferable examples thereof include an N-methylsulfamoyl group, an N-ethylsulfamoyl group, an N-propylsulfamoyl group, an N-butylsulfamoyl group, an N-hexylsulfamoyl group, an N-cyclohexylsulfamoyl group, an N-octylsulfamoyl group, an N-2-ethylhexylsulfamoyl group, an N-decylsulfamoyl group, an N-octadecylsulfamoyl group, an N-phenylsulfamoyl group, an N-2-methylphenylsulfamoyl group, an N-2-chlorophenylsulfamoyl group, an N-2-methoxyphenylsulfamoyl group, an N-2-isopropoxyphenylsulfamoyl group, an N-3-chlorophenylsulfamoyl group, an N-3-nitrophenylsulfamoyl group, an N-3-cyanophenylsulfamoyl group, an N-4-methoxyphenylsulfamoyl group, an N-4-cyanophenylsulfamoyl group, an N-4-dimethylaminophenylsulfamoyl group, an N-4-methylsulfanylphenylsulfamoyl group, an N-4-phenylsulfanylphenylsulfamoyl group, an N-methyl-N-phenylsulfamoyl group, an N,N-dimethylsulfamoyl group, an N,N-dibutylsulfamoyl group, and an N,N-diphenylsulfamoyl group.

The amino group is preferably an amino group having a total of 0 to 50 carbon atoms, and specific examples thereof include an amino group (—NH$_2$), an N-alkylamino group, an N-arylamino group, an N-acylamino group, an N-sulfonylamino group, an N,N-dialkylamino group, an N,N-diarylamino group, an N-alkyl-N-arylamino group, and an N,N-disulfonylamino group. More specific preferable examples thereof include an N-methylamino group, an N-ethylamino group, an N-propylamino group, an N-isopropylamino group, an N-butylamino group, an N-tert-butylamino group, an N-hexylamino group, an N-cyclohexylamino group, an N-octylamino group, an N-2-ethylhexylamino group, an N-decylamino group, an N-octadecylamino group, an N-benzylamino group, an N-phenylamino group, an N-2-methylphenylamino group, an N-2-chlorophenylamino group, an N-2-methoxyphenylamino group, an N-2-isopropoxyphenylamino group, an N-2-(2-ethylhexyl)phenylamino group, an N-3-chlorophenylamino group, an N-3-nitrophenylamino group, an N-3-cyanophenylamino group, an N-3-trifluoromethylphenylamino group, an N-4-methoxyphenylamino group, an N-4-cyanophenylamino group, an N-4-trifluoromethylphenylamino group, an N-4-methylsulfanylphenylamino group, an N-4-phenylsulfanylphenylamino group, an N-4-dimethylaminophenylamino group, an N-methyl-N-phenylamino group, an N,N-dimethylamino group, an N,N-diethylamino group, an N,N-dibutylamino group, an N,N-diphenylamino group, an N,N-diacetylamino group, an N,N-dibenzoylamino group, an N,N-(dibutylcarbonyl)amino group, an N,N-(dimethylsulfonyl)amino group, an N,N-(diethylsulfonyl)amino group, an N,N-(dibutylsulfonyl)amino group, an N,N-(diphenylsulfonyl)amino group, a morpholino group, a 3,5-dimethylmorpholino group, and a carbazole group.

Examples of the halogen atom include a fluorine atom, a chlorine atom, a bromine atom, and an iodine atom.

Among these, X preferably represents an alkyl group, an aryl group, an alkenyl group, an alkynyl group, an alkoxy group, an aryloxy group, an alkylsulfanyl group, an arylsulfanyl group or an amino group, from the viewpoints of solvent solubility and improvement of absorption efficiency in a long wavelength region.

Further, n in Formula (2) represents an integer of 0 to 5, and preferably an integer of 0 to 2.

Examples of the divalent organic group represented by Y include the structures shown below. In the groups shown below, "*" represents a bonding position to a carbon atom adjacent to Y in Formula (2) above.

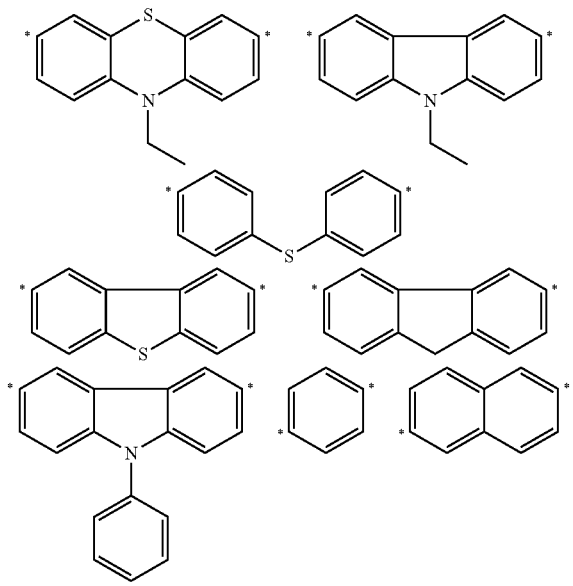

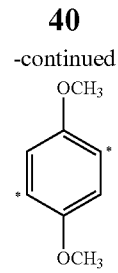

Among these, the structures shown below are preferable from the viewpoint of high sensitivity.

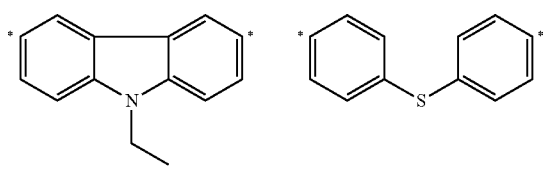

The specific oxime compound in the present invention is preferably a compound represented by the following Formula (3).

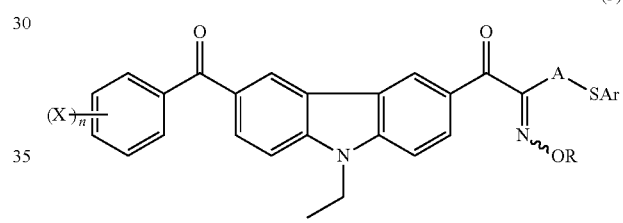

(3)

In Formula (3), R and X each independently represent a monovalent substituent; A represents a divalent organic group; Ar represents an aryl group; and n represents an integer of 0 to 5; and when plural X's are present in a molecule, the plural X's may the same as or different from each other.

R, X, A, Ar and n in Formula (3) have the same definitions as R, X, A, Ar and n in Formula (2), respectively, and preferable scopes thereof (including examples) are also the same.

Specific examples (K-1) to (K-88) of the specific oxime compound according to the invention are shown below, but the present invention is not limited thereto.

(4)

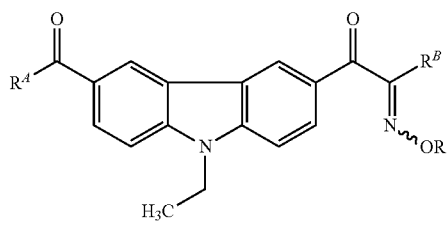

—$R^A$  —OR  —$R^B$

-continued
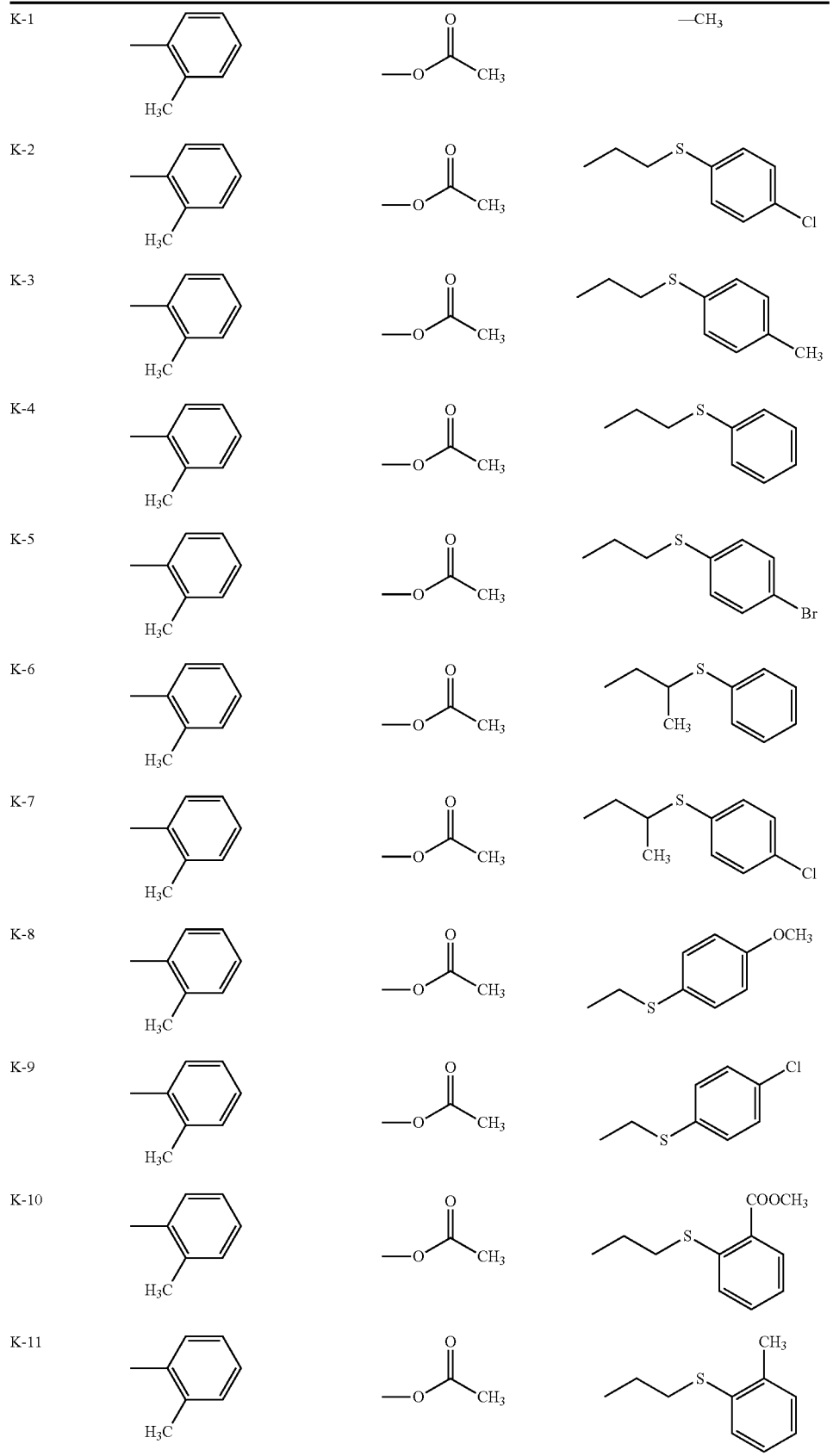

-continued
| | | | |
|---|---|---|---|
| K-12 | 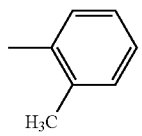 | 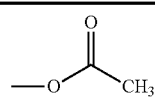 | 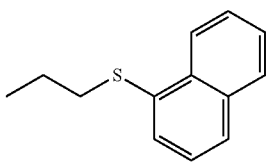 |
| K-13 | 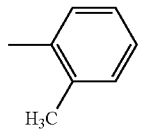 | 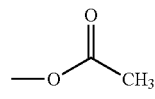 | 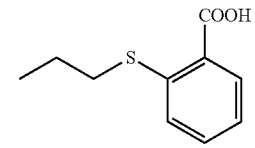 |
| K-14 | 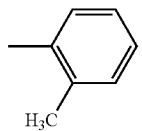 | 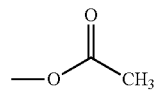 | 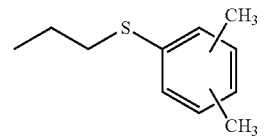 |
| K-15 | 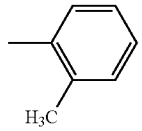 | 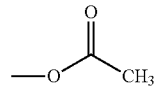 | 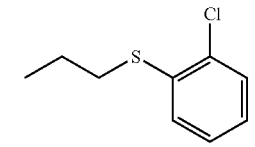 |
| K-16 | 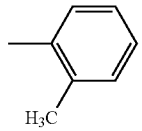 | 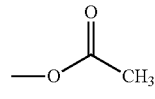 | 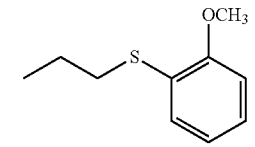 |
| K-17 | 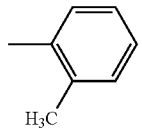 | 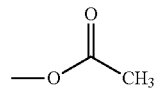 | 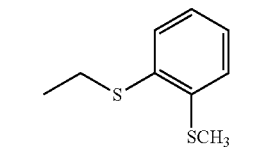 |
| K-18 | 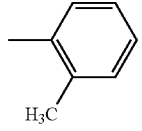 | 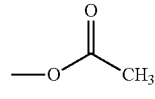 | 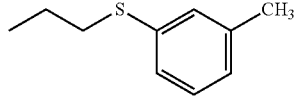 |
| K-19 | 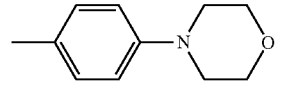 | 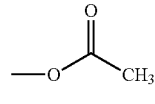 | 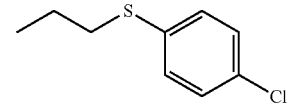 |
| K-20 | 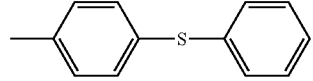 | 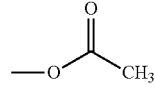 | 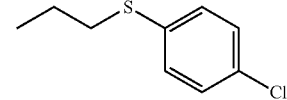 |
| K-21 | 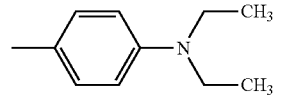 | 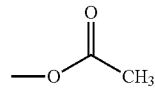 | 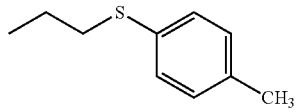 |
| K-22 | 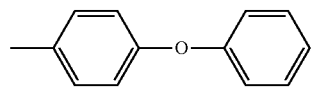 | 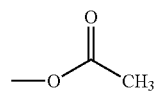 | 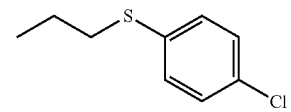 |

-continued
| | | | |
|---|---|---|---|
| K-23 | 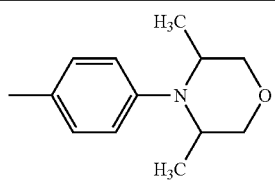 | 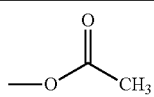 | 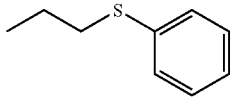 |
| K-24 | 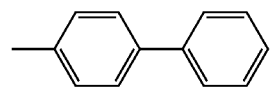 | 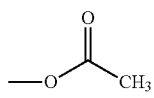 | 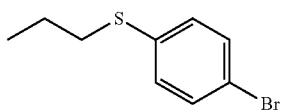 |
| K-25 | 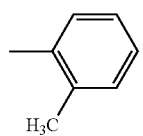 | 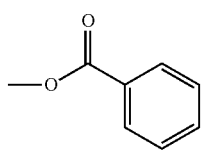 | 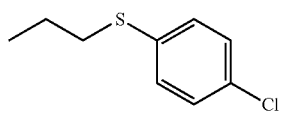 |
| K-26 | 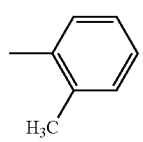 | 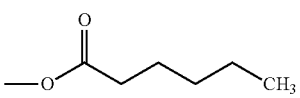 | 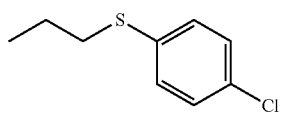 |
| K-27 | 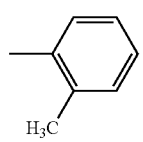 | 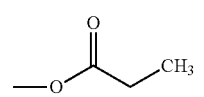 | 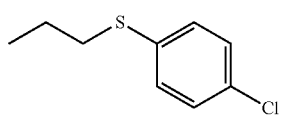 |
| K-28 | 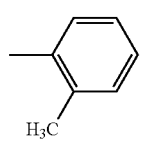 | 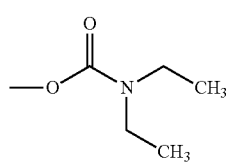 | 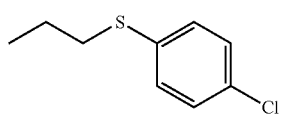 |
| K-29 | 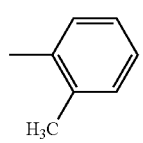 | 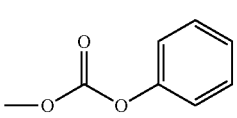 | 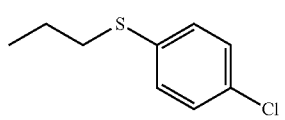 |
| K-30 | 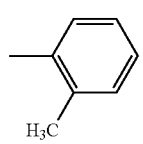 | 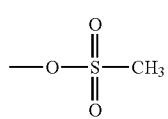 | 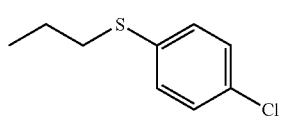 |
| K-31 | 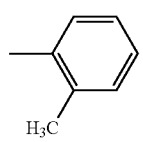 | 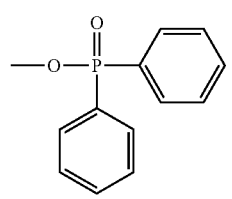 [SMILES: COP(=O)(c1ccccc1)c1ccccc1] | 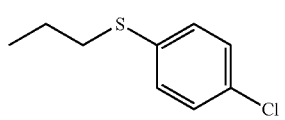 |
| K-32 | 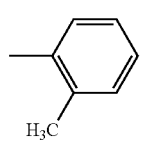 | 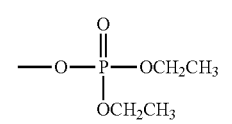 | 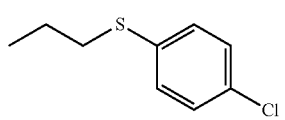 |

-continued
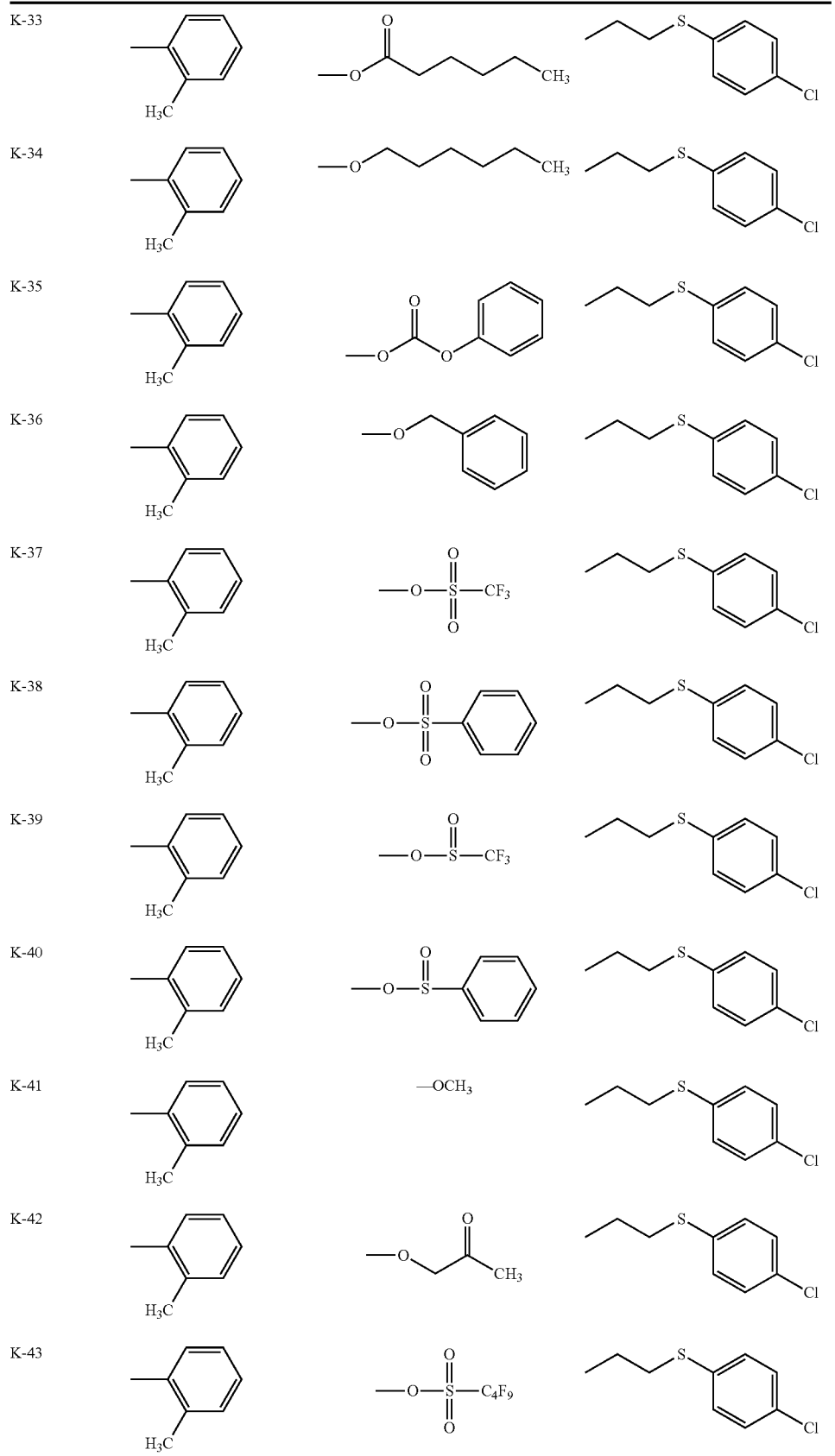

-continued
| | | | |
|---|---|---|---|
| K-44 | 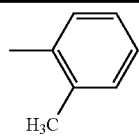 | 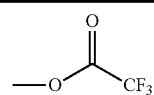 | 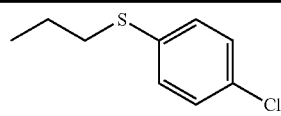 |
| K-45 | 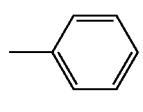 | 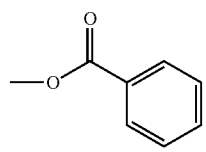 | 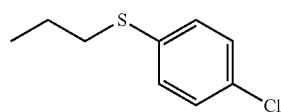 |
| K-46 | 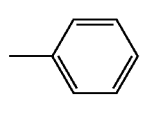 | 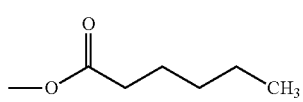 | 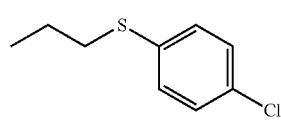 |
| K-47 | 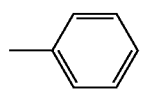 | 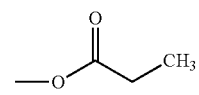 | 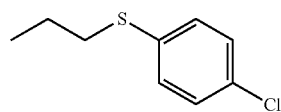 |
| K-48 | 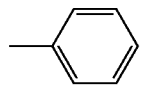 | 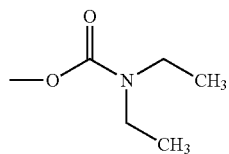 | 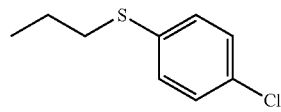 |
| K-49 | 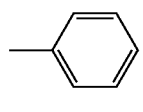 | 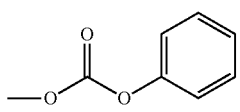 | 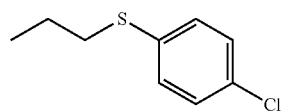 |
| K-50 | 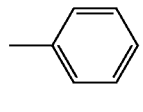 | 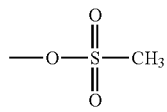 | 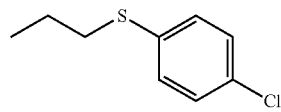 |
| K-51 | 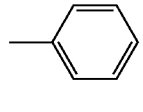 | 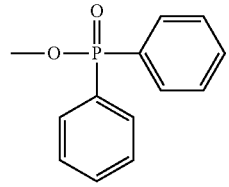 [SMILES: COP(=O)(c1ccccc1)c1ccccc1] | 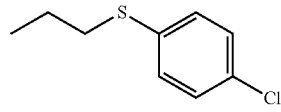 |
| K-52 | 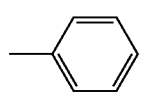 | 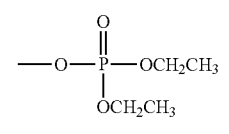 | 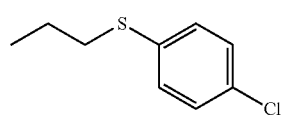 |
| K-53 | 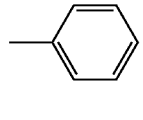 | 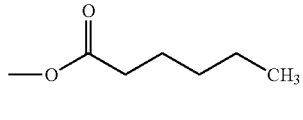 | 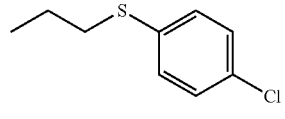 |
| K-54 | 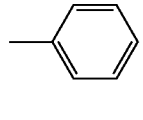 | 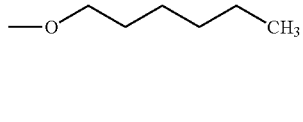 | 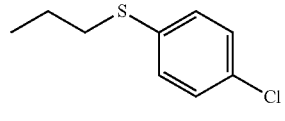 |
| K-55 | 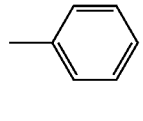 | 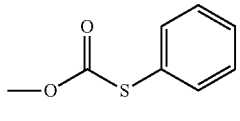 | 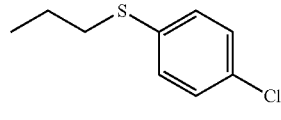 |

-continued
| | | | |
|---|---|---|---|
| K-56 | 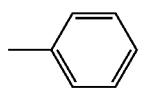 | 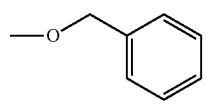 | 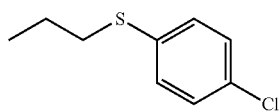 |
| K-57 | 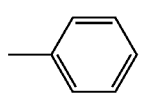 | 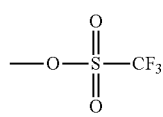 | 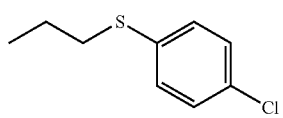 |
| K-58 | 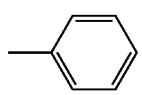 | 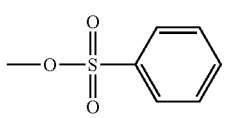 | 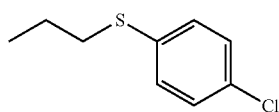 |
| K-59 | 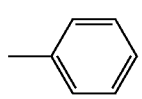 | 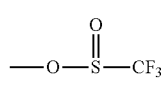 | 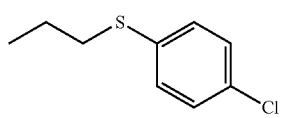 |
| K-60 | 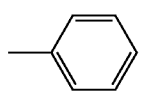 | 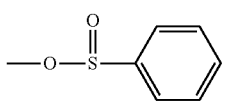 | 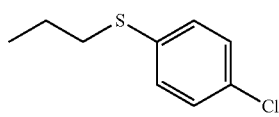 |
| K-61 | 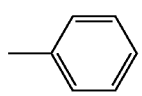 | —OCH$_3$ | 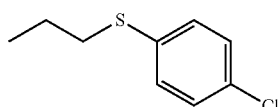 |
| K-62 | 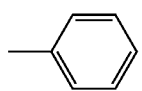 | 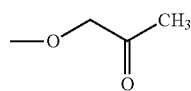 | 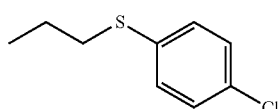 |
| K-63 | 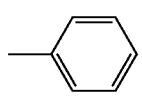 | 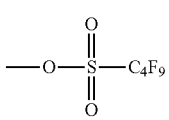 | 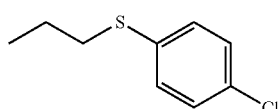 |
| K-64 | 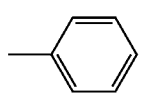 | 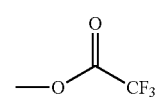 | 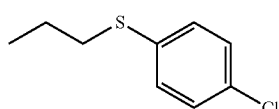 |
K-65
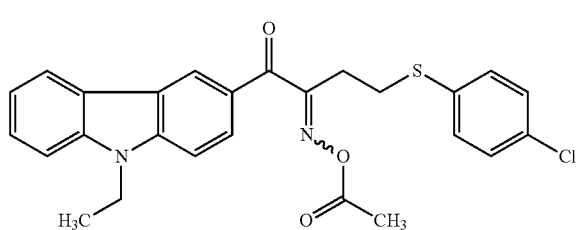 [SMILES: CCn1c2ccccc2c2cc(C(=O)C(CCSc3ccc(Cl)cc3)=NOC(C)=O)ccc21]
K-66
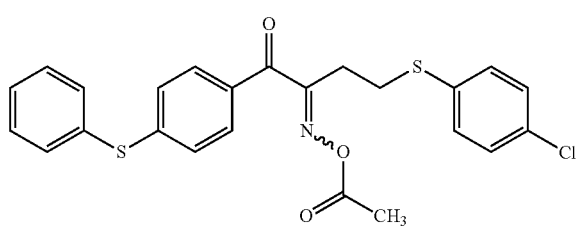 [SMILES: CC(=O)ON=C(CCSc1ccc(Cl)cc1)C(=O)c1ccc(Sc2ccccc2)cc1]

-continued
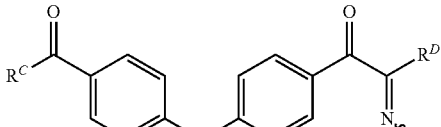
(5)
| | —$R^C$ | —OR | —$R^D$ |
|---|---|---|---|
| K-67 | 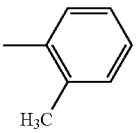 | 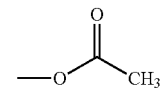 | 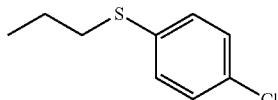 |
| K-68 | 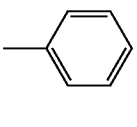 | 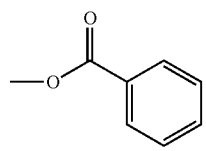 | 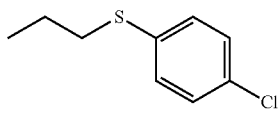 |
| K-69 | 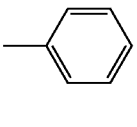 | 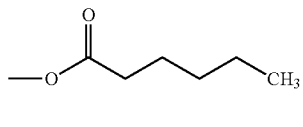 | 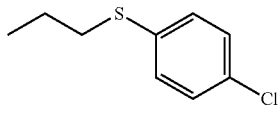 |
| K-70 | 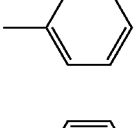 | 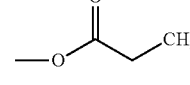 | 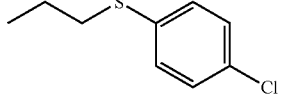 |
| K-71 | 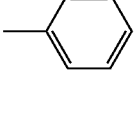 | 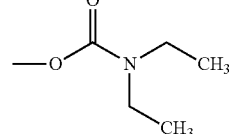 | 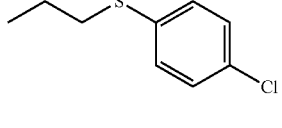 |
| K-72 | 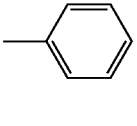 | 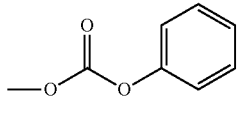 | 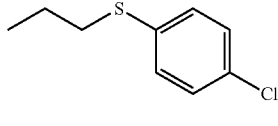 |
| K-73 | 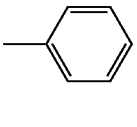 | 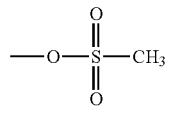 | 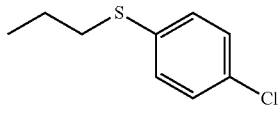 |
| K-74 | 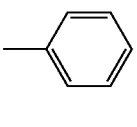 | 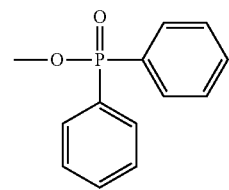 | 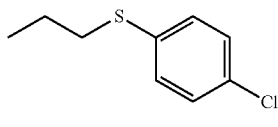 |
| K-75 | 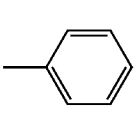 | 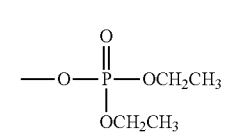 | 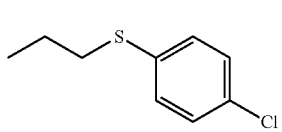 |
| K-76 | 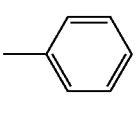 | 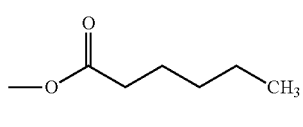 | 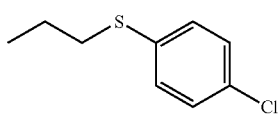 |

-continued
| | | | |
|---|---|---|---|
| K-77 | 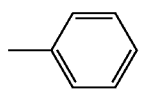 | 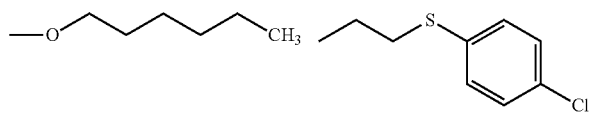 | 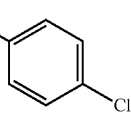 |
| K-78 | 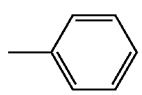 | 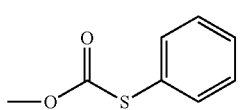 | 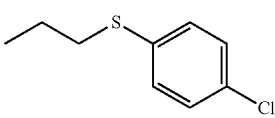 |
| K-79 | 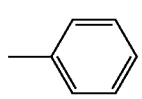 | 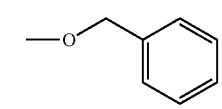 | 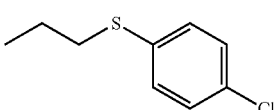 |
| K-80 | 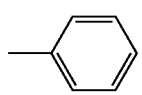 | 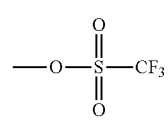 | 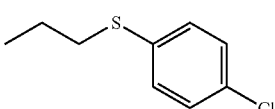 |
| K-81 | 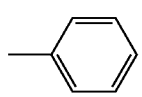 | 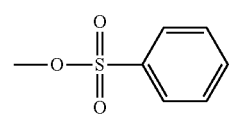 | 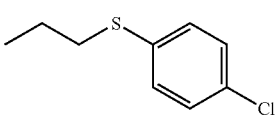 |
| K-82 | 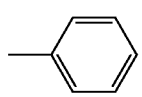 | 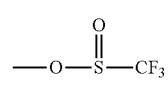 | 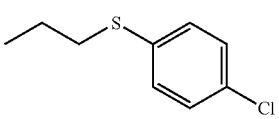 |
| K-83 | 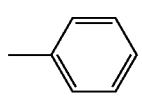 | 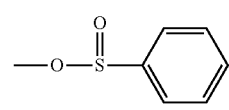 | 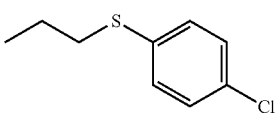 |
| K-84 | 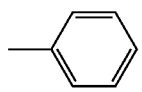 |  —OCH$_3$ | 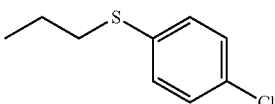 |
| K-85 | 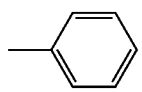 | 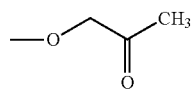 | 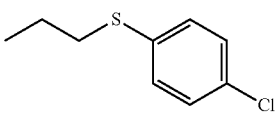 |
| K-86 | 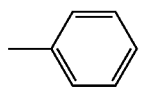 | 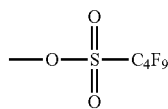 | 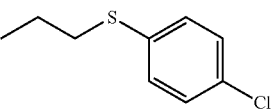 |
| K-87 | 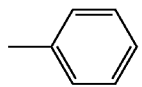 | 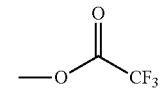 | 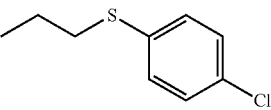 |

K-88

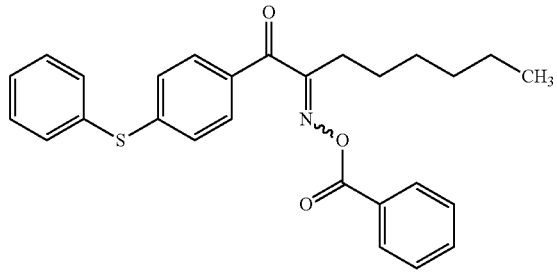 [SMILES: CCCCCCC(=NOC(=O)c1ccccc1)C(=O)c1ccc(Sc2ccccc2)cc1]

The specific oxime compound according to the first or second aspect of the invention has a maximum absorption wavelength in a wavelength region of from 350 nm to 500 nm, preferably has an absorption wavelength in a wavelength region of from 360 nm to 480 nm, and particularly preferably has a high absorbance at from 365 nm and 455 nm. In particular, the specific oxime compound has absorption in a longer wavelength region as compared to a conventional oxime compound, and therefore, when exposure is carried out using a light source at 365 nm or 405 nm, excellent sensitivity is exhibited.

From the viewpoint of sensitivity, the specific oxime compound according to the first or second aspect of the invention preferably has a molar extinction coefficient at 365 nm or 405 nm of 10,000 to 300,000, more preferably 15,000 to 300,000, and particularly preferably 20,000 to 200,000.

In the first and second aspects of the invention, the molar extinction coefficient of a compound may be measured by a known method, and specifically it is preferable to carry out measurement using, for example, an ethyl acetate solvent at a concentration of 0.01 g/L with a UV-visible light spectrophotometer (trade name: CARRY-5 SPECTROPHOTOMETER, manufactured by Varian).

Examples of the hexaarylbiimidazole compound include various compounds as described in Japanese Examined Patent Application Publication (JP-B) No. 6-29285, U.S. Pat. Nos. 3,479,185, 4,311,783, 4,622,286, and the like, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

The content of (C) a polymerization initiator in the black curable composition according to the first or second aspect of the invention is preferably in the range of from 0.1% by mass to 30% by mass, more preferably from 1% by mass to 25% by mass, and particularly preferably from 2% by mass to 20% by mass, based on the total solid content of the black curable composition. Only one kind of the polymerization initiator may be used alone, or a combination of two or more kinds thereof may be used.

In the black curable composition according to the first or second aspect of the invention, a chain transfer agent is preferably added depending on the polymerization initiator to be used. The chain transfer agent may be a N,N-dialkylamino benzoic alkyl ester or a thiol compound. Examples of the thiol compound include 2-mercaptobenzothiazole, 2-mercapto-1-phenylbenzimidazole, and 3-mercaptopropionic acid, and these may be used alone or in a combination of two or more kinds thereof. In particular, a combination of a hexaarylbiimidazole compound and a thiol compound is preferably used from the viewpoints of residues and adhesion.

(D) Polymerizable Compound

The black curable composition according to the first or second aspect of the invention further contains (D) a polymerizable compound.

The polymerizable compound is preferably a compound having at least one addition-polymerizable ethylenically unsaturated group and having a boiling point of 100° C. or higher at normal pressure.

Examples of the compound having at least one addition-polymerizable ethylenically unsaturated group and having a boiling point of 100° C. or higher at a normal pressure include: a monofunctional acrylate or methacrylate such as polyethylene glycol mono(meth)acrylate, polypropylene glycol mono(meth)acrylate or phenoxyethyl (meth)acrylate; and a polyfunctional acrylate or methacrylate such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol (meth)acrylate, trimethylolpropane tri(acryloyloxypropyl)ether, tri(acryloyloxyethyl) isocyanurate, a compound obtained by adding ethylene oxide or propylene oxide to a polyfunctional alcohol such as glycerin or trimethylolethane and successively (meth)acrylating the same, a poly(meth)acrylation product of pentaerythritol or dipentaerythritol, urethane acrylates as described in JP-B Nos. 48-41708 and 50-6034 and JP-A No. 51-37193, polyester acrylates as described in JP-A No. 48-64183 and JP-B Nos. 49-43191 and 52-30490, and epoxy acrylates which are reaction products of an epoxy resin and a (meth)acrylic acid.

Furthermore, other examples thereof also include the compounds disclosed as a photocurable monomer or oligomer in Journal of Japan Adhesive Society, Vol. 20, No. 7, pp 300-308.

Further, the compounds obtained by adding ethylene oxide or propylene oxide to the polyfunctional alcohol and then (meth)acrylating the same, described together with the specific examples thereof as the formulae (1) and (2) in JP-A No. 10-62986, may also be used as the polymerizable compound.

Among these, the polymerizable compound is preferably dipentaerythritol penta(meth)acrylate, dipentaerythritol hexa(meth)acrylate, or a compound having a structure in which a (meth)acryloyl group of dipentaerythritol penta(meth)acrylate or dipentaerythritol hexa(meth)acrylate is present via an ethylene glycol or propylene glycol residue. An oligomer of such a compound may also be used.

Preferable examples of the polymerizable compound include urethane acrylates, such as those described in JP-B No. 48-41708, JP-A No. 51-37193, JP-B No. 2-32293, JP-B No. 2-16765, and urethane compounds having an ethylene oxide skeleton, as described in JP-B No. 58-49860, JP-B No. 56-17654, JP-B No. 62-39417, and JP-B No. 62-39418. Further, a curable composition having an extremely excellent photosensitization speed may be obtained by using addition-polymerizable compounds having an amino structure or a sulfide structure in the molecule thereof, as described in JP-A No. 63-277653, JP-A No. 63-260909 or JP-A No. 1-105238, as the polymerizable compound.

Examples of commercial products of the polymerizable compound include urethane oligomers UAS-10, UAB-140 (all trade names, manufactured by Nippon Paper Chemicals Co., Ltd.), UA-7200 (trade name, manufactured by Shin Nakamura Chemical Co., Ltd.), DPHA-40H (trade name, manufactured by Nippon Kayaku Co., Ltd.), and UA-306H, UA-306T, UA-306I, AH-600, T-600, AI-600 (all trade names, manufactured by Kyoeisha Co., Ltd.).

Further, ethylenically unsaturated compounds having an acid group are also preferable as the polymerizable compound, and examples of commercial products thereof include TO-756 that is a carboxyl group-containing tri-functional acrylate and TO-1382 that is a carboxyl group-containing penta-functional acrylate (all trade names, manufactured by Toagosei Co., Ltd.).

The polymerizable compound used in the present invention is more preferably an acrylate compound having functionality of 4 or higher.

In the first aspect, only one kind of the polymerizable compound may be used alone, or a combination of two or more kinds thereof may be used.

In the first aspect, the content of the polymerizable compound in the black curable composition is preferably in the range of from 3 parts by mass to 55 parts by mass, and more preferably from 10 parts by mass to 50 parts by mass, based on the total solid content of 100 parts by mass of the black curable composition. When the content of (D) the polymerizable compound is within the above ranges, a curing reaction proceeds sufficiently.

In the second aspect, only one kind of the polymerizable compound may be used alone, or a combination of two or more kind thereof may be used. A preferable example of the combination is a combination of two monomers having a different polymerizable group. A combination of a monomer having 4 or less polymerizable groups and a monomer having 5 or more polymerizable groups is more preferable from the viewpoints of developability and adhesion.

In the second aspect, the content of the polymerizable compound in the black curable composition is preferably in the range of from 3 parts by mass to 55 parts by mass, and more preferably from 10 parts by mass to 50 parts by mass, based on the total solid content of 100 parts by mass of the black curable composition. When the content of (D) the polymerizable compound is within the above ranges, a curing reaction proceeds sufficiently.

(E) Alkali-Soluble Resin Having Unsaturated Double Bond: Specific Alkali-Soluble Resin The black curable composition according to the first or second aspect of the invention further contains an alkali-soluble resin having an unsaturated double bond (hereinafter, may be referred to as "specific alkali-soluble resin").

The term "alkali-soluble resin" as used herein refers to a resin that has substantially no repeating unit of (b-3) a macromonomer having a weight average molecular weight from 1,000 to 50,000, unlike (B) the specific resin.

The specific alkali-soluble resin is preferably a high-molecular weight compound having, as an unsaturated double bond, a group represented by any one of the following Formula (I) to Formula (III) in a side chain thereof

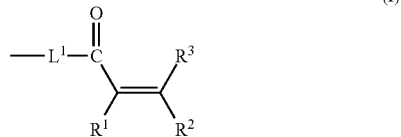

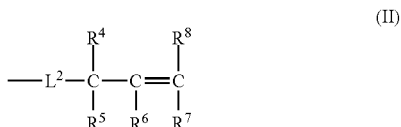

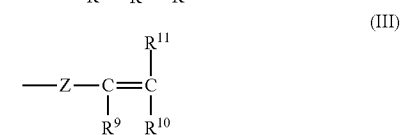

In Formulae (I) to (III), $R^1$ to $R^{11}$ each independently represent a hydrogen atom or a monovalent organic group; $L^1$ and $L^2$ each independently represent an oxygen atom, a sulfur atom, or —N—$R^{12}$; Z represents an oxygen atom, a sulfur atom, —N—$R^{12}$ or a phenylene group; and $R^{12}$ represents a hydrogen atom, or a monovalent organic group.

In Formula (I), $R^1$ to $R^3$ each independently represent a hydrogen atom or a monovalent organic group. Examples of $R^1$ include a hydrogen atom, a substituted or unsubstituted alkyl group, a substituted or unsubstituted alkoxy group, and a substituted or unsubstituted alkoxycarbonyl group. In particular, a hydrogen atom, a methyl group, a methylalkoxy group, or a methylester group is preferable. $R^2$ and $R^3$ each independently represent a hydrogen atom, a halogen atom, an amino group, a dialkylamino group, a carboxyl group, an alkoxycarbonyl group, a sulfo group, a nitro group, a cyano group, an substituted or unsubstituted alkyl group, a substituted or unsubstituted aryl group, a substituted or unsubstituted alkoxy group, a substituted or unsubstituted aryloxy group, a substituted or unsubstituted alkylamino group, a substituted or unsubstituted arylamino group, a substituted or unsubstituted alkylsulfonyl group, and a substituted or unsubstituted arylsulfonyl group. In particular, a hydrogen atom, a carboxyl group, an alkoxycarbonyl group, a substituted or unsubstituted alkyl group, or a substituted or unsubstituted aryl group is preferable.

Here, examples of the substituent capable of being introduced into the monovalent organic group include a methoxycarbonyl group, an ethoxycarbonyl group, an isopropyloxycarbonyl group, a methyl group, an ethyl group, and a phenyl group.

$L^1$ represents an oxygen atom, a sulfur atom, or —N—$R^{12}$, wherein examples of $R^{12}$ include a hydrogen atom, and a substituted or unsubstituted alkyl group.

The alkyl group represented by any one of $R^1$ to $R^3$ in Formula (I) is a linear or cyclic alkyl group having 1 to 30 carbon atoms, preferably an alkyl group having 1 to 20 carbon atoms, and particularly preferably an alkyl group having 1 to 10 carbon atoms.

The aryl group represented by any one of $R^1$ to $R^3$ in Formula (I) is an aryl group having 6 to 30 carbon atoms, preferably an aryl group having 6 to 20 carbon atoms, and particularly preferably an aryl group having 6 to 10 carbon atoms.

In Formula (II), $R^4$ to $R^8$ each independently represent a hydrogen atom or a monovalent organic group. Examples of $R^4$ to $R^8$ include a hydrogen atom, a halogen atom, an amino group, a dialkylamino group, a carboxyl group, an alkoxycarbonyl group, a sulfo group, a nitro group, a cyano group, a substituted or unsubstituted alkyl group, a substituted or unsubstituted aryl group, a substituted or unsubstituted alkoxy group, a substituted or unsubstituted aryloxy group, a substituted or unsubstituted alkylamino group, a substituted or unsubstituted arylamino group, a substituted or unsubstituted alkylsulfonyl group, and a substituted or unsubstituted arylsulfonyl group. In particular, a hydrogen atom, a carboxyl group, an alkoxycarbonyl group, a substituted or unsubstituted alkyl group, or a substituted or unsubstituted aryl group is preferable. Examples of the substituent capable of being introduced into the monovalent organic group include those described for Formula (I). $L^2$ represents an oxygen atom, a sulfur atom, or —N—$R^{12}$, wherein examples of $R^{12}$ include the same as those described for Formula (I). In $R^4$ to $R^8$ of Formula (II), an alkyl group and an aryl group have the same definitions as those in Formula (I), and preferable examples are also the same.

In Formula (III), $R^9$ to $R^{11}$ each independently represent a hydrogen atom or a monovalent organic group. Specific example of the organic group include a halogen atom, an amino group, a dialkylamino group, a carboxyl group, an alkoxycarbonyl group, a sulfo group, a nitro group, a cyano group, a substituted or unsubstituted alkyl group, a substituted or unsubstituted aryl group, a substituted or unsubstituted alkoxy group, a substituted or unsubstituted aryloxy group, a substituted or unsubstituted alkylamino group, a substituted or unsubstituted arylamino group, a substituted or unsubstituted alkylsulfonyl group, and a substituted or unsubstituted arylsulfonyl group. In particular, a hydrogen atom, a carboxyl group, an alkoxycarbonyl group, a substituted or unsubstituted alkyl group, or a substituted or unsubstituted aryl group is preferable.

Here, examples of the substituent capable of being introduced into the monovalent organic group include the same as those described for Formula (I).

In Formula (III), Z represents an oxygen atom, a sulfur atom, —N—$R^{12}$ or a phenylene group, wherein examples of $R^{12}$ include the same as those described for Formula (I).

An alkyl group and an aryl group represented by any one of $R^9$ to $R^{11}$ in Formula (III) have the same definitions as those described for Formula (I), and preferable examples thereof are also the same.

As the unsaturated double bond, Formula (I) out of Formulae (I) to (III) is preferable from the viewpoint of curing property. Formula (I) wherein $R^1$ represents a methyl group or a hydrogen atom, $R^2$ represents a hydrogen atom and $R^3$ represents a hydrogen atom is most preferable.

The specific alkali-soluble resin according to the present invention may be produced by at least one of the following synthesis methods of (a) to (e):

(a) a method of synthesizing an alkali-soluble resin by reacting a polymer having an acid group with a compound having both an epoxy group and an unsaturated double bond in the molecule;

(b) a method of synthesizing an alkali-soluble resin by polymerizing a monomer having an acid group with a monomer having at least two unsaturated double bonds in the molecule;

(c) a method of synthesizing an alkali-soluble resin by reacting a polymer having an acid group and a hydroxyl group in the side chain with a compound having both an isocyanate group and an unsaturated double bond in the molecule;

(d) a method of synthesizing an alkali-soluble resin by reacting a polymer having an acid group and an epoxy group in the side chain with a compound having both an acid group and an unsaturated double bond in the molecule; and (e) a method of synthesizing an alkali-soluble resin by reacting a polymer having an acid group and an isocyanate group in the side chain with a compound having both a hydroxyl group and an unsaturated double bond in the molecule.

Hereinafter, the synthesis procedures are described in detail.

(a) Method of Synthesizing Alkali-Soluble Resin by Reacting Polymer Having Acid Group with Compound Having Both Epoxy Group and Unsaturated Double Bond in Molecule In the first or second aspect of the invention, the polymer having an acid group is an organic high-molecular weight polymer having an acid group in the main chain or in a side chain thereof, in particular, preferably a copolymer of an acid group-containing monomer and another copolymerizable monomer. Examples of the acid group-containing monomer include: a carboxyl group-containing monomer such as (meth)acrylic acid, crotonic acid, α-chloroacrylic acid, α-trifluoromethylacrylic acid, α-hydroxymethylacrylic acid, α-chloromethylacrylic acid, cinnamic acid, styrene carboxylic acid, maleic acid, a maleic anhydride, fumaric acid, itaconic acid, an itaconic anhydride, citraconic acid, a citraconic anhydride, mesaconic acid, mono[2-(meth)acryloyloxyethyl]succinate, mono[2-(meth)acryloyloxyethyl]phthalate, mono[2-(meth)acryloyloxyethyl]-1,2-cyclohexane dicarboxylate, or ω-carboxypolycaprolactone mono(meth)acrylate; a phosphate group-containing monomer such as acid phosphooxyethyl (meth)acrylate, acid phosphooxypolyoxyethylene glycol mono(meth)acrylate, acid phosphooxypolyoxypropylene glycol mono(meth)acrylate, 3-chloro-2-acid phosphooxypropyl(meth)acrylate, or vinyl phosphonic acid; and a sulfonate group-containing monomer such as 2-acrylamide-2-methylsulfonic acid, vinyl sulfonic acid, or vinyl styrenesulfonic acid. In particular, a carboxyl group-containing monomer is preferable, (meth)acrylic acid, styrene carboxylic acid, mono[2-(meth)acryloyloxyethyl]succinate, mono[2-(meth)acryloyloxyethyl]phthalate, mono[2-(meth)acryloyloxyethyl]-1,2-cyclohexane dicarboxylate, or co-carboxypolycaprolactone mono(meth)acrylate is more preferable, and (meth)acrylic acid is most preferable.

Only one type of the acid group-containing monomers may be used alone, or a combination of two or more types thereof may be used.

Examples of other copolymerizable monomer include: an aliphatic or aromatic (meth)acrylate such as methyl(meth)acrylate, ethyl(meth)acrylate, n-propyl(meth)acrylate, i-propyl(meth)acrylate, n-butyl(meth)acrylate, i-butyl(meth)acrylate, sec-butyl(meth)acrylate, t-butyl(meth)acrylate, 2-ethylhexyl(meth)acrylate, allyl(meth)acrylate, benzyl (meth)acrylate, cyclohexyl(meth)acrylate, phenyl(meth)acrylate, naphthyl (meth)acrylate, anthracenyl(meth)acrylate, piperonyl (meth)acrylate, salicyl (meth)acrylate, furyl (meth)acrylate, furfuryl (meth)acrylate, phenetyl (meth) acrylate, 1,1,1-trifluoroethyl (meth)acrylate, 2-methoxyethyl (meth)acrylate, 2-phenoxyethyl (meth)acrylate, methoxydiethylene glycol (meth)acrylate, methoxytriethylene glycol (meth)acrylate, methoxypropylene glycol (meth)acrylate, methoxydipropylene glycol (meth)acrylate, isobornyl (meth)acrylate, tricyclo[5.2.1.0$^{2,6}$]decan-8-yl (meth)acrylate, 2-hydroxy-3-phenoxypropyl (meth)acrylate, glycerol mono (meth)acrylate, 4-hydroxyphenyl (meth)acrylate, or ethylene oxide-modified (meth)acrylate of para-cumyl phenol; an epoxy group-containing (meth)acrylate such as glicydyl (meth)acrylate, 3,4-epoxybutyl (meth)acrylate, (3,4-epoxycyclohexyl)methyl (meth)acrylate, or 4-hydroxybutyl (meth)acrylate glicydyl ether; a hydroxyl group-containing (meth) acrylate such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, or 4-hydroxybutyl (meth)acrylate; an isocyanate group-containing (meth)acrylate such as isocyanatoethyl (meth)acrylate or 2-(2-isocyanatoethoxy)ethyl (meth) acrylate; an ether dimer-type (meth)acrylate such as dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, or dibenzyl-2,2'-[oxybis(methylene)]bis-2-propenoate; a (meth) acrylic acid amide such as N,N-dimethylamide (meth) acrylate, N,N-diethylamide (meth)acrylate, or isopropylamide (meth)acrylate; a carboxylic acid vinyl ester such as vinyl acetate, vinyl propionate, vinyl butyrate, or vinyl benzoate; an unsaturated ether such as vinyl methyl ether, vinyl ethyl ether, or allyl glicydyl ether; a vinyl cyanide compound such as (meth)acrylonitrile, α-chloroacrylonitrile, or vinylidene cyanide; an unsaturated amide such as (meth) acrylamide, α-chloroacrylamide, N-2-hydroxyethyl (meth) acrylamide, or N-vinyl pyrrolidone; an aliphatic conjugated diene such as 1,3-butadiene, isoprene, or chloroprene; an aromatic vinyl compound such as styrene, α-methylstyrene, o-vinyltoluene, m-vinyltoluene, p-vinyltoluene, p-chlorostyrene, o-methoxystyrene, m-methoxystyrene, p-methoxystyrene, o-vinylphenol, m-vinylphenol, p-vinylphenol, p-hydroxy-α-methylstyrene, o-vinylbenzylmethyl ether, m-vinylbenzylmethyl ether, p-vinylbenzylmethyl ether, o-vinylbenzyl glicydyl ether, m-vinylbenzyl glicydyl ether, or p-vinylbenzyl glicydyl ether; and a monomaleimide compound such as N-phenyl maleimide, N-cyclohexyl maleimide, N-lauryl maleimide, or N-(4-hydroxyphenyl) maleimide.

As the copolymerizable monomer, a (meth)acrylic acid monomer or an aromatic vinyl compound is preferable, and alkyl(meth)acrylate containing an alkyl group having 1 to 10 carbon atoms, benzyl (meth)acrylate or styrene is most preferable.

Other copolymerizable monomers may be used alone or in a combination of two or more kinds thereof.

The polymer having an acid group may be produced by a known radical polymerization method. When the polymer is produced by a radical polymerization method, polymerization conditions such as temperature, pressure, the type and amount of radical initiators, and the type of solvents can be easily set by those skilled in the art, and condition setting is possible.

The specific alkali-soluble resin may be produced by reacting the polymer having an acid group with the compound having both an epoxy group and an unsaturated double bond in the molecule.

The compound having both an epoxy group and an unsaturated double bond in the molecule may be a known compound, and examples thereof include glicydyl (meth)acrylate, 3,4-epoxybutyl (meth)acrylate, (3,4-epoxycyclohexyl)methyl (meth)acrylate, and 4-hydroxybutyl (meth)acrylate glicydyl ether. In particular, glicydyl (meth)acrylate is preferable.

It is preferable to accelerate the reaction between the polymer having an acid group and the compound having both an epoxy group and an unsaturated double bond in the molecule by adding a catalyst. The catalyst may be a known catalyst, and for example, a tertiary amino group or triphenyl phosphine is preferable. The content of the catalyst is preferably in the range of 0.1% by mass to 2% by mass, based on the solid content of the specific alkali-soluble resin to be synthesized. Although the reaction temperature may be appropriately set, the reaction may be carried out typically at a temperature of 80° C. to 120° C.

Further, a cyclic acid anhydride may be added to the hydroxyl group resulting from the reaction of the polymer having an acid group with the compound having both an epoxy group and an unsaturated double bond in the molecule. Examples of the cyclic acid anhydride include a dibasic acid anhydride such as maleic anhydride, succinic anhydride, itaconic anhydride, phthalic anhydride, tetrahydrophthalic anhydride, hexahydrophthalic anhydride, or chlorendic anhydride; and an anhydride of tribasic or higher-basic acid such as trimellitic anhydride, pyromellitic anhydride, benzophenone tetracarboxylic anhydride, or biphenyltetracarboxylic anhydride. Among these, tetrahydrophthalic anhydride and/or succinic anhydride are preferable. These polybasic acid anhydrides may be used alone or in a combination of two or more kinds thereof.

By the addition of such a component, alkali solubility is imparted to a binder resin used in the present invention.

Such a polybasic acid anhydride is typically added to 10 mol % to 100 mol % of the hydroxyl group resulting from the addition of an unsaturated monobasic acid to an epoxy group of the copolymer, preferably 20 mol % to 90 mol %, and more preferably 30 mol % to 80 mol %. When the addition portion is excessively high, a ratio of residual film during development may be decreased. When the addition portion is excessively low, the solubility may be poor. Addition of a polybasic acid anhydride to the hydroxyl group may be carried out using a known method.

In order to improve sensitivity, after addition of the polybasic acid anhydride, a glicydyl ether compound having a glicydyl (meth)acrylate or polymerizable unsaturated group may be added to a portion of the resulting carboxyl groups.

(b) Method of Synthesizing Alkali-Soluble Resin by Polymerizing Monomer Having Acid Group with Monomer Having at Least Two or More Unsaturated Double Bonds in Molecule In the first or second aspect of the invention, a specific alkali resin may be synthesized by copolymerizing the acid group-containing monomer, which is the same as the acid group-containing monomer described in Method (a), and a monomer having at least two or more unsaturated double bonds in the molecule. A (meth)acrylic monomer having an aliphatic alkenyl group such as allyl group or homoallyl group or an aliphatic cycloalkenyl group such as cyclohexenyl or cyclododecenyl group is preferable, and allyl (meth) acrylate is more preferable.

Examples of copolymerizable component other than the monomer having an acid group and the monomer having at least two or more unsaturated double bonds in the molecule include those described for the other copolymerizable monomers used in Method (a) above, and preferable examples thereof are also the same.

(c) Method of Synthesizing Alkali-Soluble Resin by Reacting Polymer Having Acid Group and Hydroxyl Group in Side Chain with Compound Having Both Isocyanate Group and Unsaturated Double Bond in Molecule In the first or second aspect of the invention, the polymer having an acid group and a hydroxyl group in the side chain may be synthesized by copolymerizing the acid group-containing monomer, which is described above in Method (a), and a hydroxyl group-containing (meth)acrylate, using a known method. Examples of the compound having both an isocyanate group and an unsaturated double bond in the molecule include isocyanatoethyl (meth)acrylate, 2-(2-isocyanatoethoxy)ethyl (meth)acrylate, and 1,1-[bis(meth)acryloyloxymethyl]ethyl isocyanate. The reaction of the isocyanate compound with the polymer having an acid group and a hydroxyl group in the side chain may be carried out by using a known urethanization reaction.

(d) Method of Synthesizing Alkali-Soluble Resin by Reacting Polymer Having Acid Group and Epoxy Group in Side Chain with Compound Having Both Acid Group and Unsaturated Double Bond in Molecule In the first or second aspect of the invention, the polymer having an acid group and an epoxy group in the side chain may be synthesized by copolymerizing the acid group-containing monomer, which is described above in Method (a), and an epoxy group-containing (meth)acrylate, using a known method. Examples of the compound having both an acid group and an unsaturated double bond in the molecule include the acid group-containing monomers described above in Method (a). In particular, a carboxyl group-containing monomer is preferable; (meth)acrylic acid, styrene carboxylic acid, mono[2-(meth)acryloyloxyethyl]succinate, mono[2-(meth)acryloyloxyethyl]phthalate, mono[2-(meth)acryloyloxyethyl]-1,2-cyclohexane dicarboxylate, or ω-carboxypolycaprolactone mono(meth)acrylate is more preferable; and (meth)acrylic acid is most preferable. The reaction of the compound having both an acid group and an unsaturated double bond in the molecule and the polymer having an acid group and an epoxy group in the side chain may be carried out using a known method (for example, JP-A No. 2009-53652).

(e) Method of Synthesizing Alkali-Soluble Resin by Reacting Polymer Having Acid Group and Isocyanate Group in Side Chain with Compound Having Both Hydroxyl Group and Unsaturated Double Bond in Molecule In the first or second aspect of the present invention, the polymer having an acid group and an isocyanate group in the side chain may be synthesized by copolymerizing the acid group-containing monomer, which is described above in Method (a), and an isocyanate group-containing (meth)acrylate, using a known method. Examples of the compound having both a hydroxyl group and an unsaturated double bond in the molecule include the hydroxyl group-containing (meth)acrylates described above in Method (a). The reaction of the polymer having an acid group and an isocyanate group in the side chain and the compound having both a hydroxyl group and an unsaturated double bond in the molecule may be carried out by using a known urethanization reaction.

Other than the synthesis methods (a) to (e) as described above, it is possible to use a resin obtained by the reaction of a monomer having an unsaturated double bond and a divalent hydroxyl group and a monomer having two cyclic acid anhydride groups, as described in JP-A No. 2001-354735.

The acid value of the specific alkali-soluble resin used in the first or second aspect of the invention is preferably in the range of from 10 mgKOH/g to 100 mgKOH/g, more preferably from 20 mgKOH/g to 80 mgKOH/g, and most preferably from 30 mgKOH/g to 60 mgKOH/g. When the acid value is within the above ranges, both adhesion of a fine pattern of a solid-state imaging device and developability of the unexposed portion are achieved.

The unsaturated equivalent (i.e., mass of resin per 1 mole of unsaturated double bond) of the specific alkali-soluble resin according to the first or second aspect of the invention is preferably in the range of from 400 to 3,000, and most preferably from 500 to 2,000. When the unsaturated equivalent is within the above ranges, the curing property of a black curable composition is increased, and adhesion of a fine pattern of a solid-state imaging device is improved.

The weight average molecular weight of the specific alkali-soluble resin according to the first or second aspect of the invention is preferably in the range of from 5,000 to 50,000, and more preferably from 7,000 to 20,000. When the weight average molecular weight is within the above ranges, both adhesion of a fine pattern of a solid-state imaging device and developability of the unexposed portion are achieved, and coating property is further improved.

A preferable acid value, unsaturated equivalent or molecular weight of the specific alkali-soluble resin may be controlled by the component ratio of repeating units and polymerization conditions (temperature, polymerization concentration, addition amount of initiator, and the like). From the viewpoint of reaction control, the specific alkali-soluble resin of the present invention is preferably produced by production method (a), (b) or (c), and most preferably produced by production method (a).

Specific examples of the specific alkali-soluble resin are shown hereinafter, but the present invention is not limited thereto.

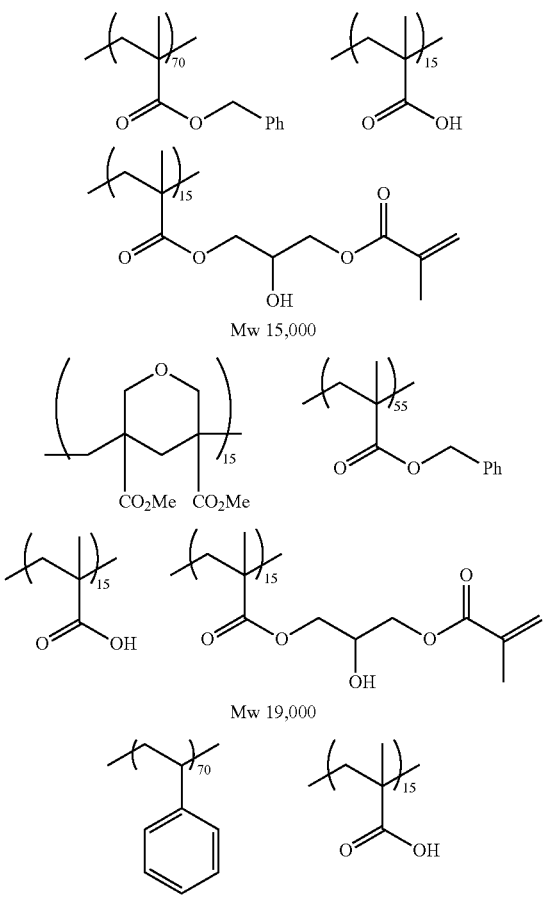

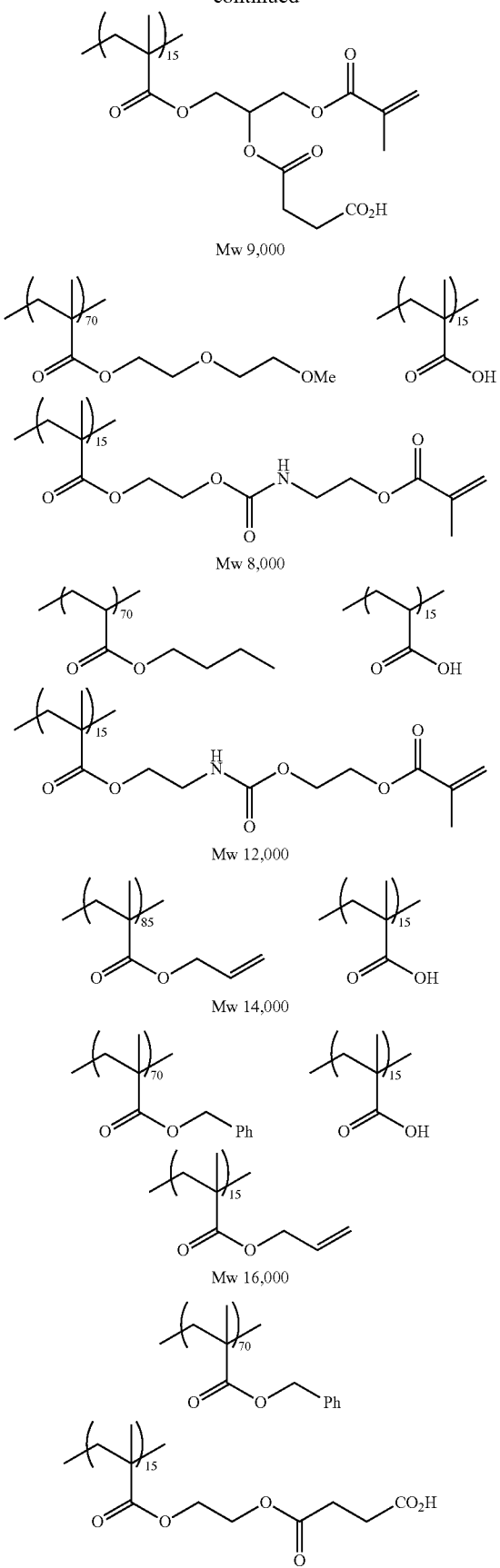

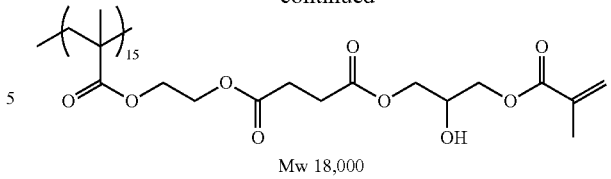

The amount of the specific alkali-soluble resin to be added to the black curable composition according to the first or second aspect of the invention is preferably in the range of from 5% by mass to 50% by mass, and more preferably from 10% by mass to 35% by mass, based on the solid content of the black curable composition. When the content of the specific alkali-soluble resin is within the above ranges, a cured black curable composition has moderate film strength, and solubility during development is easily controlled. Furthermore, it is also preferable in terms of obtaining a coating film having a desired thickness. In particular, a uniform coating film may be formed with regard to spin coating to a large area substrate, so a yield is high. In addition, a good coating film is obtained with a slit coating method. The specific alkali-soluble resin according to the present invention may be added during or after dispersion of an inorganic pigment.

The mass ratio of (E) the specific alkali-soluble resin in the black curable composition according to the first or second aspect of the invention is preferably from 0.3 to 2.5, more preferably from 0.4 to 2.3, and most preferably from 0.5 to 2.0, with respect to (D) the polymerizable compound. In other words, a content of (E) the specific alkali-soluble resin in the black curable composition according to the first or second aspect is preferably from 0.3% by mass to 2.5% by mass, more preferably from 0.4% by mass to 2.3% by mass, and 0.5% by mass to 2.0% by mass. When the content of the specific alkali-soluble resin is within the above ranges, suppression of pattern defect is excellent.

In the black curable composition according to the first or second aspect of the invention, the mass ratio of (B) the specific resin and (E) the specific alkali-soluble resin (i.e., (B) specific resin:(E) specific alkali-soluble resin) is preferably in the range of from 20:80 to 50:50, and most preferably from 25:75 to 40:60. When the mass ratio of (B):(E) is within the above ranges, pattern formability and coating property are excellent.

Other Components

The black curable composition according to the first or second aspect of the invention may further include any other component described below, as required. Details thereof will be described hereinbelow.

Solvent

In production of the black curable composition according to the first or second aspect of the invention, generally a solvent may be used. The solvent to be used is basically not particularly limited as long as the solubility of respective components of the black curable composition or coating property of the black curable composition is satisfied. In particular, the solvent is preferably selected taking into consideration the solubility, coating property and safety of the specific resin, specific alkali-soluble resin, or the like.

Further, a solvent is also preferably used in the production of the pigment dispersion.

Examples of the solvent include solvents as described in paragraph [0272] of JP-A No. 2008-292970. In particular, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, propylene glycol methyl ether acetate or the like is more preferable.

These organic solvents are also preferably used in a combination of two or more thereof, from the viewpoints of solubility of components to be added, coating property of a colored curable composition (e.g., a black curable composition), and the like. The content of the solvent in a dispersion composition is such an amount that the total solid content concentration in the dispersion composition is preferably the range of from 5% by mass to 30% by mass, and more preferably from 10% by mass to 20% by mass. When the content of the solvent is within the above ranges, solubility is maintained favorably.

Colorant

In the black curable composition according to the first or second aspect of the invention, (F) a colorant other than an inorganic pigment, such as an organic pigment or dye, may be used in combination with (A) the inorganic pigment, in order to exhibit desired light shieldability.

Examples of the colorant to be used in combination with the (A) inorganic pigment include organic pigments such as those described in paragraph (0030) to (0044) of JP-A No. 2008-224982, and pigments obtained by changing the Cl substituent of C.I. Pigment Green 58 or C.I. Pigment Blue 79 to OH group. Among these, organic pigments to be preferably used are described below. However, organic pigments to be used in the invention are not limited thereto.

C.I. Pigment Yellow 11, 24, 108, 109, 110, 138, 139, 150, 151, 154, 167, 180, 185, C.I. Pigment Orange 36, C.I. Pigment Red 122, 150, 171, 175, 177, 209, 224, 242, 254, 255, C.I. Pigment Violet 19, 23, 29, 32, C.I. Pigment Blue 15:1, 15:3, 15:6, 16, 22, 60, 66, C.I. Pigment Green 7, 36, 37, 58

C.I. Pigment Black 1, 7

In the present invention, PB7 (carbon black) is regarded as an organic pigment.

There is no particular limitation on a dye that can be used as the colorant, and known dyes may be appropriately selected and used. Examples thereof include dyes described in JP-A No. 64-90403, JP-A No. 64-91102, JP-A No. 1-94301, JP-A No. 6-11614, Japanese Patent No. 2592207, U.S. Pat. No. 4,808,501, U.S. Pat. No. 5,667,920, U.S. Pat. No. 5,059,500, JP-A No. 5-333207, JP-A No. 6-35183, JP-A No. 6-51115, JP-A No. 6-194828, JP-A No. 8-211599, JP-A No. 4-249549, JP-A No. 10-123316, JP-A No. 11-302283, JP-A No. 7-286107, JP-A No. 2001-4823, JP-A No. 8-15522, JP-A No. 8-29771, JP-A No. 8-146215, JP-A No. 11-343437, JP-A No. 8-62416, JP-A No. 2002-14220, JP-A No. 2002-14221, JP-A No. 2002-14222, JP-A No. 2002-14223, JP-A No. 8-302224, JP-A No. 8-73758, JP-A No. 8-179120, and JP-A No. 8-151531.

Examples of the dye include a pyrazole azo dye, an anilino azo dye, a triphenylmethane dye, an antraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, and an indigo dye.

In the first or second aspect of the invention, as a combination of (A) an inorganic pigment and (F) an organic pigment, which is capable of achieving the balance between curing property and light shieldability, a combination of a titanium black which is a preferable example of the inorganic pigment with an organic pigment having an absorption at a wavelength ranging from 400 nm to 600 nm is preferably used, and a combination of titanium black with at least one organic pigment selected from the group consisting of an orange pigment, a red pigment and a violet pigment is more preferable, and a combination of titanium black with a red pigment is most preferable.

In the first aspect, (F) the organic pigment may be dispersed together with an inorganic pigment, followed by making a combination, or otherwise may be dispersed with a dispersant, followed by adding a dispersion to make a combination. As the dispersant used in the production of a dispersion, (B) the specific resin of the present invention may be used or a known pigment dispersant or surfactant as described above may be used. The mass ratio of the pigment dispersant to (F) the organic pigment is preferably in the range of 20% by mass to 80% by mass, more preferably 25% by mass to 70% by mass, and most preferably 30% by mass to 60% by mass.

The black curable composition according to the second aspect of the invention is preferably formed into a pigment dispersion in advance using a specific resin. At this time, dispersibility and dispersion stability may be further improved by adding a dispersant or a pigment derivative in addition to the specific resin.

The dispersant used in the second aspect may be appropriately selected, for example, from known pigment dispersants or surfactants.

Specifically, various kinds of compounds may be used as the dispersant. Specific examples of the dispersant include: a cationic surfactant such as a organosiloxane polymer KP341 (trade name, manufactured by Shin-Etsu Chemical Co., Ltd.), a (meth)acrylate (co)polymer POLYFLOW No. 75, No. 90, No. 95 (all trade names, manufactured by Kyoeisha Chemical Co., Ltd.), or W001 (trade name, manufactured by Yusho Co., Ltd.); a nonionic surfactant such as polyoxyethylene lauryl ether, polyoxyethylene stearyl ether, polyoxyethylene oleyl ether, polyoxyethylene octylphenyl ether, polyoxyethylene nonyl phenyl ether, polyethylene glycol dilaurate, polyethylene glycol distearate, or sorbitan fatty acid ester; an anionic surfactant such as W004, W005 or W017 (all trade names, manufactured by Yusho Co., Ltd.); a polymer dispersant such as EFKA-46, EFKA-47, EFKA-47EA, EFKA POLYMER 100, EFKA POLYMER 400, EFKA POLYMER 401, EFKA POLYMER 450 (all trade names, manufactured by Ciba Specialty Chemicals K.K. Japan), DISPERSE AID 6, DISPERSE AID 8, DISPERSE AID 15, or DISPERSE AID 9100 (all trade names, manufactured by San Nopco Ltd.); various SOLSPERSE dispersants such as SOLSPERSE 3000, 5000, 9000, 12000, 13240, 13940, 17000, 24000, 26000, or 280000 (all trade names, manufactured by Lubrizol Japan Limited); and ADEKA PLURONIC L31, F38, L42, L44, L61, L64, F68, L72, P95, F77, P84, F87, P94, L101, P103, F108, L121, P-123 (all trade names, manufactured by ADEKA Corporation), IONET S-20 (trade name, Sanyo Chemical Industries, Ltd.), and DISPERBYK 101, 103, 106, 108, 109, 111, 112, 116, 130, 140, 142, 162, 163, 164, 166, 167, 170, 171, 174, 176, 180, 182, 2000, 2001, 2050, and 2150 (all trade name, manufactured by BYK Japan K.K.). Other examples of the dispersant include oligomers or polymers having a polar group at a molecular terminal or in a side chain thereof, such as acrylic copolymers.

In the second aspect, the content of the dispersant in the pigment dispersion is preferably in the range of from 1% by mass to 100% by mass, and more preferably from 3% by mass to 70% by mass, based on the total amount of the inorganic pigment and the organic pigment that is an optional component.

Further, a pigment derivative may be optionally added to the pigment dispersion.

By allowing a moiety having affinity with the dispersant or a pigment derivative containing a polar group introduced thereinto to be adsorbed in the pigment surface, and using the same as an adsorption point of the dispersant, it is possible to disperse the pigment as fine particles and thereby to prevent reaggregation thereof. As a result, a pigment dispersion and a black curable composition having excellent dispersion stability are obtained.

The pigment derivative is, specifically, a compound having an organic pigment as a mother skeleton, and a substituent such as an acidic group, a basic group or an aromatic group introduced to a side chain thereof. Specific examples of the organic pigment include a quinacridone pigment, a phthalocyanine pigment, an azo pigment, a quinophthalone pigment, an isoindoline pigment, an isoindolinone pigment, a quinoline pigment, a diketopyrrolopyrrole pigment, and a benzimidazolone pigment. Pale yellow aromatic polycyclic compounds such as a naphthalene compound, an anthraquinone compound, a triazine compound and a quinoline compound, which are generally not called a dye, are also included in the examples. Examples of the pigment derivative that can be used in the invention include those described in JP-A Nos. 11-49974, 11-189732, 10-245501, 2006-265528, 8-295810, 11-199796, 2005-234478, 2003-240938, and 2001-356210.

The content of the pigment derivative according to the second aspect of the invention in the pigment dispersion is preferably in the range of from 1% by mass to 30% by mass, and more preferably from 3% by mass to 20% by mass, based on the mass of the pigment. The content of the pigment derivative within the above ranges enables excellent dispersion of the pigment to be performed, and improvement in dispersion stability after the dispersion, while suppressing the viscosity at a low level.

(G) Sensitizer

The black curable composition according to the first or second aspect of the invention may further contain (G) a sensitizer for the purpose of improvement in radical-generating efficiency of the polymerization initiator and achievement of a long wavelength of the photosensitizing wavelength.

As the sensitizer that can be used in the present invention, one that sensitizes the polymerization initiator used in combination therewith by means of an electron transfer mechanism or an energy transfer mechanism is preferable.

Preferable examples of the sensitizer include compounds described in paragraph numbers (0085) to (0098) of JP-A No. 2008-214395.

From the viewpoints of sensitivity and storage stability, the content of the sensitizer in the black curable composition is preferably in the range of from 0.1% by mass to 30% by mass, more preferably from 1% by mass to 20% by mass, and still more preferably from 2% by mass to 15% by mass, based on the total solid mass of the black curable composition.

(H) Polymerization Inhibitor

A small amount of (H) a polymerization inhibitor is preferably added to the black curable composition according to the first or second aspect of the invention, in order to prevent the unnecessary thermal polymerization of (D) the polymerizable compound during the production or storage of the composition.

A known thermal polymerization inhibitor may be used as the polymerization inhibitor, and specific examples thereof include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene bis(4-methyl-6-t-butylphenol), and N-nitrosophenylhydroxyamine primary cerium salt.

The amount of the thermal polymerization inhibitor to be added is preferably in the range of about 0.01% by mass to about 5% by mass based on the total solid content of the black curable composition.

Optionally, a higher fatty acid derivative such as behenic acid or behenic acid amide may be added such that the higher fatty acid derivative is present on the surface of a coating film after application and drying of the higher fatty acid derivative or the like, in order to prevent the inhibition of polymerization due to oxygen. The addition amount of the higher fatty acid derivative or the like is preferably in the range of about 0.5% by mass to about 10% by mass, based on the total mass of the composition.

(I) Adhesion Promoter

An (I) adhesion promoter may be added to the black curable composition according to the first or second aspect of the invention, in order to improve the adhesion to a light-shielding film and a surface on which the light-shielding film is formed. Examples of the adhesion promoter include a silane coupling agent and a titanium coupling agent.

Examples of the silane coupling agent include γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane. Among these, γ-methacryloxypropyltrimethoxysilane is preferable.

The amount of the adhesion promoter to be added is preferably in the range of from 0.5% by mass to 30% by mass, and more preferably from 0.7% by mass to 20% by mass, based on the total solids content of the black curable composition.

Particularly, when the black curable composition according to the first or second aspect of the present invention is used in the production of a solid-state imaging device on a substrate or in the production of a wafer level lens on a glass substrate, it is preferable to add an adhesion promoter from the viewpoint of improving sensitivity.

(J) Surfactant

The black photosensitive composition according to the first or second aspect of the invention may further contain any one of (J) various surfactants, from the viewpoint of further improving the coating property. Examples of the surfactants that may be used include various surfactants such as a fluorosurfactant, a nonionic surfactant, a cationic surfactant, an anionic surfactant, and a silicone surfactant.

In particular, incorporation of a fluorosurfactant in the black photosensitive composition according to the first or second aspect of the invention further improves the liquid properties (in particular, fluidity) of the composition prepared as a coating liquid, thereby enabling further improvement in the uniformity of the coating thickness and the saving of liquid.

That is, when a film is formed using a coating liquid including a black photosensitive composition containing a fluorosurfactant, the wettability on the surface to be coated is improved due to a decrease in surface tension between the surface to be coated and the coating liquid, whereby the coating property on the surface to be coated is improved. As a result, it is effective to form a uniform-thickness film with less unevenness in thickness, even when a thin film having a thickness of about several μm is formed with a small amount of the liquid.

The fluorine content in the fluorosurfactant is preferably in the range of 3% by mass to 40% by mass, more preferably 5% by mass to 30% by mass, and particularly preferably 7% by mass to 25% by mass. A fluorosurfactant having a fluorine content falling within the above ranges is effective in providing uniformity of the coating film thickness and the saving of liquid, and also exhibits good solubility in the black photosensitive composition.

Examples of the fluorosurfactant include MEGAFAC F171, F172, F173, F176, F177, F141, F142, F143, F144, R30, F437, F479, F482, F780 and F781 (all trade names, manufactured by DIC Corporation), FLUORAD FC430, FC431 and FC171 (all trade names, manufactured by Sumitomo 3M Limited), and SURFLON S-382, SC-101, SC-103, SC-104, SC-105, SC1068, SC-381, SC-383, 5393 and KH-40 (all trade names, manufactured by Asahi Glass Co., Ltd.).

Specific examples of the nonionic surfactant include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester (such as PLURONIC L10, L31, L61, L62, 10R5, 17R2 and 25R2, and TETRONIC 304, 701, 704, 901, 904 and 150R1, all trade names, manufactured by BASF).

Specific examples of the cationic surfactant include a phthalocyanine derivative (e.g., trade name: EFKA-745, manufactured by Morishita & Co., Ltd.), an organosiloxane polymer KP341 (trade name, manufactured by Shin-Etsu Chemical Co., Ltd.), (meth)acrylic acid (co)polymers POLYFLOW No. 75, No. 90 and No. 95 (all trade names, manufactured by Kyoeisha Chemical Co., Ltd.), and W001 (trade name, manufactured by Yusho Co., Ltd.).

Specific examples of the anionic surfactant include W004, W005 and W017 (all trade names, manufactured by Yusho Co., Ltd.).

Examples of the silicone surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA" and "TORAY SILICONE SH8400" (all trade names, manufactured by Dow Corning Toray Co., Ltd.), "TSF-4440", "TSF-4300", "TSF-4445", "TSF-444(4)(5)(6)(7)$_6$", "TSF-44 60" and "TSF-4452" (all trade names, manufactured by Momentive Performance Materials Inc.), "KP341" (trade name, manufactured by Shin-Etsu Chemical Co., Ltd.), and "BYK323" and "BYK330" (all trade names, manufactured by BYK Japan K.K.).

These surfactants may be used alone or in a combination of two or more kinds thereof.

(K) Other Additives

The black curable composition according to the first or second aspect of the invention may further contain a cosensitizer, for the purpose of further improving the sensitivity of a sensitizing pigment or initiator to active radiation rays, or suppressing the polymerization inhibition of a photopolymerizable compound caused by oxygen. Further, a known additive such as a diluent or a plasticizer may be optionally added in order to improve the physical properties of a cured film.

The black curable composition according to the first or second aspect of the invention may be prepared by mixing (A) an inorganic pigment (preferably, as a pigment dispersion composition containing a pigment dispersant), (B) a specific resin, (C) a polymerization initiator, (D) a polymerizable compound, and (E) a specific alkali-soluble resin, and various additives optionally used in combination therewith, in a solvent, and adding, if necessary, an additive such as a surfactant.

According to the above configuration, the black curable composition according to the first aspect of the invention preferably used for forming a light-shielding film of a solid-state imaging device is cured with high sensitivity and is capable of forming a light-shielding film (or a light-shielding pattern) having excellent light shieldability at high accuracy. Further, since the black curable composition according to the first aspect is excellent in developability, residues derived from the black curable composition are reduced in regions other than the forming region of a light-shielding film.

According to the above-mentioned configuration, the black curable composition according to the second aspect of the invention used for forming a wafer level lens is cured with high sensitivity and is capable of forming a light-shielding film (or a light-shielding pattern) having excellent light shieldability at high accuracy. Further, since the black curable composition for a wafer level lens is excellent in developability, residues derived from the black curable composition are reduced in regions other than the forming region of a light-shielding film.

Light-Shielding Color Filter for Solid-State Imaging Device According to the First Aspect and Method of Producing the Same The light-shielding color filter for a solid-state imaging device according to the first aspect of the invention has a pattern formed using the black curable composition according to the first aspect of the invention.

The method of producing a light-shielding color filter for a solid-state imaging device according to the first aspect of the invention includes at least: applying the black curable composition according to the first aspect of the invention onto a support (hereinafter, may be referred to as "black curable composition layer-forming process"); exposing the applied black curable composition layer to light through a mask (hereinafter, may be referred to as "exposure process"); and developing the exposed black curable composition layer to form a pattern (hereinafter, may be referred to as "development process"), in this order.

More specifically, a light-shielding color filter for a solid-state imaging device according to the first aspect of the invention may be produced by: applying the black curable composition according to the first aspect of the invention onto a support (or a substrate) directly or via another layer to form a black curable composition layer (i.e., black curable composition layer-forming process); exposing the formed layer to light through a predetermined mask pattern to cure only the light-irradiated portion of the coating film (i.e., exposure process); and developing the coating film using a developer (i.e., development process), thereby forming a patterned coating film formed of black pixels.

Hereinafter, respective processes of the production method of a light-shielding color filter for a solid-state imaging device according to the first aspect of the invention will be described.

Black Curable Composition Layer-Forming Process

In the black curable composition layer-forming process according to the first aspect, the black curable composition according to the first aspect of the invention is applied on a support by coating, to form a black curable composition layer.

Examples of the support used for the present process include photoelectric conversion device substrates used for solid-state imaging devices or the like (for example, silicon substrates for CCD or CMOS), soda glass, alkali-free glass, PYREX (registered trademark) glass, quartz glass, and those glass materials on which a transparent electroconductive film has been adhered.

Further, an undercoat layer may be optionally formed on the support in order to improve adhesion to an upper layer thereof, prevent diffusion of the materials, or planarize the substrate surface.

The application of the black curable composition according to the first aspect of the invention onto a support may be achieved by various coating methods such as slit coating, an inkjet method, spin coating, cast coating, roll coating, and a screen printing method.

The coating film thickness of the black curable composition is preferably in the range of 0.35 μm to 1.5 μm, and more preferably 0.40 μm to 1.0 μm, in terms of post-drying film thickness, from the viewpoints of resolution and developability.

The black curable composition coated to the support is typically dried at 70° C. to 110° C. for about 2 minutes to 4 minutes, whereby a black curable composition layer is formed.

Exposure Process

In the exposure process according to the first aspect, the black curable composition layer formed in the black curable composition layer-forming process is subjected to patternwise exposure, and as a result, only the light-irradiated portion of the coating film is cured. Although the patternwise exposure may be an exposure method through a mask or scanning exposure, an exposure method through a mask is preferable.

The exposure is preferably carried out by applying a radiation. The radiation useful for the exposure is preferably ultraviolet rays such as g-rays, h-rays or i-rays, particularly preferably i-rays. An i-ray stepper is more preferably used as an exposure apparatus. The irradiation dose is preferably in the range of 5 mJ/cm$^2$ to 1,500 mJ/cm$^2$, more preferably 10 mJ/cm$^2$ to 1,000 mJ/cm$^2$, most preferably 10 mJ/cm$^2$ to 800 mJ/cm$^2$.

Development Process

Subsequent to the exposure process, an alkali development treatment (development process) is carried out. In the development process, a non-irradiated portion in the exposure process is eluted (or removed) in an alkaline aqueous solution, whereby only a portion that has been cured by light irradiation is left.

The developer is preferably an organic alkaline developer which does not damage a circuit or the like of the undercoat. The development temperature is typically in the range of from 20° C. to 30° C., and the development time is in the range of from 20 seconds to 90 seconds.

Examples of an organic alkali agent used in the developer include an organic alkaline compounds such as aqueous ammonia, ethylamine, diethylamine, dimethylethanolamine, tetramethylammonium hydroxide, tetraethylammonium hydroxide, choline, pyrrole, piperidine or 1,8-diazabicyclo-[5,4,0]-7-undecene. An alkaline aqueous solution in which such an alkali agent is diluted with pure water so as to give a concentration of 0.001% by mass to 10% by mass, and preferably 0.01% by mass to 1% by mass is preferably used as the developer. In addition, when a developer made of such an alkaline aqueous solution is used, washing (rinsing) with pure water is generally carried out after development.

Alternatively, an inorganic alkali agent may be used as the developer. Preferable examples of the inorganic alkali agent include sodium hydroxide, potassium hydroxide, sodium carbonate, sodium hydrogen carbonate, sodium silicate, and sodium metasilicate.

The method of producing a light-shielding color filter for a solid-state imaging device according to the first aspect of the invention may optionally include a curing process of curing the formed pattern by heating and/or light exposure thereof, after the black curable composition layer-forming process, exposure process and development process as described above have been carried out.

By carrying out the black curable composition layer-forming process, exposure process and development process (further, optionally a curing process) as described above, a light-shielding color filter for a solid-state imaging device according to the first aspect of the invention may be produced.

In the black curable composition layer-forming process, chromatic color curable composition layers corresponding to RGB (red, green and blue colors) may be formed by using chromatic color curable compositions obtained by changing (A) the inorganic pigment used in the black curable composition to a colorant having a desired hue (for example, a pigment or dye having a chromatic color) (hereinafter, may be referred to as "chromatic color curable composition layer-forming process").

Accordingly, a color filter having a chromatic color pattern of desired hue may be produced, for example, by repeating the chromatic color curable composition layer-forming process, an exposure process and a development process (further, optionally, a curing process) several times according to the number of desired colors, for the resulting light-shielding color filter for a solid-state imaging device.

The black curable composition according to the first aspect of the invention is capable of being easily washed off using a known cleaning liquid, even when the composition is adhered, for example, to a nozzle of an ejecting unit of a coating apparatus, a piping unit of a coating apparatus, inside of a coating apparatus, or the like. In this case, in order to conduct washing off with higher efficiency, the above-mentioned solvent which may be used as the solvent contained in the black curable composition of the invention is preferably used as a cleaning liquid.

Further, cleaning liquids described in JP-A No. 7-128867, JP-A No. 7-146562, JP-A No. 8-278637, JP-A No. 2000-273370, JP-A No. 2006-85140, JP-A No. 2006-291191, JP-A No. 2007-2101, JP-A No. 2007-2102, JP-A No. 2007-281523 and the like may also be preferably used as a cleaning liquid for washing off the black curable composition according to the first aspect of the invention.

As the cleaning liquid, alkylene glycol monoalkyl ether carboxylate or alkylene glycol monoalkyl ether is preferably used.

The solvents utilizable as the cleaning liquid may be used alone or in a combination of two or more kinds thereof.

When two or more kinds of solvents are mixed, a mixed solvent obtained by mixing a solvent having a hydroxyl group and a solvent having no hydroxyl group is preferable. The mass ratio of the solvent having a hydroxyl group to the solvent having no hydroxyl group (i.e., solvent having a hydroxyl group/solvent having no hydroxyl group) is in the range of from 1/99 to 99/1, preferably 10/90 to 90/10, and more preferably 20/80 to 80/20. A mixed solvent of propylene glycol monomethyl ether acetate (PGMEA) and propylene glycol monomethyl ether (PGME) in which the mixing ratio therebetween (i.e., PGMEA/PGME) is 60/40 is particularly preferable as the mixed solvent.

In order to enhance the permeability of the cleaning liquid into the black curable composition, any one of the above-mentioned surfactants which may be included in the black photosensitive composition may be added to the cleaning liquid.

Solid-State Imaging Device According to the First Aspect

The solid-state imaging device according to the first aspect of the invention has at least the light-shielding color filter for a solid-state imaging device according to the first aspect of the invention. Since the light-shielding color filter for a solid-state imaging device according to the first aspect of the invention is formed using the black curable composition according to the first aspect of the invention, the formed pattern exhibits high adhesion to a support substrate, exhibits satisfactory adhesion of the exposed portion to a substrate due to excellent exposure sensitivity because the cured black curable composition is excellent in development resistance, and is capable of forming a high resolution pattern giving a desired sectional shape. Therefore, the color filter according to the first aspect of the invention is preferably used for CCD elements or CMOS of high resolution, which may contain more than one million pixels.

The light-shielding color filter for a solid-state imaging device according to the first aspect of the invention may be used as, for example, a light-shielding color filter for a solid-state imaging device, which is disposed between the photo-receiver of each pixel and a microlens for collecting light, in a CCD.

Furthermore, in addition to the formation of a light-shielding color filter for a solid-state imaging device as described above, the black curable composition for a solid-state imaging device may be preferably used for the formation of a light-shielding film for a solid-state imaging device so as to shield transmitted light from the surface of the other side of a silicon substrate having a solid-state imaging device section on the surface of one side or for the formation of a light-shielding film intended for other applications.

Wafer Level Lens According to the Second Aspect

The wafer level lens according to the second aspect of the invention has at least a light-shielding film formed using the black curable composition according to the second aspect of the invention in the periphery of a lens present on a substrate.

Hereinafter, the wafer level lens according to the second aspect of the invention will be described with reference to the drawings.

FIG. 1 is a plan view showing an exemplary configuration of a wafer level lens array having plural wafer level lenses.

As shown in FIG. 1, the wafer level lens array includes a substrate 10, and lenses 12 disposed on the substrate 10. Here, although FIG. 1 shows a two-dimensional arrangement of plural lenses 12 with respect to the substrate 10, the plural lenses 12 may have a one-dimensional arrangement FIG. 2 is a cross-sectional view of the wafer level lens taken along line A-A shown in FIG. 1.

Figure 2:
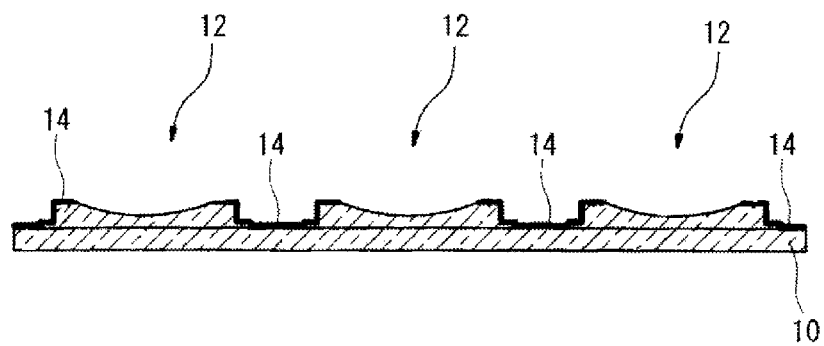
FIG. 2 is a cross-sectional view of a wafer level lens array taken along line A-A in FIG. 1.

As shown in FIG. 2, the wafer level lens array is provided with a light-shielding film 14 which is arranged between the plural lenses 12 disposed on the substrate 10 and prevents light transmission from places other than the lens 12.

The wafer level lens according to the second aspect of the invention includes a lens 12 present on the substrate 10 and a light-shielding film 14 provided in the periphery thereof. The black curable composition according to the second aspect of the invention is used in the formation of the light-shielding film 14.

Hereinafter, illustrated is the configuration of a wafer level lens array having two-dimensional arrangement of plural lenses 12 with respect to the substrate 10 as shown in FIG. 1.

The lens 12 is generally formed from the same material as that of the substrate 10. The lens 12 may be integrally formed on the substrate 10, or may be formed as a separate structure, followed by fixation on the substrate. Even though an example is given here, the wafer level lens of the present invention is not limited to such an embodiment, and may take a variety of embodiments such as a lens having a multi-layer structure, and a lens having a structure separated into lens modules by dicing.

As the material for forming the lens 12, for example, glass may be used. Due to the fact that there are many different kinds of glass and it is possible to select a glass having a high refractive index, glass is preferable as the material of lens which is desired to have high power. Further, glass is excellent in thermal resistance and therefore also has an advantage of withstanding against reflow mounting onto imaging units or the like.

Another material for the formation of lens 12 may be a resin. The resin exhibits excellent processability and is therefore suitable for convenient or inexpensive formation of lens surfaces by means of a mold.

An energy-curable resin is preferably used in the formation of a wafer level lens. The energy-curable resin may be any one of a resin which is thermally curable or a resin which is curable by irradiation of an active energy radiation (for example, heat, ultraviolet rays, or electromagnetic irradiation).

Taking into consideration reflow mounting of the imaging unit, a resin having a relatively high softening point, for example, 200° C. or higher, is preferable, and a resin having a softening point of 250° C. or higher is more preferable.

Hereinafter, the resin preferable as a lens material will be described.

Examples of a UV-curable resin include a UV-curable silicon resin, a UV-curable epoxy resin, and an acrylic resin. The epoxy resin may be a resin having a linear expansion coefficient of 40 $[10^{-6}/K]$ to 80 $[10^{-6}/K]$ and a refractive index of from 1.50 to 1.70, and preferably from 1.50 to 1.65.

Examples of a thermosetting resin include a thermosetting silicon resin, a thermosetting epoxy resin, a thermosetting phenol resin, and a thermosetting acrylic resin. For example, the silicon resin may be one having a linear expansion coefficient of from 30 $[10^{-6}/K]$ to 160 $[10^{-6}/K]$ and a refractive index of from 1.40 to 1.55. The epoxy resin may be one having a linear expansion coefficient of from 40 $[10^{-6}/K]$ to 80 $[10^{-6}/K]$ and a refractive index of from 1.50 to 1.70, and preferably 1.50 to 1.65. The phenol resin may be one having a linear expansion coefficient of from 30 $[10^{-6}/K]$ to 70 $[10^{-6}/K]$ and a refractive index of from 1.50 to 1.70. The acrylic resin may be one having a linear expansion coefficient of from 20 $[10^{-6}/K]$ to 60 $[10^{-6}/K]$ and a refractive index of from 1.40 to 1.60, and preferably from 1.50 to 1.60.

The thermosetting resins may be commercially available products and specific examples thereof include SMX-7852 and SMX-7877 (all trade names, manufactured by Fuji Polymer Industries Co., Ltd.), IVSM-4500 (trade name, manufactured by Toshiba Corporation), and SR-7010 (trade name, manufactured by Dow Corning Toray Co., Ltd.).

Examples of a thermoplastic resin include a polycarbonate resin, a polysulfone resin, and a polyethersulfone resin. The polycarbonate resin may be one having a linear expansion coefficient of from 60 $[10^{-6}/K]$ to 70 $[10^{-6}/K]$ and a refractive index of from 1.40 to 1.70, and preferably from 1.50 to 1.65. The polysulfone resin may be one having a linear expansion coefficient of from 15 $[10^{-6}/K]$ to 60 $[10^{-6}/K]$ and a refractive index of 1.63. The polyethersulfone resin may be one having a linear expansion coefficient of from 20 $[10^{-6}/K]$ to 60 $[10^{-6}/K]$ and a refractive index of 1.65.

Generally, optical glass has a linear expansion coefficient of 4.9 $[10^{-6}/K]$ to 14.3 $[10^{-6}/K]$ at 20° C. and a refractive index of 1.4 to 2.1 at a wavelength of 589.3 nm. In addition, quartz glass has a linear expansion coefficient of 0.1 $[10^{-6}/K]$ to 0.5 $[10^{-6}/K]$ and a refractive index of about 1.45.

From the viewpoint of moldability such as mold shape transferability, a curable resin composition that is applicable to the formation of a lens is preferably one having moderate fluidity before curing thereof. Specifically, it is preferably one that is liquid at room temperature and has a viscosity of about 1,000 mPa·s to 50,000 mPa·s.

Meanwhile, a curable resin composition that is applicable to the formation of a lens is preferably one having a thermal resistance to the extent that no thermal deformation is caused even when subjected to a reflow process after curing is complete. From this viewpoint, a glass transition temperature of the cured product is preferably 200° C. or higher, more preferably 250° C. or higher, and particularly preferably 300° C. or higher. In order to impart such a high thermal resistance to the resin composition, it is necessary to restrain the motility at the molecular level, and examples of an effective means include (1) a means for increasing a cross-linking density per unit volume, (2) a means using a resin having a robust ring structure (for example, a cycloaliphatic structure such as cyclohexane, norbornane, or tetracyclododecane, an aromatic ring structure such as benzene or naphthalene, Cardo structure such as 9,9'-biphenyl fluorene, a resin having a spiro structure such as spirobiindane, specifically, for example, resins as described in JP-A No. 9-137043, JP-A No. 10-67970, JP-A No. 2003-55316, JP-A No. 2007-334018, JP-A No. 2007-238883, or the like), (3) a means for uniform dispersion of high-Tg materials such as inorganic fine particles (for example, as described in JP-A 5-209027, JP-A 10-298265, or the like). These means may be used in combination of a plurality thereof, and are preferably controlled within the scope of not impairing other characteristics such as fluidity, shrinkage rate, and refractive index.

From the viewpoint of shape transfer accuracy, it is preferable to use a curable resin composition that is low in volume shrinkage ratio due to the curing reaction. The curing shrinkage ratio of the resin composition is preferably 10% or less, more preferably 5% or less, particularly preferably 3% or less.

Examples of a resin composition having a low curing shrinkage ratio include (1) a resin composition containing a high-molecular weight curing agent (prepolymer, or the like) (for example, as described in JP-A No. 2001-19740, JP-A No. 2004-302293, or JP-A No. 2007-211247, a number average molecular weight of the high-molecular weight curing agent is preferably in the range of 200 to 100,000, more preferably 500 to 50,000, and particularly preferably 1,000 to 20,000. Further, a value calculated in terms of number average molecular weight/number of curing reactive groups of the curing agent is preferably in the range of 50 to 10,000, more preferably 100 to 5,000, and particularly preferably 200 to 3,000), (2) a resin composition containing a non-reactive material (organic/inorganic fine particles, non-reactive resins, or the like) (for example, as described in JP-A 6-298883, JP-A 2001-247793, or JP-A 2006-225434), (3) a resin composition containing a low-shrinkage, crosslinkable reactive group (for example, a ring-opening polymerizable group (for example, an epoxy group (for example, as described in JP-A No. 2004-210932), an oxetanyl group (for example, as described in JP-A 8-134405), an episulfide group (for example, as described in JP-A No. 2002-105110), a cyclic carbonate group (for example, as described in JP-A 7-62065), and the like), an ene/thiol curable group (for example, as described in JP-A No. 2003-20334), a hydrosilylated curable group (for example, as described in JP-A No. 2005-15666), and the like), (4) a resin composition containing a robust skeleton resin (fluorene, adamantane, isophorone, or the like) (for example, as described in JP-A 9-137043), (5) a resin composition which contains two kinds of monomers having different polymerizable groups and forms an interpenetrating network structure (so-called IPN structure) (for example, as described in JP-A No. 2006-131868), and (6) a resin composition containing a swellable material (for example, as described in JP-A No. 2004-2719 or JP-A No. 2008-238417), and these compositions may be appropriately used in the present invention. Further, a combined use of the plural curing shrinkage-reducing means (for example, a prepolymer containing a ring-opening polymerizable group and a resin composition containing fine particles) is preferable from the viewpoint of optimizing physical properties.

A resin composition containing two or more resins having different Abbe numbers of high and/or low is preferably used for the formation of the wafer level lens according to the second aspect of the invention.

The resin having a high Abbe number preferably has an Abbe number (vd) of 50 or more, more preferably 55 or more, and particularly preferably 60 or more. The refractive index (nd) thereof is preferably 1.52 or more, more preferably 1.55 or more, and particularly preferably 1.57 or more.

Such a resin contained in a resin composition is preferably an aliphatic resin, and particularly preferably a resin having a cycloaliphatic structure (for example, a resin having a ring structure such as cyclohexane, norbornane, adamantane, tricyclodecane, or tetracyclododecane, specifically for example, resins described in JP-A No. 10-152551, JP-A No. 2002-212500, JP-A No. 2003-20334, JP-A No. 2004-210932, JP-A No. 2006-199790, JP-A No. 2007-2144, JP-A No. 2007-284650, or JP-A No. 2008-105999).

The resin having a low Abbe number preferably has an Abbe number (vd) of 30 or less, more preferably 25 or less, and particularly preferably 20 or less. The refractive index (nd) thereof is preferably of 1.60 or more, more preferably 1.63 or more, and particularly preferably 1.65 or more. Such a resin is preferably a resin having an aromatic structure, and more preferably, for example, a resin having a structure such as 9,9'-diarylfluorene, naphthalene, benzothiazole, or benzotriazole (specifically, for example, resins described in JP-A 60-38411, JP-A 10-67977, JP-A No. 2002-47335, JP-A No. 2003-238884, JP-A No. 2004-83855, JP-A No. 2005-325331, JP-A No. 2007-238883, International Publication No. WO 2006/095610, or Japanese Patent No. 2537540).

For the purpose of increasing the refractive index or adjusting the Abbe number, it is preferable that an organic/inorganic composite material formed by dispersing inorganic fine particles in a matrix is used in the resin composition used in formation of the wafer level lens according to the second aspect of the invention.

Examples of the inorganic fine particles in the organic/inorganic composite material include oxide fine particles, sulfide fine particles, selenide fine particles, and telluride fine particles. Specific examples thereof include fine particles of zirconium oxide, titanium oxide, zinc oxide, tin oxide, niobium oxide, cerium oxide, aluminum oxide, lanthanum oxide, yttrium oxide, zinc sulfide, or the like.

The inorganic fine particles may be used alone or in a combination of two or more kinds thereof. Alternatively, the inorganic fine particles may be a composite of plural components.

From the viewpoints of various purposes such as reduction of photocatalytic activity and reduction of absorptivity, the inorganic fine particles may be subjected to a treatment such as doping with a heterogeneous metal, covering of the surface with a heterogeneous metal oxide such as silica or alumina, or surface modification with a silane coupling agent, a titanate coupling agent, an organic acid (such as a carboxylic acid, sulfonic acid, phosphoric acid, or phosphonic acid) or a dispersant having an organic acid group.

A number average primary particle diameter of the inorganic fine particles is typically in the range of from about 1 nm to 1,000 nm. When the number average primary particle diameter of the inorganic fine particles is excessively small, characteristics of the material may be changed. On the other hand, when the number average primary particle diameter of the inorganic fine particles is excessively large, effects of Rayleigh scattering become significant. Accordingly, the number average primary particle diameter of the inorganic fine particles is preferably in the range of from 1 nm to 15 nm, more preferably from 2 nm to 10 nm, and particularly preferably from 3 nm to 7 nm. Further, it is preferable that the inorganic fine particles have a relatively narrow particle size distribution. Although the definition method of such monodispersive particles may take various forms, for example, the numerical definition range as described in JP-A No. 2006-160992 falls within the range of preferable particle diameter distribution.

Here, the number average primary particle diameter may be measured, for example, using an X-ray diffraction (XRD) device or transmission electron microscope (TEM).

The inorganic fine particle preferably has a refractive index at 22° C. and a wavelength of 589.3 nm in the range of from 1.90 to 3.00, more preferably from 1.90 to 2.70, and particularly preferably from 2.00 to 2.70.

In the organic/inorganic composite material, the content of the inorganic fine particle relative to the resin that is a matrix is preferably 5% by mass or more, more preferably 10% by mass to 70% by mass, and particularly preferably 30% by mass to 60% by mass, from the viewpoints of transparency and high refractive index.

The resin serving as a matrix, which is used in the organic/inorganic composite material, may be any one of the UV-curable resin, thermosetting resin, thermoplastic resin, resin having a high Abbe number and resin having a low Abbe number, which are described above as the material of a wafer level lens. Other examples of the resin include a resin having a refractive index greater than 1.60, as described in JP-A No. 2007-93893, a block copolymer including a hydrophobic segment and a hydrophilic segment, as described in JP-A No. 2007-211164, a resin having a functional group capable of forming a chemical bond with inorganic fine particles in the terminal or side chain of a polymer, as described in JP-A No. 2007-238929, Japanese Patent Application Nos. 2008-12645, JP-A No. 2010-043191, JP-A No. 2010-065063, and JP-A No. 2010-054817, and a thermoplastic resin as described in JP-A No. 2010-031186 or 2010-037368.

Further, an additive such as a plasticizer or a dispersant may optionally be added to the organic inorganic composite material.

Here, a preferable combination of a resin serving as a matrix and inorganic fine particles is as follows.

Specifically, when the resin having a high Abbe number as described above is used as a matrix, fine particles of lanthanum oxide, aluminum oxide, zirconium oxide or the like are preferably dispersed as inorganic fine particles. When the resin having a low Abbe number is used as a matrix, fine particles of titanium oxide, tin oxide, zirconium oxide or the like are preferably dispersed as inorganic fine particles.

In order to achieve uniform dispersion of inorganic fine particles, for example, it is preferable to appropriately use a dispersant containing a functional group having reactivity with the monomer of the matrix-forming resin (for example, as described in working examples and the like of JP-A No. 2007-238884), a block copolymer including a hydrophobic segment and a hydrophilic segment (for example, as described in JP-A No. 2007-211164), or a resin having a functional group capable of forming a chemical bond with inorganic fine particles in the terminal or side chain of a polymer (for example, as described in JP-A No. 2007-238929 or JP-A No. 2007-238930).

Further, an additive such as a known release agent including a silicon compound, a fluorine compound and a long-chain alkyl group-containing compound or an antioxidant such as hindered phenol may be appropriately blended in the resin composition used in the formation of a wafer level lens.

Further, a curing catalyst or initiator may be optionally blended in the resin composition used for the formation of the wafer level lens according to the second aspect of the invention. Specific example thereof include a compound that promotes a curing reaction (radical polymerization or ionic polymerization) by the action of thermal or active energy rays described in paragraph numbers (0065) to (0066) of JP-A No. 2005-92099 or the like. An addition amount of the curing reaction promoter may vary depending on the type of catalysts or initiators, the difference between curing reactive sites, or the like and cannot be definitely determined. Generally, the content of the curing reaction promoter is preferably in the range of 0.1% by mass to 15% by mass, and more preferably 0.5% by mass to 5% by mass, based on the total solids content of the resin composition.

The resin composition used in the production of the wafer level lens according to the second aspect of the invention may be prepared by appropriately mixing the above-mentioned components. When other components are soluble in a liquid low-molecular weight monomer (reactive diluent) or the like, there is no need to add an additional solvent. However, when this is not the case, the resin composition may be prepared by dissolving respective constituent components using a solvent. The solvent that can be used in the resin composition is not particularly limited and may be appropriately selected, as long as uniform dissolution or dispersion is achieved without precipitation of the composition. Specific examples of such a solvent include ketones (for example, acetone, methyl ethyl ketone, and methyl isobutyl ketone), esters (for example, ethyl acetate and butyl acetate), ethers (for example, tetrahydrofuran and 1,4-dioxane), alcohols (for example, methanol, ethanol, isopropyl alcohol, butanol, and ethylene glycol), aromatic hydrocarbons (for example, toluene and xylene), and water. When the resin composition contains a solvent, a mold shape transfer operation is preferably carried out after the composition is cast on a substrate and/or a mold, followed by drying of the solvent.

The substrate 10 may be formed from the same molding material for the lens 12. On the other hand, as long as the substrate 10 is formed from a material transparent to visible light, such as glass, the substrate 10 may be formed from a material different from the molding material of the lens 12. In this case, the material used for forming the substrate 10 is preferably a material having a linear expansion coefficient extremely close or equal to that of the material that forms the lens 12. When the linear expansion coefficient of the material used for forming the lens 12 is identical or approximate to that of the material used for forming the substrate 10, it is possible to suppress distortion or cracking of the lens 12 occurring during heating, due to difference in the linear expansion rate, when performing reflow mounting of a wafer level lens to an imaging unit.

Although not shown in FIGS. 1 and 2, an infrared filter (IR filter) may be formed on the light incidence side of the substrate 10.

Hereinafter, configuration and production of a wafer level lens will be specifically described by way of a method of producing a wafer level lens array with reference to FIG. 3 to FIG. 8C.

[Configuration and Production of Wafer Level Lens (1)]
Formation of Lens

First, a method of forming a lens 12 on a substrate 10 will be described with reference to FIG. 3 and FIGS. 4A to 4C.

Figure 3:
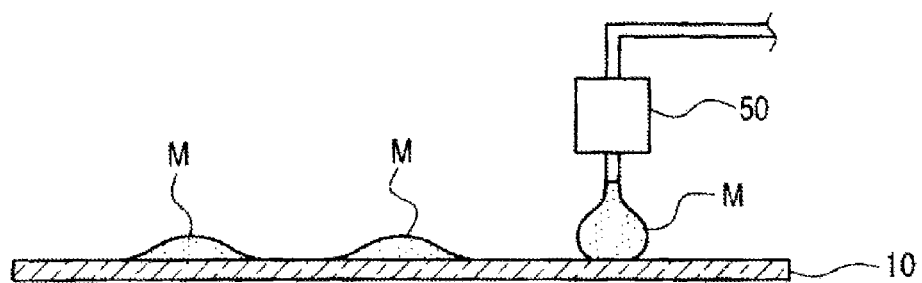
FIG. 3 is a view showing the state of supplying a molding material for a lens to a substrate.

Here, FIG. 3 is a view showing the state of supplying a molding material (represented by "M" in FIG. 3) that is a resin composition for forming a lens, to the substrate 10.

Figure 4A:
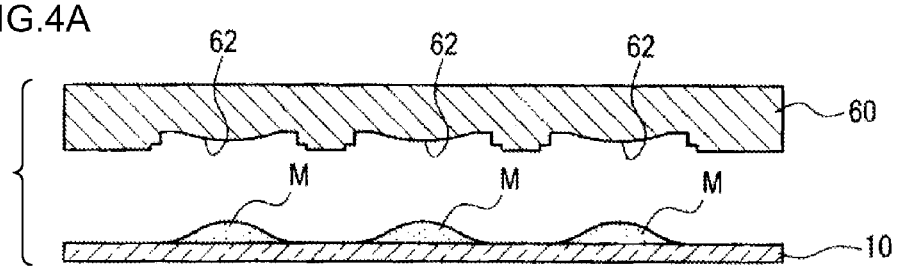
FIGS. 4A to 4C are views showing the procedure of molding a lens on a substrate by using a mold.
Figure 4B:
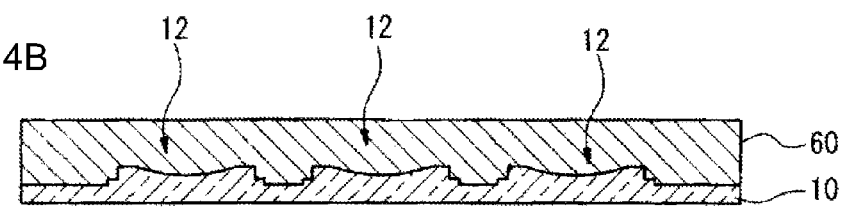
Figure 4C:
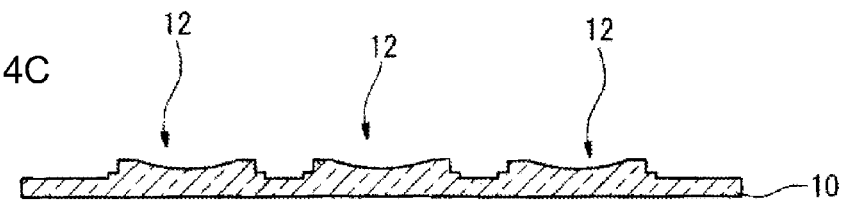

FIGS. 4A to 4C are views showing the procedures of molding the lens 12 on the substrate 10 by using a mold 60.

As shown in FIG. 3, the molding material M is dropped onto portions of a substrate 10 on which lenses 12 are to be formed, using a dispenser 50. Here, the molding material M is supplied to one portion on which a lens 12 is to be formed, in an amount necessary for forming the lens 12.

After the molding material M is supplied to the substrate 10, a mold 60 for forming the lens 12 is disposed at the surface side of the substrate 10 on which the molding material M has been supplied, as shown in FIG. 4A.

The mold 60 is provided with concave portions 62 for transferring a shape of lens 12, according to the desired number of the lenses 12.

As shown in FIG. 4B, the mold 60 is pressed over the molding material M on the substrate 10, to deform the molding material M in compliance with the shape of concave portions 62. While the mold 60 being pressed over the molding material M, the molding material M is cured by irradiation of heat or ultraviolet rays from the outside of the mold 60 when the molding material M is a thermosetting resin or UV curable resin.

After the molding material M is cured, the substrate 10 and the lenses 12 are released from the mold 60, as shown in FIG. 4C.

Formation of Light-Shielding Film

Next, a method of forming a light-shielding film 14 on the periphery of lenses 12 will be described with reference to FIGS. 5A to 5C.

Figure 5A:
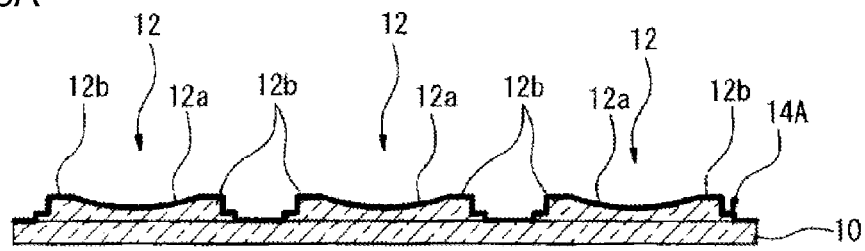
FIGS. 5A to 5C are schematic views showing the process of forming a patterned light-shielding film on a substrate onto which a lens has been molded.
Figure 5B:
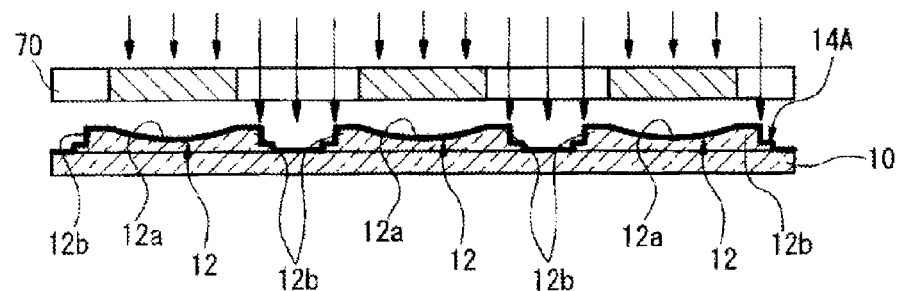
Figure 5C:
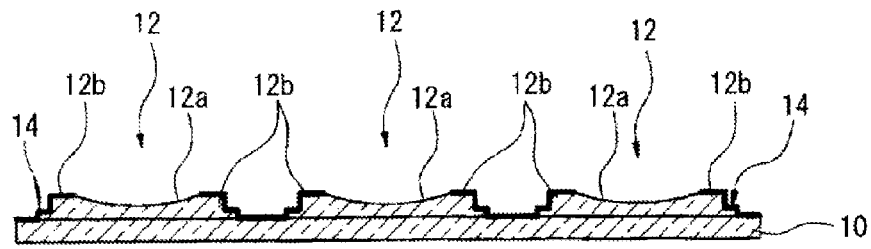

FIGS. 5A to 5C are schematic cross-sectional views showing the processes of forming the light-shielding film 14 on the substrate 10 on which the lenses 12 have been formed.

The method of forming a light-shielding film 14 includes at least: a light-shielding coating layer-forming process in which the black curable composition of the invention is applied to the substrate 10 by coating to form a light-shielding coating layer 14A (see FIG. 5A); an exposure process in which the light-shielding coating layer 14A is exposed to light through a mask 70 (see FIG. 5B); and a development process in which the post-exposure light-shielding coating layer 14A is developed to remove the uncured portion, and form a patterned light-shielding film 14 (see FIG. 5C).

The formation of the light-shielding film 14 may also be optionally carried out before or after production of the lens 12. Hereinbelow, the method of forming a light-shielding film 14 after the lenses 12 have been formed will be described in detail.

Hereinbelow, individual processes of the formation method of the light-shielding film 14 will be described.

Process of Forming Light-Shielding Coating Layer

In the light-shielding coating layer-forming process, as shown in FIG. 5A, the black curable composition according to the second aspect of the invention is applied by coating on the substrate 10, thereby forming a light-shielding coating layer 14A formed from the black curable composition and having a low light reflectivity. In this case, the light-shielding coating layer 14A is formed to completely cover the entire surface of the substrate 10, and surfaces of lens faces 12a and lens peripheries 12b of the lenses 12.

The substrate 10 which may be used in this process is not particularly limited, and examples thereof include soda glass, alkali-free glass, PYREX (registered trademark) glass, quartz glass and transparent resins.

As used herein, the substrate 10 refers to a configuration including both the lenses 12 and the substrate 10, in the embodiment where the lenses 12 and the substrate 10 are integrally formed.

Further, an undercoat layer may be optionally provided on the substrate 10 in order to improve adhesion to an upper layer, prevent diffusion of a material, or planarize the surface of the substrate 10.

As a method for coating the substrate 10 and the lens 12 with the black curable composition, various types of coating methods such as slit coating, a spray coating method, an inkjet method, spin coating, cast coating, roll coating, and a screen printing method may be used.

The film thickness of the black curable composition immediately after coating thereof is preferably in the range of 0.1 µm to 10 µm, more preferably 0.2 µm to 5 µm, and more preferably 0.2 µm to 3 µm, from the viewpoints of film thickness uniformity of the coated film and easiness in drying the coating solvent.

Drying (pre-baking) of the light-shielding coating layer 14A formed on the substrate 10 may be carried out at a temperature of 50° C. to 140° C. for 10 seconds to 300 seconds by using a hot plate, an oven, or the like.

A post-drying coated film thickness of the black curable composition (hereinafter, may be referred to as "dry film thickness") may be appropriately selected depending on performance such as desired light shieldability, and is typically in the range of from 0.1 µm to less than 50 µm.

Exposure Process

In the exposure process, the light-shielding coating layer 14A formed in the light-shielding coating layer-forming process is subjected to patternwise exposure. Although the patternwise exposure may be scanning exposure, preferred is an embodiment where the exposure is carried out using a mask 70 having a predetermined mask pattern, as shown in FIG. 5B.

In the exposure process, the light-shielding coating layer 14A may be subjected to patternwise exposure using a predetermined mask pattern so that only a light-irradiated portion of the light-shielding coating layer 14A is cured. Here, a mask pattern is used which enables irradiation with light of the surface of the substrate 10 between the lenses 12 and the surface of the lens periphery 12b. In this manner, only the portions of light-shielding coating layer 14A which are present in the regions other than the lens faces 12a are cured by light irradiation, and the cured portions form a light-shielding film 14.

Examples of the radiation useful for the exposure include ultraviolet rays such as g-rays, h-rays and i-rays. A single-wavelength light source or a light source containing the entire wavelength, such as a high pressure mercury lamp, may be used.

Development Process

Subsequent to the exposure process, an alkali development treatment (development process) is carried out. In the development process, a non-irradiated portion in the exposure process, that is, an uncured region of the light-shielding coating layer 14A is eluted in an alkaline aqueous solution, whereby only a portion that has been cured by light irradiation is left on the substrate.

Specifically, when the light-shielding coating layer 14A that has been subjected to light exposure as shown in FIG. 5B is developed, only the light-shielding coating layer 14A formed on the lens faces 12a is removed, and therefore a cured light-shielding film 14 is formed on other regions, as shown in FIG. 5C.

Examples of the alkali agent contained in the developer (alkaline aqueous solution) used in the development process include an organic alkali agent, an inorganic alkali agent, and a combination thereof. With regard to the light-shielding film formation in the present invention, an organic alkali agent is preferable from the viewpoint of not causing any damage to neighboring circuit or the like.

Examples of the alkali agent used in the developer include an organic alkaline compound (organic alkali agent) such as aqueous ammonia, ethylamine, diethylamine, dimethylethanolamine, tetramethylammonium hydroxide, tetraethylammonium hydroxide, choline, pyrrole, piperidine or 1,8-diazabicyclo-[5,4,0]-7-undecene; and an inorganic compound (inorganic alkali agent) such as sodium hydroxide, potassium hydroxide, sodium hydrogen carbonate or potassium hydrogen carbonate. An alkaline aqueous solution in which such an alkali agent is diluted with pure water so as to give a concentration of 0.001% by mass to 10% by mass, and preferably 0.01% by mass to 1% by mass is preferably used as the developer.

The development temperature is typically in the range of 20° C. to 30° C., and the development time is in the range of 20 seconds to 90 seconds.

When a developer made of such an alkaline aqueous solution is used, washing (rinsing) with pure water is generally carried out after the unexposed portion of the coated film is removed by the developer. That is, after the development treatment, the remaining developer is sufficiently washed off with pure water, followed by a drying process.

A curing process of curing the formed light-shielding film (light-shielding pattern) by heating (post-baking) and/or exposing to light may be optionally performed after the light-shielding coating layer-forming process, exposure process, and development process as described above are carried out.

The post-baking is a heat treatment after development in order to complete the curing, and is usually performed by a thermal curing treatment at 100° C. to 250° C. The conditions such as temperature and time of post-baking may be appropriately set depending on the material of substrate 10 or lens 12. For example, when the substrate 12 is made of glass, the post-baking treatment is preferably carried out at 180° C. to 240° C. among the above-specified temperature range.

The post-baking treatment may be carried out for the light-shielding film 14 formed after development continuously or batchwise using a heating device such as a hot plate, a convection oven (hot air circulation type drier), or a high frequency heater to make the above-mentioned conditions.

In the above procedure, although a shape of the lens 12 is illustrated as having a concave shape, the shape is not particularly limited and may be convex or aspheric. In the above procedure, although a wafer level lens having plural lenses 12 molded at one side of the substrate 10 is illustrated by way of example, a configuration having plural lenses 12 molded at both sides of the substrate 10 is possible. In this case, a patterned light-shielding film 14 is formed in the region other than the lens face, on both sides of the substrate.

[Configuration and Production of Wafer Level Lens (2)]

Figure 6:
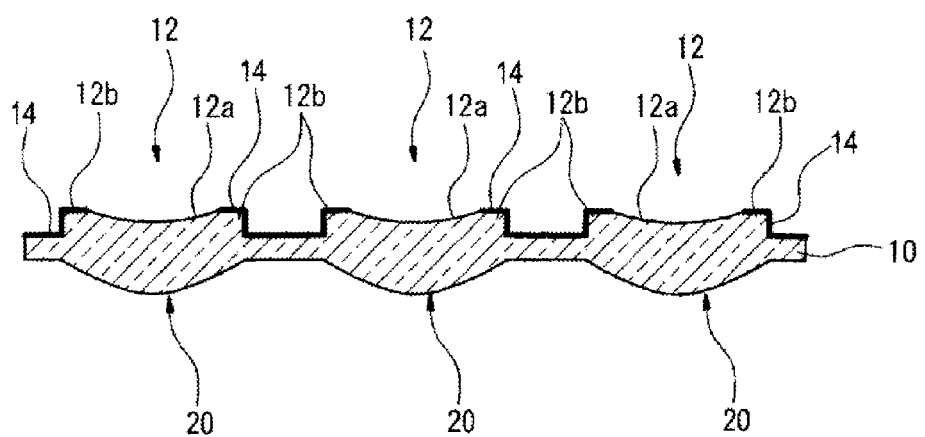
FIG. 6 is a cross-sectional view showing an example of a wafer level lens array.

FIG. 6 is a view showing another configuration example of a wafer level lens array. The wafer level lens shown in FIG. 6 has a configuration (monolithic type) in which the substrate 10 and the lenses 12 are simultaneously molded using the same molding material.

When such a wafer level lens is to be produced, the same molding material as described above may be used. In this embodiment, plural concave lenses 12 are formed at one side of the substrate 10 (e.g., at the upper side in FIG. 6), and plural convex lenses 20 are formed at the other side of the substrate 10 (e.g., at the lower side in FIG. 6). Furthermore, a patterned light-shielding film 14 is formed on the regions other than the lens faces 12a of the substrate 10, that is, only on the surface of the substrate 10 and the surfaces of the lens periphery 12b. As the patterning method used for forming the light-shielding film 14, the above-mentioned procedure may be used.

[Configuration and Production of Wafer Level Lens (3)]

Next, another configuration example of a wafer level lens array and a procedure of producing the same will be described with reference to FIGS. 7A to 7C and FIGS. 8A to 8C.

Figure 7A:
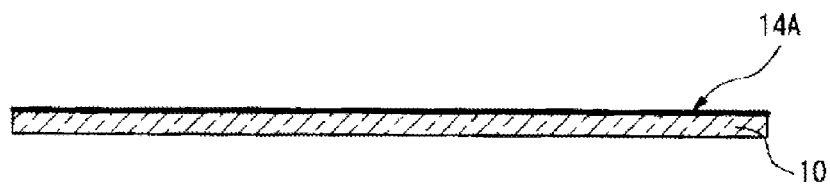
FIGS. 7A to 7C are schematic views showing another embodiment of a light-shielding film-forming process.
Figure 7B:
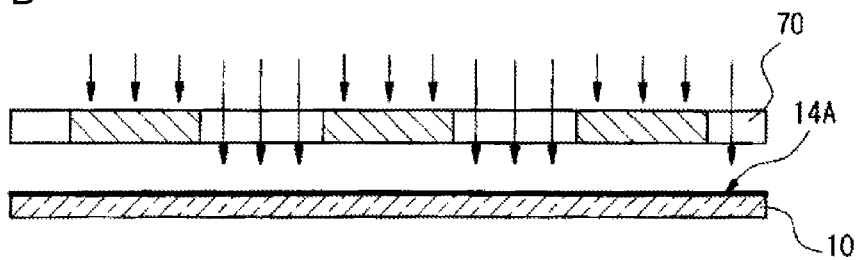
Figure 7C:
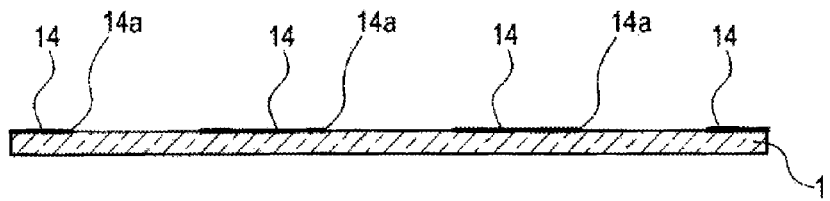

FIGS. 7A to 7C are schematic views showing another example of a process of forming a patterned light-shielding film 14.

Figure 8A:
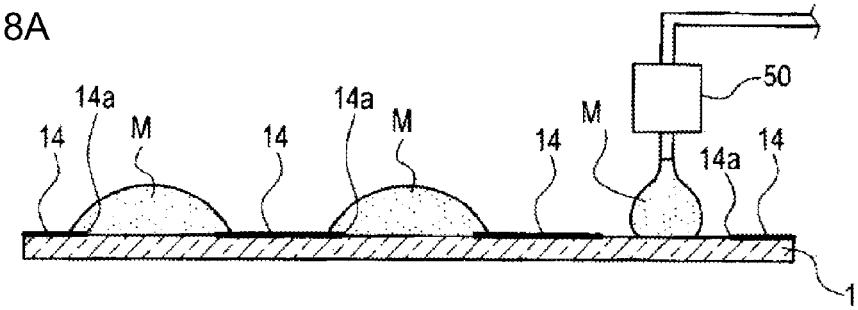
FIGS. 8A to 8C are schematic views showing the process of molding a lens on a substrate having a patterned light-shielding film.
Figure 8B:
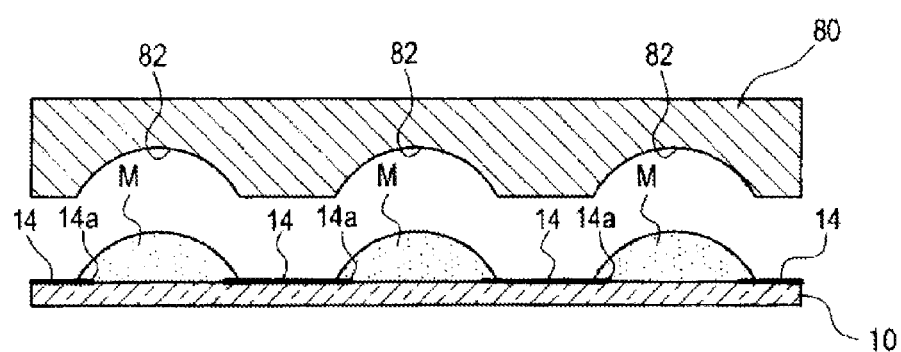
Figure 8C:
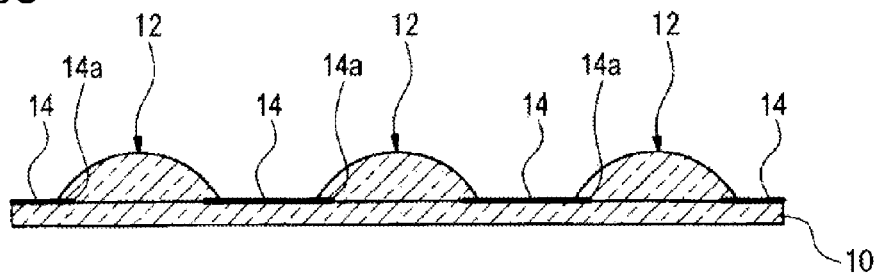

FIGS. 8A to 8C are schematic views showing a process of molding a lens 12 after the formation of the patterned light-shielding film 14.

Embodiments of the wafer level lens array shown in FIGS. 3 to 6 were intended to form a patterned light-shielding film 14 on a substrate 10 on which lenses 12 have been formed. In contrast, in the following procedures, a patterned light-shielding film 14 is first formed on a substrate 10, and then lenses 12 are molded on the substrate 10.

Formation of Light-Shielding Film

First, as shown in FIG. 7A, a light-shielding coating layer 14A is formed by applying a black curable composition according to the second aspect of the invention on the substrate 10 (hereinbelow, may be referred to as "light-shielding coating layer-forming process").

Then, the light-shielding coating layer 14A formed on the substrate 10 is dried at a temperature of 50° C. to 140° C. for 10 seconds to 300 seconds by using a hot plate, an oven, or the like. A dry film thickness of the layer formed from the black curable composition may be appropriately selected depending on performance such as desired light shieldability, and is typically in the range of from 0.1 μm to less than 50 μm.

Next, as shown in FIG. 7B, the light-shielding coating layer 14A formed in the light-shielding coating layer-forming process is subjected to patternwise exposure through a mask 70 (hereinbelow, may be referred to as "exposure process"). The mask 70 has a predetermined mask pattern.

In the exposure process, the patternwise exposure of the light-shielding coating layer 14 is carried out to cure only a light-irradiated portion of the light-shielding coating layer 14A. Here, a mask pattern is used which enables irradiation of light only to the light-shielding coating layer 14A of the region other than the portion to become a lens aperture 14a of the lens 12 when the lens 12 is molded in a subsequent process. In this manner, only the light-shielding coating layer 14A of the region other than the portion to become a lens aperture 14a of the lens 12 is cured by light irradiation. As radiation which can be used for the exposure, in particular, ultraviolet rays such as g-rays, h-rays or i-rays are preferably used as in the above-described procedure.

Subsequently, an alkali development treatment is carried out (hereinbelow, may be referred to as "development process"), so that only the portions of the light-shielding coating layer 14A in the region corresponding to the lens apertures 14a of the lens 12, which are not irradiated with light in the patternwise exposure, is eluted in an alkaline aqueous solution. As a result, as shown in FIG. 7C, the photocured light-shielding coating layer 14A in the region other than the regions of the lens apertures 14a of the lens 12 remains on the substrate 10, and a light-shielding film 14 is formed.

As the alkali agent in the alkaline aqueous solution that is a developer, the same one as that used in the above-described procedures may be used.

After the development treatment, the remaining developer is then washed and removed, followed by drying.

Also in this embodiment, a curing process of curing the formed light-shielding film by subjecting the film to the above-mentioned post-baking and/or light exposure may be optionally carried out, after the light-shielding coating layer-forming process, exposure process, and development process are carried out.

The black curable composition according to the second aspect of the invention is capable of being easily washed off using a known cleaning liquid, even when the composition is adhered, for example, to a nozzle of an ejecting unit of a coating apparatus, a piping unit of a coating apparatus, inside of a coating apparatus, or the like. In this case, in order to conduct washing off with higher efficiency, the above-mentioned solvent which may be used as the solvent contained in the black curable composition of the invention is preferably used as a cleaning liquid.

Further, cleaning liquids described in JP-A No. 7-128867, JP-A No. 7-146562, JP-A No. 8-278637, JP-A No. 2000-273370, JP-A No. 2006-85140, JP-A No. 2006-291191, JP-A No. 2007-2101, JP-A No. 2007-2102, JP-A No. 2007-281523 and the like may also be preferably used as a cleaning liquid for washing off the black curable composition according to the second aspect of the invention.

As the cleaning liquid, alkylene glycol monoalkyl ether carboxylate or alkylene glycol monoalkyl ether is preferably used.

The solvents useful as the cleaning liquid may be used alone or in a combination of two or more kinds thereof.

When two or more kinds of solvents are mixed, a mixed solvent obtained by mixing a solvent having a hydroxyl group and a solvent having no hydroxyl group is preferable. The mass ratio of the solvent having a hydroxyl group to the solvent having no hydroxyl group (i.e., solvent having a hydroxyl group/solvent having no hydroxyl group) is in the range of from 1/99 to 99/1, preferably from 10/90 to 90/10, and more preferably from 20/80 to 80/20. A mixed solvent of propylene glycol monomethyl ether acetate (PGMEA) and propylene glycol monomethyl ether (PGME) in which the mixing ratio therebetween (i.e., PGMEA/PGME) is 60/40 is particularly preferable as the mixed solvent.

In order to enhance the permeability of the cleaning liquid into the black curable composition, any one of the above-mentioned solvents which may be included in the black curable composition may be added to the cleaning liquid.

Formation of Lens

Next, a process forming the lenses 12, after the light-shielding film 14 has been formed is described.

As shown in FIG. 8A, the molding material M that forms a lens 12 is dropped on the substrate 10 having the patterned light-shielding film 14 formed thereon, using a dispenser 50. The molding material M is supplied so as to cover the region corresponding to a lens aperture 14a of the lens 12, including a portion of the ends of the light-shielding film 14 adjacent to the lens aperture 14a of the lens 12.

After the molding material M is supplied to the substrate 10, a mold 80 for forming a lens is disposed on the surface side of the substrate 10 on which the molding material M has been supplied, as shown in FIG. 8B. The mold 80 is provided with concave portions 82 for transferring a shape of the lens 12, according to the desired number of the lenses 12.

The mold 80 is pressed over the molding material M on the substrate 10, to deform the molding material M in compliance with the shape of the concave portions 82. While the mold 80 being pressed over the molding material M, the molding material M is cured by irradiation of heat or ultraviolet rays from the outside of the mold when the molding material M is a thermosetting resin or UV curable resin.

After the molding material M is cured, the substrate 10 and the lenses 12 are released from the mold 80, and a wafer level lens having a pattern-like light-shielding film 14 on the substrate 10 is obtained as shown in FIG. 8C.

As described above, the pattern-like light-shielding film 14 provided on the wafer level lens may take a configuration in which the light-shielding film 14 is provided in the region other than the lens face 12a of the lens 12, as shown in FIG. 5, as well as a configuration in which, as shown in FIG. 8C, the light-shielding film 14 is provided in the region other than the lens aperture 14a of the lens 12.

The wafer level lens has a pattern-wise light-shielding film 14 having a low light reflectivity at at least one surface of the substrate 10; therefore, the generation of reflected light is suppressed while sufficient light-shielding to the region other than the lens faces 12a or lens apertures 14a of the lenses 12 is achieved. Accordingly, when the wafer level lens is applied to an imaging module equipped with a solid-state imaging device, a problem of ghosting or flare due to reflected light when performing imaging is prevented.

Further, since the light-shielding film 14 is disposed on a surface of the substrate, there is no need to mount an additional light-shielding member on the wafer level lens, and an increase in production costs is suppressed.

Like the configuration shown in International Publication No. WO 2008/102648 described above, in the configuration in which a structure having an irregular surface is provided around a lens, the light incident on the structure is reflected or emitted, which may result in the occurrence of a problem such as ghosting. Accordingly, as shown in FIG. 5, when a configuration in which the patterned light-shielding film 14 is provided in the region other than the lens faces 12a of the lenses 12, light in the region other than the lens faces 12a is shielded, thereby improving optical performance.

EXAMPLES

Hereinafter, the present invention will be further described in detail with reference to the following examples. The present invention is not limited to the following examples as long as it does not depart from the scope of the present invention. Unless otherwise specifically indicated, "part(s)" and "%" refer to "part(s) by mass" and "% by mass", respectively.

Examples According to the First Aspect

Synthesis Example 1-1

Synthesis of Resin (J-1)

A specific resin (J-1) was synthesized as follows.

First, 55 g of a macromonomer (the following structure, N-1) (weight average molecular weight according to a GPC method (in terms of polystyrene): 3,500), 35 g of a monomer (B-1 of the following structure, which is the exemplary compound M-1 in which $R^4$ represents a methyl group), 10 g of methacrylic acid, and 6 g of dodecanethiol were added to 233 g of propylene glycol monomethyl ether, followed by stirring under a nitrogen atmosphere at 75° C. for 1 hour. Then, 0.5 g of dimethyl 2,2'-bisisobutyrate (trade name: V-601, manufactured by Wako Pure Chemical Industries, Ltd.) was added thereto, followed by heating for 2 hours. Then, 0.5 g of 2,2'-azobis(methyl isobutyrate) was further added thereto, followed by heating for 2 hours. Then, the reaction solution was heated at 90° C. for 2 hours, followed by cooling, to thereby produce a 30 wt % solution of a resin (J-1).

The synthesis scheme is as shown below. The composition ratio of (J-1) is by mass ratio.

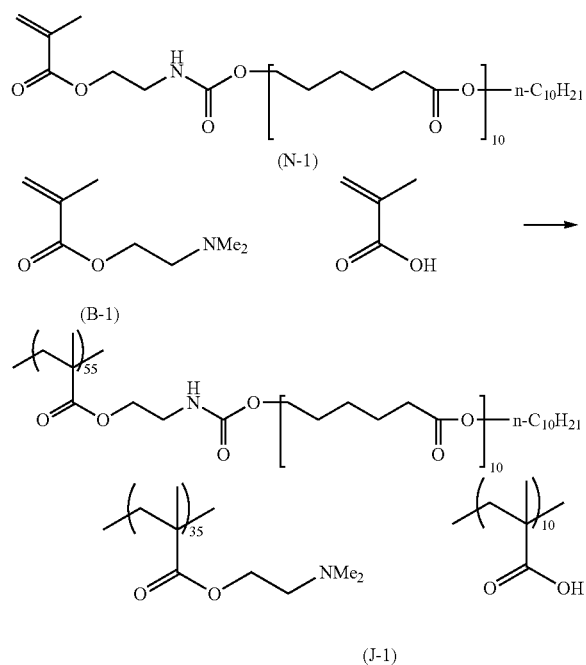

The macromonomer (N-1), monomer (B-1), and methacrylic acid used in Synthesis Example 1 correspond to a macromonomer (b-3), a monomer (b-1), and a monomer (b-2) which constitute the specific resin, respectively.

Synthesis Examples 1-2 to 1-13

Synthesis of Resins (J-2) to (J-18)

Specific resins (J-2) to (J-18) were obtained in the same manner as in Synthesis Example 1-1, except that macromonomer (N-1), monomer (B-1) and methacrylic acid used in Synthesis Example 1 were changed to kinds of macromonomers and kinds and amounts of individual monomers shown in Table 1 below.

The weight average molecular weight, amine value, and acid value of the resulting specific resins (J-1) to (J-18) are summarized in Table 2.

In Table 1, the macromonomer (N-2) was "AA-6" (weight average molecular weight according to a GPC method (in terms of polystyrene): 6500) (trade name, manufactured by Toagosei Co., Ltd.), (N-3) was "PLACCEL FA10L" (weight average molecular weight according to a GPC method (in terms of polystyrene): 3000) (trade name, manufactured by Daicel Chemical Industries, Ltd.), and (N-4) and (N-5) were macromonomers of the following structures ((N-4): weight average molecular weight (in terms of polystyrene) of 13,000, (N-5): weight average molecular weight (in terms of polystyrene) of 21,000).

Monomers (M-7), (M-17), (M-37), (M-40), (M-47) and (M-48) shown in Table 1 were monomers described above as specific examples of the monomer (b-1). Further, the monomer (M-66) was a monomer described above as a specific example of the monomer (b-2).

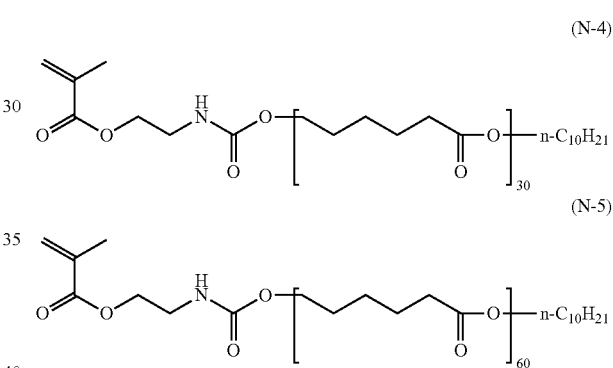

The amine value of the specific resin was measured using 0.1N perchloric acid (solvent: acetic acid) as a titrant, and the acid value of the specific resin was measured using a 0.1N sodium hydroxide aqueous solution as a titrant.

TABLE 1

| | Resin | Macromonomer | Monomer (b-1) | Monomer (b-2) |
|---|---|---|---|---|
| Synthesis Example 1-1 | (J-1) | (N-1): 55 g | 2-dimethyl aminoethyl methacrylate: 35 g | Methacrylic acid: 10 g |
| Synthesis Example 1-2 | (J-2) | (N-1): 85 g | 2-dimethyl aminoethyl methacrylate: 10 g | Methacrylic acid: 5 g |
| Synthesis Example 1-3 | (J-3) | (N-1): 25 g | 2-dimethyl aminoethyl methacrylate: 55 g | Methacrylic acid: 20 g |
| Synthesis Example 1-4 | (J-4) | (N-1): 45 g | 3-dimethyl aminopropyl methacrylamide: 35 g | 1-(2-hydroxyethyl)-2-(2-methacryloyloxyethyl)phthalate: 20 g |
| Synthesis Example 1-5 | (J-5) | (N-1): 55 g | (M-7): 35 g | (M-66): 10 g |
| Synthesis Example 1-6 | (J-6) | (N-1): 55 g | (M-17): 35 g | Acrylic acid: 10 g |
| Synthesis Example 1-7 | (J-7) | (N-1): 55 g | 2-(tert-butylamino)ethyl methacrylate: 35 g | Methacrylic acid: 10 g |
| Synthesis Example 1-8 | (J-8) | (N-2): 55 g | 2-dimethyl aminoethyl methacrylate: 35 g | Methacrylic acid: 10 g |
| Synthesis Example 1-9 | (J-9) | (N-3): 55 g | 2-dimethyl aminoethyl methacrylate: 35 g | Methacrylic acid: 10 g |
| Synthesis Example 1-10 | (J-10) | (N-1): 55 g | 4-vinyl pyridine: 35 g | Methacrylic acid: 10 g |

TABLE 1-continued

| Resin | Macromonomer | Monomer (b-1) | Monomer (b-2) |
|---|---|---|---|
| Synthesis Example 1-11 | (J-11) (N-1): 55 g | N-vinyl imidazole: 35 g | Methacrylic acid: 10 g |
| Synthesis Example 1-12 | (J-12) (N-4): 55 g | 2-dimethyl aminoethyl methacrylate: 35 g | Methacrylic acid: 10 g |
| Synthesis Example 1-13 | (J-13) (N-5): 55 g | 2-dimethyl aminoethyl methacrylate: 35 g | Methacrylic acid: 10 g |
| Synthesis Example 1-14 | (J-14) (N-1): 55 g | (M-37): 25 g<br>2-dimethyl aminoethyl methacrylate: 10 g | Methacrylic acid: 10 g |
| Synthesis Example 1-15 | (J-15) (N-1): 55 g | (M-38): 25 g<br>2-dimethyl aminoethyl methacrylate: 10 g | Methacrylic acid: 10 g |
| Synthesis Example 1-16 | (J-16) (N-1): 55 g | (M-47): 25 g<br>2-dimethyl aminoethyl methacrylate: 10 g | Methacrylic acid: 10 g |
| Synthesis Example 1-17 | (J-17) (N-1): 55 g | (M-48): 25 g<br>2-dimethyl aminoethyl methacrylate: 10 g | Methacrylic acid: 10 g |
| Synthesis Example 1-18 | (J-18) (N-1): 55 g | (M-48): 35 g | Methacrylic acid: 10 g |

TABLE 2

| Resin | Weight average molecular weight | Amine value (mgKOH/g) | Acid value (mgKOH/g) |
|---|---|---|---|
| (J-1) | 14,000 | 125 | 65 |
| (J-2) | 32,000 | 35 | 31 |
| (J-3) | 8,000 | 192 | 135 |
| (J-4) | 13,000 | 113 | 40 |
| (J-5) | 11,000 | 120 | 36 |
| (J-6) | 13,000 | 194 | 79 |
| (J-7) | 15,000 | 106 | 63 |
| (J-8) | 21,000 | 124 | 64 |
| (J-9) | 15,000 | 125 | 65 |
| (J-10) | 13,000 | 187 | 65 |
| (J-11) | 15,000 | 0 | 65 |
| (J-12) | 34,000 | 125 | 65 |
| (J-13) | 56,000 | 125 | 65 |
| (J-14) | 18,000 | 32 | 64 |
| (J-15) | 15,000 | 36 | 65 |
| (J-16) | 16,000 | 35 | 66 |
| (J-17) | 15,000 | 34 | 65 |
| (J-18) | 17,000 | 0 | 64 |

Examples 1-1 to 1-40

Preparation of Dispersion

Components described in the following (Composition 1-I) were subjected to a high-viscosity dispersion treatment with a pair of rollers to obtain a dispersion. Kneading was carried out in a kneader for 30 minutes before the high-viscosity dispersion treatment.
Composition 1-I
Titanium black A or titanium black B (listed in Table 3): 45 parts
30% by mass propylene glycol methyl ether (hereinafter, referred to suitably as "PGMEA") acetate solution of respective resins (J-1) to (J-18): 5 parts (solid content: 1.5 parts)
Titanium black A is TITANIUM BLACK 12S (average primary particle diameter: 60 nm, trade name, manufactured by Mitsubishi Materials Corporation), and titanium black B is TITANIUM BLACK 13MT (average primary particle diameter: 90 nm, trade name, manufactured by Mitsubishi Materials Corporation).
To the obtained dispersion were added resins (J-1) to (J-18) given in Table 3 and Table 4 and 150 parts of PGMEA, and the mixture was stirred using a homogenizer at 3,000 rpm for 3 hours. The resulting mixed solution was subjected to a fine dispersion treatment using a dispersion machine (trade name: DISPERMAT, manufactured by GETZMANN GMBH) with the use of 0.3 mm zirconia beads for 4 hours, thereby obtaining a titanium black dispersion. Numerical values in parentheses shown in Table 3 and Table 4 represent solid content values of the added resins.

Preparation of Black Curable Composition

To the titanium black dispersion was added the following composition (Composition 1-II), followed by mixing using a stirrer to prepare black curable compositions of Example 1-1 to Example 1-40.
(Composition 1-II)
Alkali-soluble resin: 30% by mass PGMEA solution of any of resin D-1 to resin D-4 (structures thereof are shown below) shown in Table 3 and Table 4: amount shown in Table 3 and Table 4
Polymerizable compound: any of compounds shown in Table 3 and Table 4 (structures thereof are shown below): amount shown in Table 3 and Table 4
Polymerization initiator: any of compounds shown in Table 3 and Table 4 (structures thereof are shown below): 10.0 parts
Solvent: PGMEA: 50 parts
γ-methacryloxypropyltrimethoxysilane: 0.1 parts
MEGAFAC F171 (trade name, manufactured by DIC Corporation): 0.05 parts Example 1-41

Preparation of Black Curable Composition Using Silver Tin Composition

To 200 mL of pure water maintained at 60° C. was added a solution of 15 g of tin colloid (average primary particle diameter: 20 nm, solid content: 20%, manufactured by Sumitomo Osaka Cement Co., Ltd.), 60 g of silver colloid (average primary particle diameter: 7 nm, solid content: 20%, manufactured by Sumitomo Osaka Cement Co., Ltd.) and 0.75 g of polyvinyl pyrrolidone in 100 mL of water, thereby preparing a colloidal solution.
Then, the resulting colloidal solution was stirred for 60 minutes while being maintained at 60° C., followed by ultrasonic irradiation for 5 minutes. Then, the colloidal solutions was concentrated by centrifugation to obtain a liquid A having a solid content of 25%. Liquid A was dried by a freeze dry method to obtain a powder sample.
A black curable composition was obtained in the same manner as in the preparation of a black curable composition in Example 1-5, except that the above-obtained silver tin powder was used in place of titanium black A used in Example 1-5.

Examples 1-42 and 1-43

Preparation of Black Curable Composition Using Titanium Black and Organic Pigment Black curable compositions of Examples 1-42 and 1-43 were obtained in the same manner as in the preparation of the black curable composition in Example 1-5, except that a mixture of titanium black A and C.I. Pigment Red 254 (mass ratio of titanium black A/Pigment Red 254=80/20) or a mixture of titanium black and C.I. Pigment Orange 36 (mass ratio of titanium black A/Pigment Orange 36=80/20) was used in place of titanium black A used in Example 1-5.

Comparative Examples 1-1 to 1-3

Preparation of Black Curable Composition

Black curable compositions of Comparative Examples 1-1 to 1-3 were obtained in the same manner as in the preparation of the black curable composition in Example 1-1, except that titanium black A used in Example 1-1 was changed to titanium black B, and the specific resin and the specific alkali-soluble resin used in Example 1-1 were respectively changed to the resins shown in Table 3.

DISPERBYK-112 and DISPERBYK-180 (all trade names) are dispersion resins manufactured by BYK Japan K.K.

Comparative Example 1-4

Preparation of Black Curable Composition Using Carbon Black

A black curable compositions of Comparative Example 1-4 was obtained in the same manner as in the preparation of the black curable composition in Example 1-1, except that titanium black A used in Example 1-1 was changed to carbon black (manufactured by Tokai Carbon Co., Ltd., trade name: TOKABLACK #7400, average primary particle diameter: 28 nm).

The specific resins, comparative resins, alkali-soluble resins and polymerization initiators used in the black curable compositions of Examples 1-1 to 1-43 and Comparative Examples 1-1 to 1-4 are shown in Table 3 and Table 4, respectively. In addition, the used polymerization initiators are the following compounds (C-1) to (C-6), the polymerizable compound (Q-1) is dipentaerythritol hexaacrylate (trade name: DPHA, manufactured by Nippon Kayaku Co., Ltd.), and the polymerizable compound (Q-2) is dipentaerythritol pentaacrylate succinic acid monoester (trade name: TO-1382, manufactured by Toagosei Co., Ltd.).

TABLE 3

| Black curable composition | Inorganic pigment | Specific resin or comparative resin Kind | Amount | Polymerizable compound Kind | Amount | Alkali-soluble resin Kind | Amount | Polymerization initiator Kind | Mass ratio of specific resin or comparative resin to inorganic pigment | Mass ratio of alkali-soluble resin to polymerizable compound |
|---|---|---|---|---|---|---|---|---|---|---|
| Example 1-1 | (B-1-1) Titanium black A | (J-1) | (16.5) | (Q-1) | (14.5) | (D-1) | (14) | (C-1) | 0.40 | 0.97 |
| Example 1-2 | (B-1-2) Titanium black A | (J-1) | (14.5) | (Q-1) | (14.5) | (D-1) | (16) | (C-1) | 0.36 | 1.10 |
| Example 1-3 | (B-1-3) Titanium black A | (J-1) | (12.5) | (Q-1) | (14.5) | (D-1) | (18) | (C-1) | 0.31 | 1.24 |
| Example 1-4 | (B-1-4) Titanium black A | (J-1) | (10.5) | (Q-1) | (15.5) | (D-1) | (19) | (C-1) | 0.27 | 1.23 |
| Example 1-5 | (B-1-5) Titanium black A | (J-1) | (8.5) | (Q-1) | (16.5) | (D-1) | (20) | (C-1) | 0.22 | 1.21 |
| Example 1-6 | (B-1-6) Titanium black A | (J-1) | (6.5) | (Q-1) | (17.5) | (D-1) | (21) | (C-1) | 0.18 | 1.20 |
| Example 1-7 | (B-1-7) Titanium black A | (J-1) | (8.5) | (Q-1) | (26.5) | (D-1) | (10) | (C-1) | 0.22 | 0.38 |
| Example 1-8 | (B-1-8) Titanium black A | (J-1) | (8.5) | (Q-1) | (22.5) | (D-1) | (14) | (C-1) | 0.22 | 0.62 |
| Example 1-9 | (B-1-9) Titanium black A | (J-1) | (8.5) | (Q-1) | (12.5) | (D-1) | (24) | (C-1) | 0.22 | 1.92 |
| Example 1-10 | (B-1-10) Titanium black A | (J-1) | (8.5) | (Q-1) | (10.5) | (D-1) | (26) | (C-1) | 0.22 | 2.48 |
| Example 1-11 | (B-1-11) Titanium black A | (J-1) | (8.5) | (Q-1) | (8.5) | (D-1) | (28) | (C-1) | 0.22 | 3.29 |
| Example 1-12 | (B-1-12) Titanium black A | (J-1) | (8.5) | (Q-1) | (18.5) | (D-1) | (18) | (C-2) | 0.22 | 0.97 |
| Example 1-13 | (B-1-13) Titanium black A | (J-1) | (8.5) | (Q-1) | (18.5) | (D-1) | (18) | (C-3) | 0.22 | 0.97 |
| Example 1-14 | (B-1-14) Titanium black A | (J-1) | (8.5) | (Q-1) | (18.5) | (D-1) | (18) | (C-4) | 0.22 | 0.97 |
| Example 1-15 | (B-1-15) Titanium black A | (J-1) | (8.5) | (Q-1) | (18.5) | (D-1) | (18) | (C-5) | 0.22 | 0.97 |
| Example 1-16 | (B-1-16) Titanium black A | (J-1) | (8.5) | (Q-1) | (18.5) | (D-1) | (18) | (C-6) | 0.22 | 0.97 |
| Example 1-17 | (B-1-17) Titanium black A | (J-2) | (8.5) | (Q-1) | (18.5) | (D-1) | (18) | (C-1) | 0.22 | 0.97 |
| Example 1-18 | (B-1-18) Titanium black A | (J-3) | (8.5) | (Q-1) | (18.5) | (D-1) | (18) | (C-1) | 0.22 | 0.97 |

TABLE 3-continued

| | Black curable composition | Inorganic pigment | Specific resin or comparative resin Kind | Amount | Polymerizable compound Kind | Amount | Alkali-soluble resin Kind | Amount | Polymerization initiator Kind | Mass ratio of specific resin or comparative resin to inorganic pigment | Mass ratio of alkali-soluble resin to polymerizable compound |
|---|---|---|---|---|---|---|---|---|---|---|---|
| Example 1-19 | (B-1-19) | Titanium black A | (J-4) | (8.5) | (Q-1) | (18.5) | (D-1) | (18) | (C-1) | 0.22 | 0.97 |
| Example 1-20 | (B-1-20) | Titanium black A | (J-5) | (8.5) | (Q-1) | (18.5) | (D-1) | (18) | (C-1) | 0.22 | 0.97 |
| Example 1-21 | (B-1-21) | Titanium black A | (J-6) | (8.5) | (Q-1) | (18.5) | (D-1) | (18) | (C-1) | 0.22 | 0.97 |
| Example 1-22 | (B-1-22) | Titanium black A | (J-7) | (8.5) | (Q-1) | (18.5) | (D-1) | (18) | (C-1) | 0.22 | 0.97 |
| Example 1-23 | (B-1-23) | Titanium black A | (J-8) | (8.5) | (Q-1) | (18.5) | (D-1) | (18) | (C-1) | 0.22 | 0.97 |
| Example 1-24 | (B-1-24) | Titanium black A | (J-9) | (8.5) | (Q-1) | (18.5) | (D-1) | (18) | (C-1) | 0.22 | 0.97 |
| Example 1-25 | (B-1-25) | Titanium black A | (J-10) | (8.5) | (Q-1) | (18.5) | (D-1) | (18) | (C-1) | 0.22 | 0.97 |
| Example 1-26 | (B-1-26) | Titanium black A | (J-11) | (8.5) | (Q-1) | (18.5) | (D-1) | (18) | (C-1) | 0.22 | 0.97 |
| Example 1-27 | (B-1-27) | Titanium black A | (J-12) | (8.5) | (Q-1) | (18.5) | (D-1) | (18) | (C-1) | 0.22 | 0.97 |
| Example 1-28 | (B-1-28) | Titanium black A | (J-13) | (8.5) | (Q-1) | (18.5) | (D-1) | (18) | (C-1) | 0.22 | 0.97 |

TABLE 4

| | Black curable composition | Inorganic pigment | Specific resin or comparative resin Kind | Amount | Polymerizable compound Kind | Amount | Alkali-soluble resin Kind | Amount | Polymerization initiator Kind | Mass ratio of specific resin or comparative resin to inorganic pigment | Mass ratio of alkali-soluble resin to polymerizable compound |
|---|---|---|---|---|---|---|---|---|---|---|---|
| Example 1-29 | (B-1-29) | Titanium black A | (J-14) | (8.5) | (Q-1) | (18.5) | (D-1) | (18) | (C-1) | 0.22 | 0.97 |
| Example 1-30 | (B-1-30) | Titanium black A | (J-15) | (8.5) | (Q-1) | (18.5) | (D-1) | (18) | (C-1) | 0.22 | 0.97 |
| Example 1-31 | (B-1-31) | Titanium black A | (J-16) | (8.5) | (Q-1) | (18.5) | (D-1) | (18) | (C-1) | 0.22 | 0.97 |
| Example 1-32 | (B-1-32) | Titanium black A | (J-17) | (8.5) | (Q-1) | (18.5) | (D-1) | (18) | (C-1) | 0.22 | 0.97 |
| Example 1-33 | (B-1-33) | Titanium black A | (J-18) | (8.5) | (Q-1) | (18.5) | (D-1) | (18) | (C-1) | 0.22 | 0.97 |
| Example 1-34 | (B-1-34) | Titanium black A | (J-1) | (8.5) | (Q-1) | (18.5) | (D-2) | (18) | (C-1) | 0.22 | 0.97 |
| Example 1-35 | (B-1-35) | Titanium black A | (J-1) | (8.5) | (Q-1) | (18.5) | (D-3) | (18) | (C-1) | 0.22 | 0.97 |
| Example 1-36 | (B-1-36) | Titanium black A | (J-1) | (8.5) | (Q-1) | (18.5) | (D-4) | (18) | (C-1) | 0.22 | 0.97 |
| Example 1-37 | (B-1-37) | Titanium black B | (J-1) | (8.5) | (Q-1) | (18.5) | (D-1) | (18) | (C-1) | 0.22 | 0.97 |
| Example 1-38 | (B-1-38) | Titanium black A | (J-2) (J-3) | (4.3) (4.3) | (Q-1) | (18.5) | (D-1) | (18) | (C-1) | 0.22 | 0.97 |
| Example 1-39 | (B-1-39) | Titanium black A | (J-1) | (8.5) | (Q-2) | (18.5) | (D-1) | (18) | (C-1) | 0.22 | 0.97 |
| Example 1-39 | (B-1-40) | Titanium black A | (J-1) | (8.5) | (Q-1) (Q-2) | (10.0) (8.5) | (D-1) | (18) | (C-1) | 0.22 | 0.97 |
| Example 1-41 | (B-1-41) | Silver tin | (J-1) | (8.5) | (Q-1) | (18.5) | (D-1) | (18) | (C-1) | 0.22 | 0.97 |
| Example 1-42 | (B-1-42) | Titanium black A/PR254 | (J-1) | (8.5) | (Q-1) | (18.5) | (D-1) | (18) | (C-1) | 0.22 | 0.97 |
| Example 1-43 | (B-1-43) | Titanium black A/PO36 | (J-1) | (8.5) | (Q-1) | (18.5) | (D-1) | (18) | (C-1) | 0.22 | 0.97 |
| Comparative Example 1-1 | (B-1-44) | Titanium black B | DISPERBYK-112 | (16.5) | (Q-1) | (14.5) | (D-1) | (14) | (C-1) | 0.40 | 0.97 |
| Comparative Example 1-2 | (B-1-45) | Titanium black B | DISPERBYK-180 | (16.5) | (Q-1) | (14.5) | (D-1) | (14) | (C-1) | 0.40 | 0.97 |
| Comparative Example 1-3 | (B-1-46) | Titanium black B | (J-2) | (16.5) | (Q-1) | (14.5) | (D-5) | (14) | (C-1) | 0.40 | 0.97 |

TABLE 4-continued

| Black curable composition | Inorganic pigment | Specific resin or comparative resin Kind | Amount | Polymerizable compound Kind | Amount | Alkali-soluble resin Kind | Amount | Polymerization initiator Kind | Mass ratio of specific resin or comparative resin to inorganic pigment | Mass ratio of alkali-soluble resin to polymerizable compound |
|---|---|---|---|---|---|---|---|---|---|---|
| Comparative Example 1-4 (B-1-47) | Carbon black | (J-1) | (16.5) | (Q-1) | (14.5) | (D-1) | (14) | (C-1) | 0.40 | 0.97 |

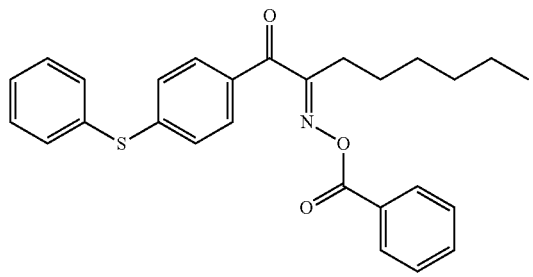

IRUGACURE OXEO1
(Ciba Specialty Chemicals K.K. Japan)

(C-1)

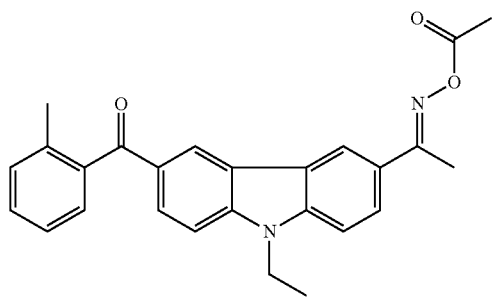

IRUGACURE OXEO2
(Ciba Specialty Chemicals K.K. Japan)

(C-2)

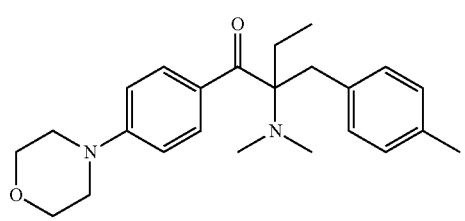

IRUGACURE OXE379
(Ciba Specialty Chemicals K.K. Japan)

(C-3)

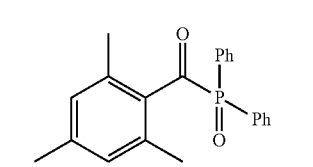

DAROCUR TPO
(Ciba Specialty Chemicals K.K. Japan)

(C-4)

-continued

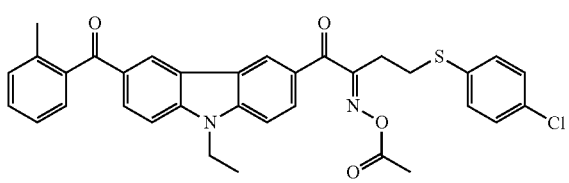

(C-5)

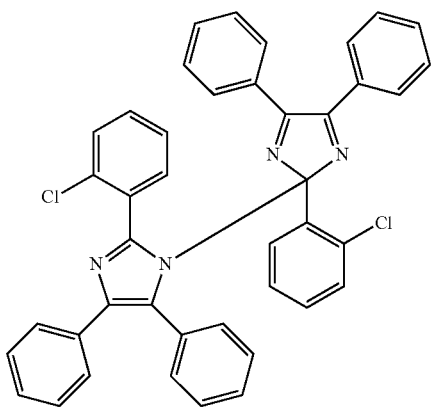

(C-6a)

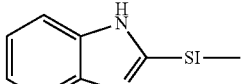

(C-6b)

(C-6):(C-6a) / (C-6b) = 20/10 (mass ratio)

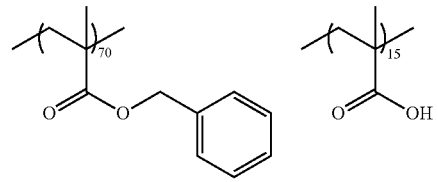

(D-1)

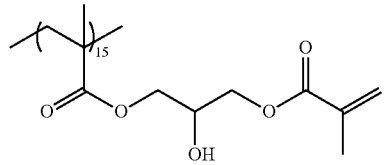

Mw = 15,000
Acid value = 45 mgKOH/g
Unsaturated equivalent = 1,211 g/mol

-continued (D-2)

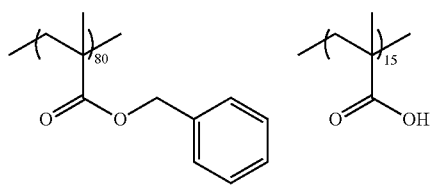

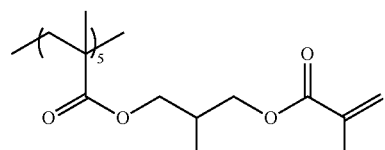

Mw = 18,000  
Acid value = 47 mgKOH/g  
Unsaturated equivalent = 3,562 g/mol (D-3)

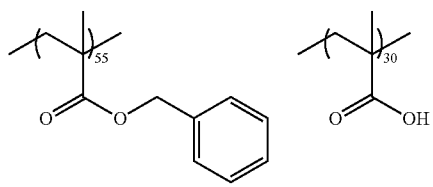

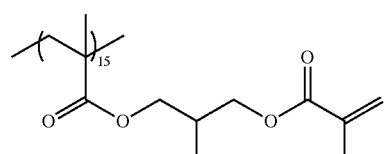

Mw = 14,000  
Acid value = 100 mgKOH/g  
Unsaturated equivalent = 1,105 g/mol (D-4)

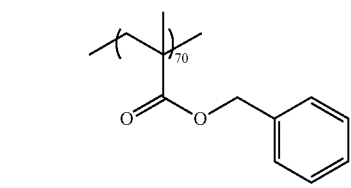

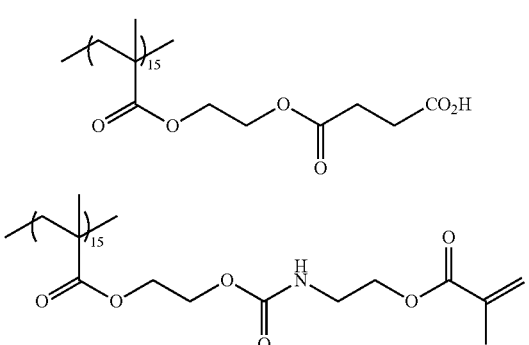

Mw = 16,000  
Acid value = 40 mgKOH/g  
Unsaturated equivalent = 1,412 g/mol (D-5)

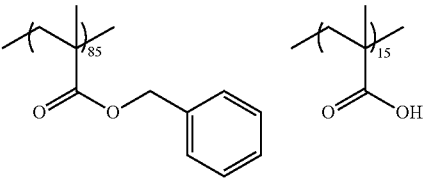

Mw = 13,000  
Acid value = 48 mgKOH/g

Production and Evaluation of Light-Shielding Color Filter for Solid-State Imaging Device Formation of Black Curable Composition Layer The components of the following composition were mixed and dissolved to prepare a resist liquid for an undercoat layer.

Composition of Resist Liquid

Solvent: PGMEA: 19.20 parts
Solvent: Ethyl lactate: 36.67 parts
Alkali soluble resin: 40% solution of benzyl methacrylate/methacrylic acid/2-hydroxyethyl methacrylate copolymer in PGMEA (molar ratio=60/22/18, weight average molecular weight of 15,000, number average molecular weight of 9,000): 30.51 parts
Polymerizable compound: Dipentaerythritol hexaacrylate: 12.20 parts
Polymerization inhibitor: p-methoxyphenol: 0.0061 parts
Fluorosurfactant: F-475 (trade name, manufactured by DIC Corporation): 0.83 parts
Polymerization initiator: Trihalomethyltriazine-based photopolymerization initiator (trade name: TAZ-107, manufactured by Midori Kagaku Co., Ltd.): 0.586 parts A 6-inch silicon wafer was heated in an oven at 200° C. for 30 minutes. Subsequently, the resist liquid for an undercoat layer was applied by coating on this silicon wafer to obtain a dry film thickness of 1.5 µm, and the silicon wafer was further heated to dry in an oven at 220° C. for 1 hour to form an undercoat layer. In this manner, a silicon wafer substrate having thereon an undercoat layer was obtained.

By controlling the number of coating rotations of the spin coating so that the film thickness after coating and heating became 2.0 µm, black curable compositions of Examples 1 to 44, and Comparative Examples 1 to 3 were uniformly coated on silicon wafers (substrate) having a undercoat layer thereon, respectively. The silicon wafers were subjected to heat treatment on a hot plate at a surface temperature of 120° C. for 120 seconds. In this manner, a black curable composition layer having a film thickness of 2.0 µm was obtained.

Exposure to Light

Subsequently, the assembly was irradiated with (exposed to) light with a change rate of an exposure dose of 50 mJ/cm$^2$ in the range of 100 mJ/cm$^2$ to 5,000 mJ/cm$^2$, through a photomask having a line-and-space pattern of 10.0 µm, using an i-ray stepper exposure apparatus FPA-3000iS+(trade name, manufactured by Canon, Inc.).

Development

After irradiation (exposure), puddle development was carried out using a 0.3% aqueous solution of tetramethylammonium hydroxide (TMAH), at 23° C. for 60 seconds. Thereafter, rinsing was carried out in spin shower using pure water for 20 seconds, followed by additional washing with pure water.

Next, adhered water droplets were removed by air, and the substrate was dried and heated at 200° C. for 1 minute, to thereby obtain a black image pattern (line-and-space pattern of 10.0 µm).

In this manner, a light-shielding color filter for a solid-state imaging device was obtained.

Evaluation

The thus obtained black curable compositions and light-shielding color filters for a solid-state imaging device were subjected to the following evaluation. The evaluation results are summarized in Table 5.

Sensitivity Evaluation

According to SEM observation, the minimum exposure dose at which a pattern size reached to 10.0 µm was evaluated as sensitivity. A smaller value of sensitivity represents higher adhesion to a substrate.

Pattern Defect Evaluation

At the minimum exposure dose at which a pattern size reached to 10.0 µm, a region of 100 µm was examined along lines of the line section using a SEM, and pattern defects were counted. This examination was carried out for 5 line sections and pattern defects were averaged (observed pattern defects/5). A smaller value represents better formation of a pattern.

Light Shieldability Evaluation

Using the resulting light-shielding color filters, the maximum transmissivity in a wavelength region of 400 nm to 800 nm was measured using a spectrophotometer (trade name: UV23600, manufactured by Shimadzu Corporation). A smaller value is excellent in terms of light shieldability. The maximum transmissivity of less than 1% represents that light shieldability is favorable.

TABLE 5

| | Black curable composition | Sensitivity (mJ/cm$^2$) | Pattern defect | Transmissivity |
|---|---|---|---|---|
| Example 1-1 | (B-1-1) | 600 | 9 | 0.4% |
| Example 1-2 | (B-1-2) | 500 | 4 | 0.4% |
| Example 1-3 | (B-1-3) | 400 | 0 | 0.4% |
| Example 1-4 | (B-1-4) | 400 | 0 | 0.4% |
| Example 1-5 | (B-1-5) | 400 | 0 | 0.4% |
| Example 1-6 | (B-1-6) | 500 | 4 | 0.4% |
| Example 1-7 | (B-1-7) | 500 | 3 | 0.4% |
| Example 1-8 | (B-1-8) | 400 | 0 | 0.4% |
| Example 1-9 | (B-1-9) | 400 | 0 | 0.4% |
| Example 1-10 | (B-1-10) | 500 | 4 | 0.4% |
| Example 1-11 | (B-1-11) | 600 | 8 | 0.4% |
| Example 1-12 | (B-1-12) | 400 | 5 | 0.4% |
| Example 1-13 | (B-1-13) | 600 | 6 | 0.4% |
| Example 1-14 | (B-1-14) | 600 | 0 | 0.4% |
| Example 1-15 | (B-1-15) | 300 | 0 | 0.4% |
| Example 1-16 | (B-1-16) | 300 | 0 | 0.4% |
| Example 1-17 | (B-1-17) | 400 | 2 | 0.4% |
| Example 1-18 | (B-1-18) | 400 | 3 | 0.4% |
| Example 1-19 | (B-1-19) | 400 | 7 | 0.4% |
| Example 1-20 | (B-1-20) | 400 | 8 | 0.4% |
| Example 1-21 | (B-1-21) | 400 | 0 | 0.4% |
| Example 1-22 | (B-1-22) | 400 | 2 | 0.4% |
| Example 1-23 | (B-1-23) | 450 | 9 | 0.4% |
| Example 1-24 | (B-1-24) | 400 | 0 | 0.4% |
| Example 1-25 | (B-1-25) | 400 | 8 | 0.4% |
| Example 1-26 | (B-1-26) | 400 | 7 | 0.4% |
| Example 1-27 | (B-1-27) | 400 | 3 | 0.4% |
| Example 1-28 | (B-1-28) | 400 | 8 | 0.4% |
| Example 1-29 | (B-1-29) | 400 | 0 | 0.4% |
| Example 1-30 | (B-1-30) | 400 | 9 | 0.4% |
| Example 1-31 | (B-1-31) | 400 | 0 | 0.4% |
| Example 1-32 | (B-1-32) | 400 | 0 | 0.4% |
| Example 1-33 | (B-1-33) | 400 | 7 | 0.4% |
| Example 1-34 | (B-1-34) | 700 | 8 | 0.4% |
| Example 1-35 | (B-1-35) | 700 | 9 | 0.4% |
| Example 1-36 | (B-1-36) | 400 | 0 | 0.4% |
| Example 1-37 | (B-1-37) | 400 | 4 | 0.4% |
| Example 1-38 | (B-1-38) | 400 | 0 | 0.4% |
| Example 1-39 | (B-1-39) | 400 | 0 | 0.4% |
| Example 1-40 | (B-1-40) | 400 | 0 | 0.4% |
| Example 1-41 | (B-1-41) | 700 | 3 | 0.6% |
| Example 1-42 | (B-1-42) | 400 | 0 | 0.3% |
| Example 1-43 | (B-1-43) | 400 | 0 | 0.3% |
| Comparative Example 1-1 | (B-1-44) | 600 | 21 | 0.4% |
| Comparative Example 1-2 | (B-1-45) | 600 | 25 | 0.4% |
| Comparative Example 1-3 | (B-1-46) | 900 | 21 | 0.4% |
| Comparative Example 1-4 | (B-1-47) | 1,300 | 9 | 1.2% |

As seen from Table 5, when the black curable composition according to the first aspect of the invention is used, occurrence of pattern defects is suppressed.

Further, it can be seen that the black curable compositions of Examples 1-1 to 1-40 only containing titanium black as an inorganic pigment is particularly superior in sensitivity, as compared to the black curable composition of Example 1-41 containing an inorganic pigment other than titanium black. Further, it can be seen that the combined use of titanium black and a red organic pigment, as in the black curable compositions of Example 1-42 and Example 1-43, further improves light shieldability.

Example 1-44

Production of Solid-State Imaging Device

Preparation of Chromatic Color Curable Composition

A chromatic color curable composition for red color, a chromatic color curable composition for green color, and a chromatic color curable composition for blue color were respectively prepared in the same manner as in the preparation of the black curable composition in Example 1-4, except that the black pigment TITANIUM BLACK 12S [trade name, manufactured by Mitsubishi Materials Corporation] in the black curable composition (B-4) prepared in Example 1-4 was changed to each of the following chromatic color pigments.

Chromatic color pigments for formation of RGB colored chromatic color pixels

Pigment for red color:
C.I. Pigment Red 254
Pigment for green color:
70/30 [mass ratio] mixture of C.I. Pigment Green 36 and C.I. Pigment Yellow 139
Pigment for blue color:
70/30 [mass ratio] mixture of C.I. Pigment Blue 15:6 and C.I. Pigment Violet 23

Production of Full-Color Color Filter for Solid-State Imaging Device

The black curable composition used in Example 1-4 was spin-coated onto a silicon wafer so that the post-drying film thickness became 0.8 µm, and the resulting silicon wafer having thereon a black curable composition layer was exposed to light at 400 mJ/cm$^2$ through a mask with a lattice pattern of 100 µm (border-width: 10 µm) using an i-ray stepper exposure apparatus used in Example 1-1. Development, rinsing, drying and curing were carried out in the same manner as in Example 1-1, thereby producing a light-shielding color filter.

Using the chromatic color curable composition for red color, red pixels in an island pattern of 1.0×1.0 µm were formed in the resulting light-shielding color filter. Then, using the chromatic color curable composition for green color, green pixels in a Bayer pattern of 1.0×1.0 μm were formed in ¾ of the remaining lattice. In addition, using the chromatic color curable composition for blue color, blue pixels in an island pattern of 1.0×1.0 μm were formed in the remaining lattice. In this manner, a light-shielding color filter for solid-state imaging device was produced.

Evaluation

The resulting full-color color filter for a solid-state imaging device was integrated into a solid-state imaging device, and it was confirmed that the solid-state imaging device exhibited high light shieldability of a light-shielding color filter for a solid-state imaging device, high resolution, and excellent color separability.

Example According to the Second Aspect

Synthesis Example 2-1

Synthesis of Resin (J-1)

Resin (J-1) that is a specific resin was synthesized in the same manner as in Synthesis Example 1-1 in the Example section according to the first aspect.

Synthesis Examples 2-2 to 2-13

Synthesis of Resins (J-2) to (J-18)

Resins (J-2) to (J-18) that are specific resins were obtained in the same manner as in Synthesis Example 1-2 to 1-13 according to the first aspect.

The weight average molecular weights, amine values and acid values of the resulting specific resins (J-1) to (J-18) are as shown in Table 2 according to the first aspect.

Examples 2-1 to 2-38

Preparation of Dispersion

Components described in the following (Composition 2-I) were subjected to a high-viscosity dispersion treatment with a pair of rollers to obtain a dispersion. Kneading was carried out in a kneader for 30 minutes before the high-viscosity dispersion treatment.

In addition, resins (J-1) to (J-18) were each dissolved at a concentration of 30% by mass in propylene glycol methyl ether acetate (hereinafter, referred to as "PGMEA") in advance.

(Composition 2-I)
Titanium black A or titanium black B (shown in Table 3 and Table 4): 45 parts
30% by mass PGMEA solution of resins (J-1) to (J-18): 5 parts (solid content: 1.5 parts)

Titanium black A is TITANIUM BLACK 12S (average primary particle diameter: 60 nm, trade name, manufactured by Mitsubishi Materials Corporation), and titanium black B is TITANIUM BLACK 13MT (average primary particle diameter: 90 nm, trade name, manufactured by Mitsubishi Materials Corporation).

To the obtained dispersion were added resins (J-1) to (J-18) given in Table 6 and Table 7 and 150 parts of PGMEA, and the mixture was stirred using a homogenizer at 3,000 rpm for 3 hours. The resulting mixed solution was subjected to a fine dispersion treatment using a dispersion machine (trade name: DISPERMAT, manufactured by GETZMANN GMBH) with the use of 0.3 mm zirconia beads for 4 hours, thereby obtaining a titanium black dispersion. Numerical values in parentheses shown in Tables 6 and 7 represent solid content values of the added resins.

Preparation of Black Curable Composition

To the titanium black dispersion was added the following composition (Composition 2-II), followed by mixing using a stirrer to prepare black curable compositions of Example 2-1 to Example 2-38.

(Composition 2-II)
Alkali-soluble resin: 30% by mass PGMEA solution of any of resin D-1 to resin D-4 (structures thereof are shown below) shown in Tables 6 and 7: amount shown in Tables 6 and 7
Polymerizable compound: dipentaerythritol hexaacrylate: 15.0 parts
Polymerizable compound: dipentaerythritol triacrylate: 5.0 parts
Polymerization initiator: any of compounds shown in Tables 6 and 7 (structures thereof are shown below): 20.0 parts
Solvent: PGMEA: 50 parts
γ-methacryloxypropyltrimethoxysilane: 0.1 parts
Fluorosurfactnat MEGAFAC F171 (trade name, manufactured by DIC Corporation): 0.05 parts Example 2-39

Preparation of Black Curable Composition Using Silver Tin Composition

To 200 mL of pure water maintained at 60° C. was added a solution of 15 g of tin colloid (average primary particle diameter: 20 nm, solid content: 20%, manufactured by Sumitomo Osaka Cement Co., Ltd.), 60 g of silver colloid (average primary particle diameter: 7 nm, solid content: 20%, manufactured by Sumitomo Osaka Cement Co., Ltd.) and 0.75 g of polyvinyl pyrrolidone in 100 mL of water, thereby preparing a colloidal solution.

Then, the resulting colloidal solution was stirred for 60 minutes while being maintained at 60° C., followed by ultrasonic irradiation for 5 minutes. Then, the colloidal solutions was concentrated by centrifugation to obtain a liquid A having a solid content of 25%. Liquid A was dried by a freeze dry method to obtain a powder sample.

A black curable composition was obtained in the same manner as in the preparation of a black curable composition in Example 2-5, except that the above-obtained silver tin powder was used in place of titanium black A used in Example 2-5.

Examples 2-40 and 2-41

Preparation of Black Curable Composition Using Titanium Black and Organic Pigment Black curable compositions of Examples 2-40 and 2-41 were obtained in the same manner as in the preparation of the black curable composition in Example 2-5, except that a mixture of titanium black A and C.I. Pigment Red 254 (mass ratio of titanium black A/Pigment Red 254=80/20) or a mixture of titanium black and C.I. Pigment Orange 36 (mass ratio of titanium black A/Pigment Orange 36=80/20) was used in place of titanium black A used in Example 2-5.

Comparative Examples 2-1 to 2-3

Preparation of Black Curable Composition

Black curable compositions of Comparative Examples 2-1 to 2-3 were obtained in the same manner as in the preparation of the black curable composition in Example 2-1, except that titanium black A used in Example 2-1 was changed to titanium black B, and the specific resin and the specific alkali-soluble resin used in Example 2-1 were respectively changed to the resins shown in Table 7.

DISPERBYK-112 and DISPERBYK-180 (all trade names) are dispersion resins manufactured by BYK Japan K.K.

Comparative Example 2-4

Preparation of Black Curable Composition Using Carbon Black

A black curable compositions of Comparative Example 2-4 was obtained in the same manner as in the preparation of the black curable composition in Example 2-1, except that titanium black A used in Example 2-1 was changed to carbon black (manufactured by Tokai Carbon Co., Ltd., trade name: TOKABLACK #7400, average primary particle diameter: 28 nm).

The specific resins, comparative resins, alkali-soluble resins and polymerization initiators used in the black curable compositions of Examples 2-1 to 2-41 and Comparative Examples 2-1 to 2-4 are shown in Table 6 and Table 7. Compounds (C-1) to (C-6) used as a polymerization initiator are the same as the compounds (C-1) to (C-6) used in the Examples according to the first aspect, respectively. Alkali-soluble resins (D-1) to (D-5) are the same as alkali-soluble resins (D-1) to (D-5) used in the Examples according to the first aspect.

TABLE 6

| Black curable composition | Inorganic pigment | Specific resin or comparative resin Kind | Specific resin or comparative resin Amount | Polymerizable compound Amount | Alkali-soluble resin Kind | Alkali-soluble resin Amount | Polymerization initiator Kind | Mass ratio of specific resin or comparative resin to inorganic pigment | Mass ratio of alkali-soluble resin to polymerizable compound |
|---|---|---|---|---|---|---|---|---|---|
| Example 2-1 | (B-2-1) | Titanium black A | (J-1) | (12.5) | (17.5) | (D-1) | (15) | (C-1) | 0.40 | 0.86 |
| Example 2-2 | (B-2-2) | Titanium black A | (J-1) | (10.5) | (18.5) | (D-1) | (16) | (C-1) | 0.34 | 0.86 |
| Example 2-3 | (B-2-3) | Titanium black A | (J-1) | (8.5) | (19.5) | (D-1) | (17) | (C-1) | 0.29 | 0.87 |
| Example 2-4 | (B-2-4) | Titanium black A | (J-1) | (6.5) | (20.5) | (D-1) | (18) | (C-1) | 0.23 | 0.88 |
| Example 2-5 | (B-2-5) | Titanium black A | (J-1) | (4.5) | (21.5) | (D-1) | (19) | (C-1) | 0.17 | 0.88 |
| Example 2-6 | (B-2-6) | Titanium black A | (J-1) | (8.5) | (29.5) | (D-1) | (7) | (C-1) | 0.29 | 0.24 |
| Example 2-7 | (B-2-7) | Titanium black A | (J-1) | (8.5) | (23.5) | (D-1) | (13) | (C-1) | 0.29 | 0.55 |
| Example 2-8 | (B-2-8) | Titanium black A | (J-1) | (8.5) | (17.5) | (D-1) | (19) | (C-1) | 0.29 | 1.09 |
| Example 2-9 | (B-2-9) | Titanium black A | (J-1) | (8.5) | (12.5) | (D-1) | (24) | (C-1) | 0.29 | 1.92 |
| Example 2-10 | (B-2-10) | Titanium black A | (J-1) | (8.5) | (10.5) | (D-1) | (26) | (C-1) | 0.29 | 2.48 |
| Example 2-11 | (B-2-11) | Titanium black A | (J-1) | (8.5) | (8.5) | (D-1) | (28) | (C-1) | 0.29 | 3.29 |
| Example 2-12 | (B-2-12) | Titanium black A | (J-1) | (8.5) | (18.5) | (D-1) | (18) | (C-2) | 0.29 | 0.97 |
| Example 2-13 | (B-2-13) | Titanium black A | (J-1) | (8.5) | (18.5) | (D-1) | (18) | (C-3) | 0.29 | 0.97 |
| Example 2-14 | (B-2-14) | Titanium black A | (J-1) | (8.5) | (18.5) | (D-1) | (18) | (C-4) | 0.29 | 0.97 |
| Example 2-15 | (B-2-15) | Titanium black A | (J-1) | (8.5) | (18.5) | (D-1) | (18) | (C-5) | 0.29 | 0.97 |
| Example 2-16 | (B-2-16) | Titanium black A | (J-1) | (8.5) | (18.5) | (D-1) | (18) | (C-6) | 0.29 | 0.97 |
| Example 2-17 | (B-2-17) | Titanium black A | (J-2) | (8.5) | (18.5) | (D-1) | (18) | (C-1) | 0.29 | 0.97 |
| Example 2-18 | (B-2-18) | Titanium black A | (J-3) | (8.5) | (18.5) | (D-1) | (18) | (C-1) | 0.29 | 0.97 |
| Example 2-19 | (B-2-19) | Titanium black A | (J-4) | (8.5) | (18.5) | (D-1) | (18) | (C-1) | 0.29 | 0.97 |
| Example 2-20 | (B-2-20) | Titanium black A | (J-5) | (8.5) | (18.5) | (D-1) | (18) | (C-1) | 0.29 | 0.97 |
| Example 2-21 | (B-2-21) | Titanium black A | (J-6) | (8.5) | (18.5) | (D-1) | (18) | (C-1) | 0.29 | 0.97 |
| Example 2-22 | (B-2-22) | Titanium black A | (J-7) | (8.5) | (18.5) | (D-1) | (18) | (C-1) | 0.29 | 0.97 |
| Example 2-23 | (B-2-23) | Titanium black A | (J-8) | (8.5) | (18.5) | (D-1) | (18) | (C-1) | 0.29 | 0.97 |
| Example 2-24 | (B-2-24) | Titanium black A | (J-9) | (8.5) | (18.5) | (D-1) | (18) | (C-1) | 0.29 | 0.97 |
| Example 2-25 | (B-2-25) | Titanium black A | (J-10) | (8.5) | (18.5) | (D-1) | (18) | (C-1) | 0.29 | 0.97 |
| Example 2-26 | (B-2-26) | Titanium black A | (J-11) | (8.5) | (18.5) | (D-1) | (18) | (C-1) | 0.29 | 0.97 |

TABLE 6-continued

| | Black curable composition | Inorganic pigment | Specific resin or comparative resin Kind | Amount | Polymerizable compound Amount | Alkali-soluble resin Kind | Amount | Polymerization initiator Kind | Mass ratio of specific resin or comparative resin to inorganic pigment | Mass ratio of alkali-soluble resin to polymerizable compound |
|---|---|---|---|---|---|---|---|---|---|---|
| Example 2-27 | (B-2-27) | Titanium black A | (J-12) | (8.5) | (18.5) | (D-1) | (18) | (C-1) | 0.29 | 0.97 |
| Example 2-28 | (B-2-28) | Titanium black A | (J-13) | (8.5) | (18.5) | (D-1) | (18) | (C-1) | 0.29 | 0.97 |

TABLE 7

| | Black curable composition | Inorganic pigment | Specific resin or comparative resin Kind | Amount | Polymerizable compound Amount | Alkali-soluble resin Kind | Amount | Polymerization initiator Kind | Mass ratio of specific resin or comparative resin to inorganic pigment | Mass ratio of alkali-soluble resin to polymerizable compound |
|---|---|---|---|---|---|---|---|---|---|---|
| Example 2-29 | (B-2-29) | Titanium black A | (J-14) | (8.5) | (18.5) | (D-1) | (18) | (C-1) | 0.29 | 0.97 |
| Example 2-30 | (B-2-30) | Titanium black A | (J-15) | (8.5) | (18.5) | (D-1) | (18) | (C-1) | 0.29 | 0.97 |
| Example 2-31 | (B-2-31) | Titanium black A | (J-16) | (8.5) | (18.5) | (D-1) | (18) | (C-1) | 0.29 | 0.97 |
| Example 2-32 | (B-2-32) | Titanium black A | (J-17) | (8.5) | (18.5) | (D-1) | (18) | (C-1) | 0.29 | 0.97 |
| Example 2-33 | (B-2-33) | Titanium black A | (J-18) | (8.5) | (18.5) | (D-1) | (18) | (C-1) | 0.29 | 0.97 |
| Example 2-34 | (B-2-34) | Titanium black A | (J-1) | (8.5) | (18.5) | (D-2) | (18) | (C-1) | 0.29 | 0.97 |
| Example 2-35 | (B-2-35) | Titanium black A | (J-1) | (8.5) | (18.5) | (D-3) | (18) | (C-1) | 0.29 | 0.97 |
| Example 2-36 | (B-2-36) | Titanium black A | (J-1) | (8.5) | (18.5) | (D-4) | (18) | (C-1) | 0.29 | 0.97 |
| Example 2-36 | (B-2-36) | Titanium black A | (J-1) | (8.5) | (18.5) | (D-4) | (18) | (C-1) | 0.29 | 0.97 |
| Example 2-37 | (B-2-37) | Titanium black A | (J-1) | (8.5) | (18.5) | (D-1) | (18) | (C-1) | 0.29 | 0.97 |
| Example 2-38 | (B-2-38) | Titanium black A | (J-2) (J-3) | (4.3) (4.3) | (18.5) | (D-1) | (18) | (C-1) (C-1) | 0.29 | 0.97 |
| Example 2-39 | (B-2-39) | Silver tin | (J-1) | (8.5) | (18.5) | (D-1) | (18) | (C-1) | 0.29 | 0.97 |
| Example 2-40 | (B-2-40) | Titanium black A/ PR254 | (J-1) | (8.5) | (18.5) | (D-1) | (18) | (C-1) | 0.29 | 0.97 |
| Example 2-41 | (B-2-41) | Titanium black A/ PO36 | (J-1) | (8.5) | (18.5) | (D-1) | (18) | (C-1) | 0.29 | 0.97 |
| Comparative Example 2-1 | (B-2-42) | Titanium black B | DISPERBYK-112 | (12.5) | (17.5) | (D-1) | (15) | (C-1) | 0.40 | 0.86 |
| Comparative Example 2-2 | (B-2-43) | Titanium black B | DISPERBYK-180 | (12.5) | (17.5) | (D-1) | (15) | (C-1) | 0.40 | 0.86 |
| Comparative Example 2-3 | (B-2-44) | Titanium black B | (J-2) | (12.5) | (17.5) | (D-5) | (15) | (C-1) | 0.40 | 0.86 |
| Comparative Example 2-4 | (B-2-45) | Carbon black | (J-2) | (12.5) | (17.5) | (D-1) | (15) | (C-1) | 0.29 | 0.86 |

Production and Evaluation of Light-Shielding Film for Wafer Level Lens on Glass Substrate Coating Process By controlling the number of coating rotations of the spin coating so that the film thickness after heating treatment became 2.0 μm, black curable compositions of Examples 2-1 to 2-41 and Comparative Examples 2-1 to 2-4 was uniformly coated on glass substrates with a size of 5 cm×5 cm (thickness: 1 mm, manufactured by Schott Inc., trade name: BK7), respectively. The glass substrates were subjected to heat treatment on a hot plate at a surface temperature of 120° C. for 120 seconds. In this manner, a black curable composition layer having a film thickness of 2.0 μm was obtained.

Exposure Process

Figure 9:
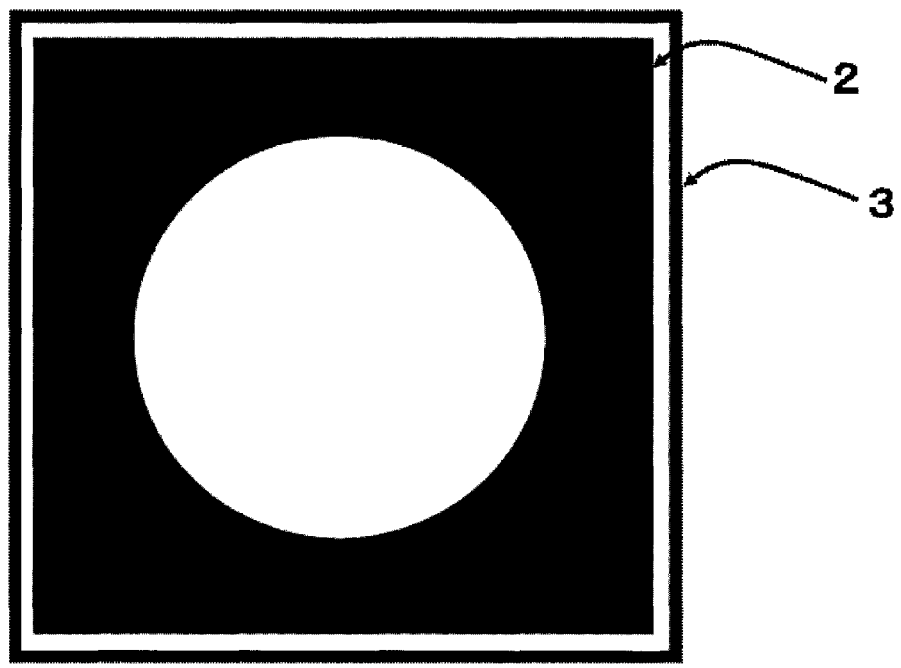
FIG. 9 is a view of a pattern in exposure used in Examples.

Subsequently, the black curable composition layer was exposed to light with a change rate of an exposure dose of 50 mJ/cm$^2$ in the exposure dose range of 100 mJ/cm$^2$ to 1,000 mJ/cm$^2$, through a photomask having a pattern as shown in FIG. 9, using a high-pressure mercury lamp. FIG. 9 shows a pattern including a large rectangular pattern 2 of 0.2×2.2 mm having a circular hole section with a diameter of 0.1 mm at the center thereof, and a lattice fine pattern 3 having a line-and-space of 10 μm.

Development Process

The black curable composition layer after exposure was subjected to puddle development using a 0.3% aqueous solution of tetramethylammonium hydroxide at 23° C. for 60 seconds. Thereafter, rinsing was carried out in spin shower and washing was carried out with pure water, to thereby obtaining a patterned light-shielding film.

Evaluation of Developability (Residue) on Glass Substrate

At the minimum exposure dose (adhesion sensitivity B) at which a fine pattern was not peeled off during development, the developed portions on glass, corresponding to 50 patterns, were observed under a scanning electron microscope (SEM), and an average of the number of residues per one pattern was obtained. A smaller number of residues represents favorable developability. The evaluation results are summarized in Table 8.

Evaluation of Adhesion on Glass Substrate

The following evaluation was carried out using the substrate with a light-shielding film which was obtained by forming each of black curable composition layers on a glass substrate, followed by exposure, development and rinsing.

Minimum exposure doses at which a large pattern and a fine pattern were not peeled off during development are taken as adhesion sensitivity A and adhesion sensitivity B, respectively. Lower adhesion sensitivity represents higher adhesion, and a smaller difference in adhesion sensitivity between the large pattern and the fine pattern represents better pattern formability.

Evaluation of Film Thickness Uniformity on Glass Substrate

The thicknesses of the black curable composition layer, which had a film thickness of 2.0 μm prepared in the coating process, from at the center of the substrate having thereon the black curable composition layer to a position 10 mm distant inwardly from the edge of the substrate in the diagonal direction, were measured using a stylus-type film thickness meter DECTAC-3 (trade name, manufactured by Ulvac, Inc.). Thickness unevenness is expressed in terms of "%" according to the following equation.

Thickness unevenness=(thickness at the center−thickness 30 mm inward from the edge)/thickness at the center Evaluation of Light Shieldability on Substrate Using a substrate in which the above-produced black curable composition layer was formed on a glass wafer, the maximum transmissivity in a wavelength region of 400 nm to 800 nm was measured by a spectrophotometer (trade name: UV23600, manufactured by Shimadzu Corporation). A smaller value is excellent in terms of light shieldability. A maximum transmissivity of less than 1% represents favorable light shieldability.

The evaluation results are summarized in Table 8.

TABLE 8

| | Black curable composition | Residues per pattern | Adhesion sensitivity A (mJ/cm$^2$) | Adhesion sensitivity B (mJ/cm$^2$) | Adhesion sensitivity B − Adhesion sensitivity A (mJ/cm$^2$) | Coating film thickness uniformity | Transmissivity |
|---|---|---|---|---|---|---|---|
| Example 2-1 | (B-2-1) | 7 | 450 | 600 | 150 | 100% | 0.7% |
| Example 2-2 | (B-2-2) | 3 | 400 | 500 | 100 | 100% | 0.7% |
| Example 2-3 | (B-2-3) | 0 | 300 | 350 | 50 | 100% | 0.7% |
| Example 2-4 | (B-2-4) | 0 | 300 | 350 | 50 | 100% | 0.7% |
| Example 2-5 | (B-2-5) | 2 | 300 | 350 | 50 | 98% | 0.7% |
| Example 2-6 | (B-2-6) | 6 | 450 | 600 | 150 | 100% | 0.7% |
| Example 2-7 | (B-2-7) | 0 | 300 | 350 | 50 | 100% | 0.7% |
| Example 2-8 | (B-2-8) | 0 | 300 | 350 | 50 | 100% | 0.7% |
| Example 2-9 | (B-2-9) | 0 | 300 | 350 | 50 | 100% | 0.7% |
| Example 2-10 | (B-2-10) | 2 | 400 | 500 | 100 | 100% | 0.7% |
| Example 2-11 | (B-2-11) | 8 | 450 | 600 | 150 | 100% | 0.7% |
| Example 2-12 | (B-2-12) | 0 | 300 | 350 | 50 | 100% | 0.7% |
| Example 2-13 | (B-2-13) | 0 | 500 | 550 | 50 | 100% | 0.7% |
| Example 2-14 | (B-2-14) | 0 | 450 | 500 | 50 | 100% | 0.7% |
| Example 2-15 | (B-2-15) | 0 | 200 | 250 | 50 | 100% | 0.7% |
| Example 2-16 | (B-2-16) | 0 | 200 | 250 | 50 | 100% | 0.7% |
| Example 2-17 | (B-2-17) | 2 | 300 | 400 | 100 | 98% | 0.7% |
| Example 2-18 | (B-2-18) | 3 | 300 | 400 | 100 | 98% | 0.7% |
| Example 2-19 | (B-2-19) | 5 | 300 | 450 | 100 | 100% | 0.7% |
| Example 2-20 | (B-2-20) | 6 | 300 | 450 | 150 | 100% | 0.7% |
| Example 2-21 | (B-2-21) | 0 | 300 | 350 | 50 | 100% | 0.7% |
| Example 2-22 | (B-2-22) | 4 | 300 | 400 | 100 | 98% | 0.7% |
| Example 2-23 | (B-2-23) | 9 | 300 | 450 | 150 | 97% | 0.7% |
| Example 2-24 | (B-2-24) | 0 | 300 | 350 | 50 | 100% | 0.7% |
| Example 2-25 | (B-2-25) | 7 | 300 | 450 | 150 | 97% | 0.7% |
| Example 2-26 | (B-2-26) | 9 | 300 | 450 | 150 | 98% | 0.7% |
| Example 2-27 | (B-2-27) | 1 | 300 | 400 | 100 | 99% | 0.7% |
| Example 2-28 | (B-2-28) | 5 | 300 | 450 | 150 | 97% | 0.7% |
| Example 2-29 | (B-2-29) | 0 | 300 | 350 | 50 | 100% | 0.7% |
| Example 2-30 | (B-2-30) | 6 | 300 | 450 | 150 | 98% | 0.7% |
| Example 2-31 | (B-2-31) | 0 | 300 | 350 | 50 | 100% | 0.7% |
| Example 2-32 | (B-2-32) | 0 | 300 | 350 | 50 | 100% | 0.7% |
| Example 2-33 | (B-2-33) | 7 | 300 | 450 | 150 | 100% | 0.7% |
| Example 2-34 | (B-2-34) | 3 | 450 | 600 | 150 | 100% | 0.7% |
| Example 2-35 | (B-2-35) | 5 | 450 | 600 | 150 | 100% | 0.7% |
| Example 2-36 | (B-2-36) | 0 | 300 | 350 | 50 | 100% | 0.7% |
| Example 2-37 | (B-2-37) | 2 | 400 | 500 | 100 | 100% | 0.7% |
| Example 2-38 | (B-2-38) | 0 | 400 | 450 | 100 | 100% | 0.7% |
| Example 2-39 | (B-2-39) | 1 | 600 | 700 | 100 | 100% | 0.8% |
| Example 2-40 | (B-2-40) | 0 | 300 | 350 | 50 | 100% | 0.3% |
| Example 2-41 | (B-2-41) | 0 | 300 | 350 | 50 | 100% | 0.5% |

TABLE 8-continued

| | Black curable composition | Residues per pattern | Adhesion sensitivity A (mJ/cm²) | Adhesion sensitivity B (mJ/cm²) | Adhesion sensitivity B – Adhesion sensitivity A (mJ/cm²) | Coating film thickness uniformity | Transmissivity |
|---|---|---|---|---|---|---|---|
| Comparative Example 2-1 | (B-2-42) | 54 | 500 | 850 | 350 | 94% | 0.7% |
| Comparative Example 2-2 | (B-2-43) | 55 | 500 | 900 | 400 | 93% | 0.7% |
| Comparative Example 2-3 | (B-2-44) | 70 | 700 | 1,000 | 300 | 99% | 0.7% |
| Comparative Example 2-4 | (B-2-45) | 8 | 1,000 | 1,100 | 100 | 99% | 0.4% |

It can be seen from Table 8 that when the black curable composition according to the second aspect of the invention is used, the adhesion sensitivity of a large pattern and a fine pattern is improved, and occurrence of residues in the unexposed portion is suppressed.

Further, the black curable composition using titanium black provides a black curable composition suitable for the production of a light-shielding film for a wafer level lens.

As shown in Table 7, it can be seen that the black curable compositions of Examples 2-1 to 2-37 containing titanium black as an inorganic pigment is particularly superior in adhesion sensitivity, as compared to the black curable composition of Example 2-39 containing an inorganic pigment other than titanium black. Further, it can be seen that the combined use of titanium black and a red organic pigment, as in the black curable compositions of Example 2-40 and Example 2-41, further improves light shieldability.

Example 2-42

On a substrate on which a patterned light-shielding film had been formed in the same manner as in Example 2-4, a curable resin layer was formed using a curable composition for a lens (composition obtained by adding 1% by mass of an arylsulfonium salt derivative (trade name: SP-172, manufactured by ADEKA Corporation) to a cycloaliphatic epoxy resin (trade name: EHPE-3150, manufactured by Daicel Chemical Industries, Ltd.)), followed by shape transfer with a quartz mold having a lens shape, and the shape-transferred layer was cured by a high-pressure mercury lamp at an exposure dose of 400 mJ/cm², to thereby produce a wafer level lens array having plural wafer level lens.

The produced wafer level lens array was cut to produce a lens module, and an imaging device and a sensor substrate were mounted thereon to produce an imaging unit.

The wafer level lens obtained in Example 2-42 exhibited no residue in a lens aperture, favorable transmissivity, high uniformity of the coating surface in a light-shielding layer portion, and high light shieldability.

The invention claimed is:

1. A black curable composition for a solid-state imaging device, comprising:
   (A) an inorganic pigment;
   (B) a copolymer comprising (b-1) a monomer having at least one group selected from an amino group and a nitrogen-containing heterocyclic group, (b-2) a monomer comprising at least acrylic acid or methacrylic acid and (b-3) a macromonomer having a weight average molecular weight from 1,000 to 50,000;
   (C) a polymerization initiator;
   (D) a polymerizable compound; and
   (E) an alkali-soluble resin having an unsaturated double bond,
   wherein a mass ratio of the (E) alkali-soluble resin to the (D) polymerizable compound is from 0.3 to 2.5.

2. The black curable composition according to claim 1, wherein the (A) inorganic pigment comprises titanium black.

3. The black curable composition according to claim 2, wherein the titanium black has an average primary particle diameter of from 30 nm to 65 nm.

4. The black curable composition according to claim 1, wherein a mass ratio of the (B) copolymer to the (A) inorganic pigment is from 0.15 to 0.35.

5. The black curable composition according to claim 1, wherein the (C) polymerization initiator comprises an oxime ester compound or a hexaarylbiimidazole compound.

6. The black curable composition according to claim 1, further comprising an (F) organic pigment.

7. A method of producing a light-shielding color filter for a solid-state imaging device, the method comprising:
   applying the black curable composition for a solid-state imaging device according to claim 1 onto a support;
   subjecting a black curable composition layer formed by the applying to pattern light exposure; and
   developing the black curable composition layer after the exposure to form a light-shielding pattern, in this order.

8. A light-shielding color filter for a solid-state imaging device, which is formed using the black curable composition for a solid-state imaging device according to claim 1.

9. A solid-state imaging device, comprising the light-shielding color filter for a solid-state imaging device according to claim 8.

10. The black curable composition according to claim 1, wherein the (b-3) macromonomer is a polyester macromonomer represented by the following formula (M):

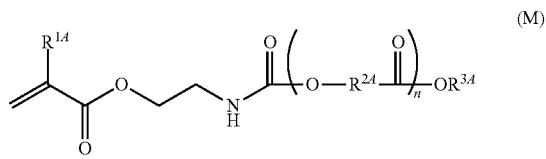

wherein in Formula (M), $R^{1A}$ represents a hydrogen atom or a methyl group; $R^{2A}$ represents an alkylene group; $R^{3A}$ represents a linear alkyl group having 5 to 20 carbon atoms; n represents an integer of 5 to 100; and plural $R^{2A}$'s may be the same as or different from each other.

11. A black curable composition for a wafer level lens, comprising:
   (A) an inorganic pigment;
   (B) a copolymer comprising (b-1) a monomer having at least one group selected from an amino group and a nitrogen-containing heterocyclic group, (b-2) a monomer comprising at least acrylic acid or methacrylic acid and (b-3) a macromonomer having a weight average molecular weight from 1,000 to 50,000;
(C) a polymerization initiator;
(D) a polymerizable compound; and
(E) an alkali-soluble resin having an unsaturated double bond,
wherein a mass ratio of the (E) alkali-soluble resin to the (D) polymerizable compound is from 0.3 to 2.5.

12. The black curable composition according to claim 11, wherein the (A) inorganic pigment comprises titanium black.

13. The black curable composition according to claim 12, wherein the titanium black has an average primary particle diameter of from 30 nm to 65 nm.

14. The black curable composition according to claim 11, wherein a mass ratio of the (B) copolymer to the (A) inorganic pigment is from 0.15 to 0.35.

15. The black curable composition according to claim 11, wherein the (C) polymerization initiator comprises an oxime ester compound or a hexaarylbiimidazole compound.

16. The black curable composition according to claim 11, further comprising an (F) organic pigment.

17. A wafer level lens, comprising a light-shielding film formed using the black curable composition according to claim 11, wherein the light-shielding film is formed around a lens arranged on a substrate of the wafer level lens.

18. A camera module, comprising the wafer level lens according to claim 17.

19. The black curable composition according to claim 11, wherein the (b-3) macromonomer is a polyester macromonomer represented by the following formula (M):

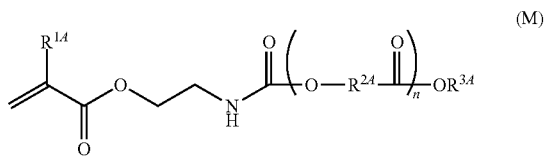

wherein in Formula (M), $R^{1A}$ represents a hydrogen atom or a methyl group; $R^{2A}$ represents an alkylene group; $R^{3A}$ represents a linear alkyl group having 5 to 20 carbon atoms; n represents an integer of 5 to 100; and plural $R^{2A}$'s may be the same as or different from each other.

* * * * *